US00RE41455E

(19) United States
(12) Reissued Patent
Komma et al.

(10) Patent Number: US RE41,455 E
(45) **Date of Reissued Patent: *Jul. 27, 2010**

(54) OBJECTIVE LENS FOR OPTICAL DISKS HAVING DIFFERENT THICKNESSES

(75) Inventors: Yoshiaki Komma, Osaka (JP); Sadao Mizuno, Osaka (JP); Seiji Nishino, Osaka (JP)

(73) Assignee: Panasonic Corporation, Osaka (JP)

( * ) Notice: This patent is subject to a terminal disclaimer.

(21) Appl. No.: 11/076,588

(22) Filed: Mar. 10, 2005

Related U.S. Patent Documents

Reissue of:
(64) Patent No.: 5,815,293
Issued: Sep. 29, 1998
Appl. No.: 08/455,934
Filed: May 31, 1995

U.S. Applications:
(63) Continuation of application No. 09/671,674, filed on Sep. 27, 2000, now Pat. No. Re. 38,943, which is a continuation-in-part of application No. 08/190,520, filed on Feb. 1, 1994, now Pat. No. 5,446,565.

(30) Foreign Application Priority Data

Feb. 1, 1993 (JP) ..... 5-14432
Aug. 4, 1993 (JP) ..... 5-193353

(51) Int. Cl.
*G02B 5/32* (2006.01)
*G02B 7/00* (2006.01)
*G02B 3/10* (2006.01)
*G02B 3/08* (2006.01)

(52) U.S. Cl. ..... 359/569; 359/565; 359/19; 359/570; 359/721; 359/743; 369/44.23; 369/103; 369/112

(58) Field of Classification Search ..... 359/19, 359/565, 566, 569–571, 574–575, 721, 743; 369/112.06–112.08, 112.1–112.13, 112.15, 369/112.25, 103, 44.23, 94
See application file for complete search history.

(56) References Cited

U.S. PATENT DOCUMENTS 3,999,009 A * 12/1976 Bouwhuis ..... 369/94

(Continued)

FOREIGN PATENT DOCUMENTS

CN 1042613 A 5/1990

(Continued)

OTHER PUBLICATIONS

"Optical Design with Diffractive Lenses" by D. Falkis, et al., Designer's Handbook; Photonics Spectra, Nov. 1991, pp. 205–208.*

(Continued)

*Primary Examiner*—Audrey Y Chang
(74) *Attorney, Agent, or Firm*—Clark & Brody

(57) ABSTRACT

A compound objective lens is composed of a hologram lens or transmitting a part of incident light without any diffraction to form a beam of transmitted light and diffracting a remaining part of the incident light to form a beam of first-order diffracted light, and an objective lens for converging the transmitted light to form a first converging spot on a front surface of a thin type of first information medium and converging the diffracted light to form a second converging spot on a front surface of a thick type of second information medium. Because the hologram selectively functions as a concave lens for the diffracted light, a curvature of the transmitted light differs from that of the diffracted light. Therefore, even though the first and second information mediums have different thicknesses, the transmitted light incident on rear surface of the first information medium is converged on the its front surface, and the diffracted light incident on a rear surface of the second information medium is converged on the its front surface. That is, the compound objective lens has two focal points.

18 Claims, 48 Drawing Sheets

U.S. PATENT DOCUMENTS

| | | | | | |
|---|---|---|---|---|---|
| 4,441,179 | A | * | 4/1984 | Slaten | 369/275.5 |
| 4,450,553 | A | * | 5/1984 | Holster et al. | 369/275.5 |
| 4,637,697 | A | * | 1/1987 | Freeman | 351/161 |
| 4,731,772 | A | * | 3/1988 | Lee | 369/44.14 |
| 4,733,065 | A | * | 3/1988 | Hoshi et al. | 250/206.2 |
| 4,733,943 | A | * | 3/1988 | Suzuki et al. | 359/565 |
| 4,757,197 | A | * | 7/1988 | Lee | 250/239 |
| 4,758,062 | A | * | 7/1988 | Sunagawa et al. | 385/8 |
| 4,773,052 | A | | 9/1988 | Sugiura et al. | |
| 4,876,680 | A | * | 10/1989 | Misawa et al. | 369/112.14 |
| 4,929,823 | A | * | 5/1990 | Kato et al. | 250/201.5 |
| 4,945,529 | A | * | 7/1990 | Ono et al. | 369/112.12 |
| 4,986,641 | A | * | 1/1991 | Braat | 359/15 |
| 5,017,000 | A | * | 5/1991 | Cohen | 351/161 |
| 5,056,908 | A | * | 10/1991 | Cohen | 351/161 |
| 5,062,098 | A | * | 10/1991 | Hori et al. | 369/112.02 |
| 5,073,007 | A | * | 12/1991 | Kedmi et al. | 359/565 |
| 5,111,448 | A | * | 5/1992 | Komma et al. | 369/44.23 |
| 5,116,111 | A | * | 5/1992 | Simpson et al. | 351/161 |
| 5,122,903 | A | * | 6/1992 | Aoyama et al. | 359/565 |
| 5,129,718 | A | * | 7/1992 | Futhey et al. | 351/161 |
| 5,134,604 | A | * | 7/1992 | Nagashima et al. | 369/94 |
| 5,153,863 | A | | 10/1992 | Noda et al. | |
| 5,161,040 | A | * | 11/1992 | Yokoyama et al. | 359/19 |
| 5,175,651 | A | * | 12/1992 | Marron et al. | 359/721 |
| 5,177,349 | A | * | 1/1993 | Setani | 250/208.1 |
| 5,202,875 | A | * | 4/1993 | Rosen et al. | 369/94 |
| 5,218,471 | A | * | 6/1993 | Swanson et al. | 359/565 |
| 5,227,915 | A | * | 7/1993 | Grossinger et al. | 359/565 |
| 5,229,797 | A | * | 7/1993 | Futhey et al. | 351/161 |
| 5,243,590 | A | * | 9/1993 | Aratani | 369/275.2 |
| 5,245,596 | A | * | 9/1993 | Gupta et al. | 369/44.14 |
| 5,251,198 | A | * | 10/1993 | Strickler | 369/94 |
| 5,278,816 | A | * | 1/1994 | Russell | 369/109.02 |
| 5,303,224 | A | * | 4/1994 | Chikuma et al. | 369/112.28 |
| 5,344,447 | A | * | 9/1994 | Swanson | 623/6.3 |
| 5,438,187 | A | * | 8/1995 | Reddersen et al. | 235/462.22 |
| 5,442,480 | A | * | 8/1995 | Swanson et al. | 359/355 |
| 5,446,565 | A | * | 8/1995 | Komma et al. | 369/44.23 |

FOREIGN PATENT DOCUMENTS

| | | | | |
|---|---|---|---|---|
| EP | 0 339 940 | | | 11/1989 |
| EP | 0341743 | | * | 11/1989 |
| EP | 0357780 | | * | 3/1990 |
| EP | 0367878 | | * | 5/1990 |
| EP | 0 452 953 | A | | 10/1991 |
| EP | 0452953 | | * | 10/1991 |
| EP | 0457553 | | * | 11/1991 |
| EP | 0470807 | | * | 2/1992 |
| EP | 0 470 807 | A | | 2/1992 |
| EP | 0486060 | | * | 5/1992 |
| EP | 0 539 019 | A1 | | 9/1992 |
| EP | 0 517 490 | | | 12/1992 |
| EP | 0 537 904 | | | 4/1993 |
| EP | 0 807 928 | | | 11/1997 |
| JP | 61-73246 | | * | 4/1986 |
| JP | 61-131245 | | * | 6/1986 |
| JP | 61-189504 | | * | 8/1986 |
| JP | 62-073429 | | * | 4/1987 |
| JP | 63-241735 | | * | 10/1988 |
| JP | 222452 | | * | 5/1990 |
| JP | 2185722 | | * | 7/1990 |
| JP | 4212730 | | * | 8/1992 |
| JP | 05 054406 | A | | 3/1993 |
| JP | 5101540 | | * | 4/1993 |
| JP | 5205282 | | * | 8/1993 |
| JP | 06 215406 | A | | 5/1994 |
| JP | 06-325405 | | | 11/1994 |

OTHER PUBLICATIONS

"Diffractive Lenses in Broadband Optical Design" by D. Falkis, et al., Designer's Handbook; Photonics Spectra, Dec. 1991, pp. 131–134.*

"Spherical Grating Objective Lenses for Optical Disk Pick–Ups", K. Goto, et al., Proc. Int. Symp. on Optical Memory, 1987; Japanese J. Appl. Phys., vol. 26 (1987) Supplement 26–4, pp. 135–140.*

"APO–Tele Lenses with Kinoform Elements" by M.A. Gan, et al., SPIE vol. 1507 Holographic Optics III; Principles and AApplications (1991), pp. 116–125.*

"Design of Some Achromatic Imaging Hybrid Diffractive–Refractive Lenses ", by P. Twardowski, et al., SPIE vol. 1507 Holographic Optics III, Principles and Applications (1991); pp. 55–56.*

Applied Optics, vol. 29, No. 7, Mar. 1, 1990, New York, US, pp. 994–997; XP000101359, Ojeda–Castaneda & Berriel–Valdos "Zone plate for arbitrarity high focal depth".*

* cited by examiner

FIG. 5 (AMENDED)
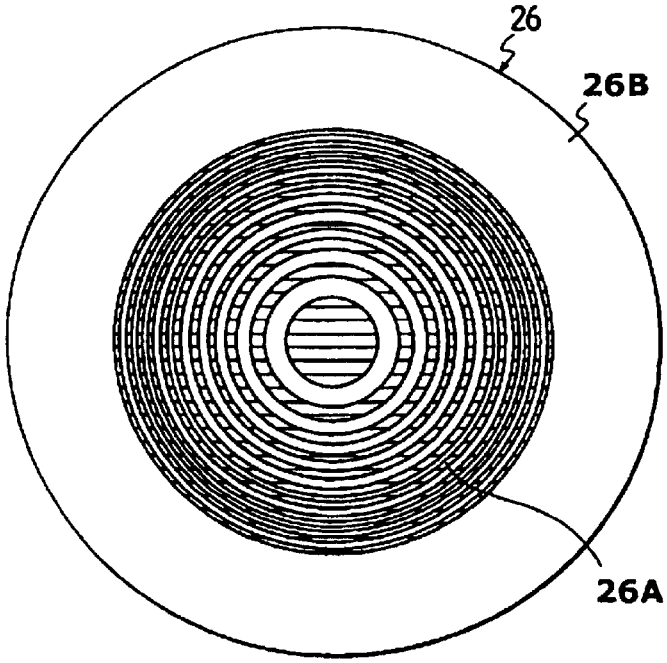

OBJECTIVE LENS FOR OPTICAL DISKS HAVING DIFFERENT THICKNESSES

Matter enclosed in heavy brackets [ ] appears in the original patent but forms no part of this reissue specification; matter printed in italics indicates the additions made by reissue.

*Notice: More than one reissue application has been filed for the reissue of U.S. Pat. No. 5,815,293. The reissue applications are the present application having application Ser. No. 11/076,588, a child application from the present application having application Ser. No. 11/332,813, filed Jan. 17, 2006, and parent application Ser. No. 09/671,674 filed Sep. 27, 2000, now Reissue Pat. No. RE38,943, all of which are reissues of U.S. Pat. No. 5,815,293.*

CROSS-REFERENCE TO RELATED APPLICATIONS

This application is a *continuation of reissue application Ser. No. 09/671,674 filed on Sep. 27, 2000, (now U.S. Pat. No. RE38,943), which is a reissue of U.S. Pat. No. 5,815, 293, which is a* continuation-in-part of U.S. Pat. application Ser. No. 08/190,520, filed Feb. 1, 1994 now U.S. Pat. No. 5,446,565.

BACKGROUND OF THE INVENTION

1. Field of the Invention

The present invention relates to a compound objective lens composed of an objective lens and a hologram lens which has two focal points, an imaging optical system for converging light on two converging spots placed at different depths of an information medium with the compound objective lens, an optical head apparatus for recording, reproducing or erasing information on or from an information medium such as an optical medium or a magneto-optical medium like an optical disk or an optical card with the imaging optical system, an optical disk in which a series of high density recording pits and a series of comparatively low density recording pits are provided, an optical disk apparatus for recording or reproducing information on or from the optical disk with the compound objective lens, a binary focus microscope having two focal points in which two types of images drawn at different depths are simultaneously observed, and an alignment apparatus for aligning two types of images drawn at different depths with the binary focus microscope.

2. Description of the Related Art

An optical memory technique has been put to practical use to manufacture an optical disk in which a pit pattern formed of a series of pits is drawn to record information. The optical disk is utilized as a high density and large capacity of information medium. For example, the optical disk is utilized for a digital audio disk, a video disk, a document file disk, and a data file disk. To record information on the optical disk and to reproduce the information from the optical disk, a light beam radiated from a light source is minutely converged in an imaging optical system, and the light beam minutely converged is radiated to the optical disk through the imaging optical system. Therefore, the light beam is required to be reliably controlled in the imaging optical system with high accuracy.

The imaging optical system is utilized for an optical head apparatus in which a detecting system is additionally provided to detect the intensity of the light beam reflected from the optical disk. Fundamental functions of the optical head apparatus are classified into a converging performance for minutely converging a light beam to form a diffraction-limited micro-spot of the light beam radiated on the optical disk, a focus control in a focus servo system, a tracking control in a tracking serve system, and the detection of pit signals (or information signals) obtained by radiating the light beam on a pit pattern of the optical disk. The fundamental function of the optical head apparatus is determined by the combination of optical sub-systems and a photoelectric transfer detecting process according to a purpose and a use. Specifically, an optical head apparatus in which a holographic optical element (or hologram) is utilized to minimize and thin the optical head apparatus has been recently proposed.

2.1. Previously Proposed Art

FIG. 1 is a constitutional view of a conventional optical head apparatus proposed in Japanese Patent Application No. 46630 of 1991 which is applied by inventors of the present invention.

As shown in FIG. 1, a conventional optical head apparatus 11 for recording or reproducing information on or from an information medium 12 such as an optical disk is provided with a light beam source 13 such as a semiconductor laser, a transmission type of blazed hologram 14 for transmitting a light beam L1 radiated from the light beam source 12 without any diffraction in an outgoing optical path and diffracting a light beam L2 reflected on the information medium 12 in a returning optical path, an objective lens 15 for converging the light beam L1 transmitting through the hologram 13 on the information medium 14 to read the information, an actuator 16 for integrally moving the objective lens 15 with the blazed hologram 13 to focus the light beam L1 on the information medium 12 with the objective lens 15, and a photo detector 17 for detecting the intensity of the light beam L2 reflected on the information medium 12 to reproduce the information.

As shown in FIG. 2A, a relative position between the blazed hologram 14 and the objective lens 15 is fixed by a fixing means 18. Or, as shown in FIG. 2B, a blazed pattern is formed on a side of the objective lens 15 to integrally form the blazed hologram 14 with the objective lens 15.

In the above configuration, a light beam L1 (or a laser beam) radiated from the light beam source 13 is radiated to the blazed hologram 14, and the light beam L1 mainly transmits through the blazed hologram 14 without any diffraction in an outgoing optical path. The light beam L1 transmitting through the blazed hologram 14 is called zero-order diffracted light. Thereafter, the zero-order diffracted light L1 is converged on the information medium 12 by the objective lens 15. In the information medium 12, information indicated by a series of patterned pits is recorded and read by the zero-order diffracted light L1. Thereafter, a beam light L2 having the information is reflected toward the objective lens 15 in a returning optical path and is incident to the blazed hologram 14. In the blazed hologram 14, the light L2 is mainly diffracted. The light L2 diffracted is called first-order diffracted light. Thereafter, the first-order diffracted light L2 is received in the photo detector 17.

In the photo detector 17, the intensity distribution of the first-order diffracted light L2 is detected. Therefore, a servo signal for adjusting the position of the objective lens 15 by the action of the actuator 16 is obtained. Also, the intensity of the first-order diffracted light L2 is detected in the photo detector 17. Because the information medium 12 is rotated at high speed, the patterned pits radiated by the light 17 are changed so that the intensity of the first-order diffracted light L2 detected is changed. Therefore, an information signal indicating the information recorded in the information medium 12 is obtained by detecting the change in intensity of the first-order diffracted light L2.

In the above operation, a part of the light beam L1 is necessarily diffracted in the blazed hologram 14 when the light beam L1 is radiated to the blazed hologram 14 in the outgoing optical path. Therefore, unnecessary diffracted light such as first-order diffracted light and minus first-order diffracted light necessarily occurs. In cases where the hologram 14 is not blazed, the unnecessary diffracted light in the outgoing optical path also reads the information recorded in the information medium 12, and the unnecessary light is undesirably received in the photo detector 17. To prevent the unnecessary light from transmitting to the information medium 12, the blazed hologram 14 is manufactured to form a blazed hologram pattern on the surface thereof, so that the intensity of the unnecessary light received in the photo detector 17 is decreased.

Also, because an objective lens of a conventional microscope has only a focal point, images placed within a focal depth of the objective lens can be only observed with the conventional microscope.

Also, a minute circuit is formed on a semiconductor such as a group III–V compound semiconductor to form a microwave circuit, an opto-electronic detector or a solid state laser. In this case, a photo-sensitive material is coated on a sample made of the semiconductor. Thereafter, a relative position between the sample and a photo mask covering the sample is adjusted by utilizing an alignment apparatus, and the photo-sensitive material is exposed by a beam of exposure light through the photo mask to transfer a circuit pattern drawn on the photo mask to the photo-sensitive material in an exposure process by utilizing an exposure apparatus. For example, an alignment pattern is drawn on a reverse side of the sample, and a relative position between the sample and the photo mask is adjusted with high accuracy while simultaneously observing the alignment pattern of the sample and the circuit pattern of the photo mask with the conventional microscope. Thereafter, the circuit pattern of the photo mask is transferred to a front side of the sample.

In this case, because images placed within a focal depth of an objective lens utilized in the conventional microscope can be only observed with the conventional microscope, it is required to utilize the conventional microscope having a deep focal depth in the alignment apparatus in cases where the alignment pattern and the circuit pattern are simultaneously observed with the conventional microscope. Therefore, the magnification of the conventional microscope having a deep focal depth is lowered.

2.2. Problems to be Solved by the Invention

An optical disk having a high density memory capacity has been recently developed because of the improvement in a design technique of an optical system and the shortening of the wavelength of light radiated from a semiconductor laser. For example, a numerical aperture at an optical disk side of an imaging optical system in which a light beam converged on an optical disk is minutely narrowed in diameter is enlarged to obtain the optical disk having a high density memory capacity. In this case, the degree of aberration occurring in the imaging optical system is increased because an optical axis of the system tilts from a normal line of the optical disk. As the numerical aperture is increased, the degree of the aberration is enlarged. To prevent the increase of the numerical aperture, it is effective to thin the thickness of the optical disk. The thickness of the optical disk denotes a distance from a surface of the optical disk (or an information medium) radiated by a light beam to an information recording plane on which a series of patterned pits are formed.

FIG. 3 shows a relationship between the thickness of the optical disk and the numerical aperture on condition that the tilt of the optical axis is constant.

As shown in FIG. 3, because the numerical aperture is 0.5 when the thickness of the optical disk is 1.2 mm, it is effective to thin the optical disk to 0.6 mm in thickness when the numerical aperture is increased to 0.6. In this case, even though the numerical aperture is increased on condition that the tilt of the optical axis is not changed, the degree of the aberration is not increased. Therefore, it is preferred that the thickness of the optical disk be thinned to obtain the optical disk having a high density memory capacity.

Accordingly, it is expected that the thickness of a prospective optical disk having a high density memory capacity becomes thinner than that of a present optical disk such as a compact disk appearing on the market now. For example, the thickness of the compact disk is about 1.2 mm, and the thickness of the prospective optical disk is expected to range from 0.4 mm to 0.8 mm. In this case, it is required to record or reproduce information on or from an optical disk with an optical head system regardless of whether the optical disk is the present optical disk or the prospective optical disk having a high density memory capacity. That is, an optical head apparatus having an imaging optical system in which a light beam is converged on an optical disk within the diffraction limit regardless of whether the optical disk is thick or thin is required.

However, in a conventional optical head apparatus, a piece of information is only recorded or reproduced on or from an optical disk having a fixed thickness. For example, in cases where the thickness of the information medium 12 is off a regular range by about ±0.1 mm or more, an aberration such as a spherical aberration occurs when the optical head apparatus 11 is operated. Therefore, the recording or the reproduction of the information is impossible. Accordingly, there is a drawback that an optical head apparatus in which a piece of information is recorded or reproduced on or from an optical disk regardless of whether the optical disk is the present optical disk or the prospective optical disk having a high density memory capacity cannot be manufactured in a conventional technique.

Also, there is a problem in the conventional microscope. That is, because an objective lens of the conventional microscope has only a focal point and images placed within a focal depth of the objective lens can be only observed with the conventional microscope, the magnification of the conventional microscope and an observed range in an optical axis direction are in a trade-off relationship. Therefore, there is a drawback that it is impossible to observe the images over a wide observed range in the optical axis direction at high magnification Also, there is a problem in the alignment apparatus. That is, when a circuit pattern drawn on the photo mask is transferred to the front side of the sample after an alignment pattern is drawn on the reverse side of the sample, the alignment of the photomask and the sample is performed by simultaneously observing the circuit pattern of the photo mask and the alignment pattern of the sample with the conventional microscope having a deep focal depth and a low magnification. Therefore, because the conventional microscope has a low magnification, there is a drawback that it is impossible to align the photo mask with the sample at a high accuracy ranging within 5 μm.

SUMMARY OF THE INVENTION

A first object of the present invention is to provide, with due consideration to the drawbacks of such a conventional objective lens having a focal point, a compound objective lens having two focal points.

A second object of the present invention is to provide an imaging optical system having the compound objective lens in which light transmitting through the compound objective lens is converged at a diffraction limit on two converging spots placed at different depths of an information medium.

A third object of the present invention is to provide an optical head apparatus having the imaging optical system in which information is recorded, reproduced or erased on or from one of the converging spots of the information medium at which light is converged by the action of the imaging optical system.

A fourth object of the present invention is to provide a high density optical disk in which a series of first recording pits is formed to record pieces of information at high density on a thin substrate.

A fifth object of the present invention is to provide an optical disk apparatus in which information is recorded or reproduced on or from the optical disk with the compound objective lens regardless of whether a series of recording pits expressing pieces of information is recorded or reproduced on or from the high density optical disk having a thin thickness or a conventional compact disk having an ordinary thickness.

A sixth object of the present invention is to provide a binary focus microscope having two focal points in which two types of images drawn at different depths are simultaneously observed.

A seventh object of the present invention is to provide an alignment apparatus in which two types of images drawn at different depths are aligned with the binary focus microscope.

An eighth object of the present invention is to provide a focusing method for focusing light on an information medium with the optical head apparatus.

A ninth embodiment of the present invention is to provide an information reproducing method for reproducing a piece of recording information recorded on a high density optical disk having a thin thickness.

The first object is achieved by the provision of a compound objective lens having two focal points, comprising:

hologram means for transmitting a part of incident light without any diffraction to form a beam of transmitted light and diffracting a remaining part of the incident light to form a beam of diffracted light, the hologram means functioning as a lens for the diffracted light to diverge the diffracted light from the hologram means or converge the diffracted light; and lens means for converging the transmitted light formed in the hologram means to form a first converging spot at a first focal point and converging the diffracted light formed in the hologram means to form a second converging spot at a second focal point, the second focal point differing from the first focal point.

In the above configuration, a part of incident light transmits through the hologram means without any diffraction. Therefore, a beam of transmitted light not diverged from the hologram means or not converging is formed. Thereafter, the transmitted light is refracted and converged by the lens means, so that the transmitted light is focused on a first converging spot positioned at a first focal point.

In contrast, a remaining part of incident light is diffracted by the hologram means. Therefore, a beam of diffracted light such as a beam of first-order diffracted light which is diverged from the hologram lens or converges is formed. Thereafter, the diffracted light is refracted and converged by the lens means, so that the diffracted light is focused on a second converging spot positioned at a second focal point.

In this case, because a propagation direction of the transmitted light differs from that of the diffracted light, the first focal point of the compound objective lens for the transmitted light differs from the second focal point of the compound objective lens for the diffracted light. Therefore, the compound objective lens has two focal points, and the incident light transmitting through the compound objective lens are converged on two converging points.

Accordingly, the incident light transmitting through the compound objective lens can be reliably converged on an information medium regardless whether the information medium has a first thickness or a second thickness.

It is preferred that a grating pattern be drawn in the hologram means in a concentric circle shape, the grating pattern of the hologram means be formed in relief to concentrically form alternating rows of bottom portions and top portions, a height H of relief in the grating pattern be set to $H < \lambda/(n(\lambda)-1)$ where a symbol $\lambda$ denotes a wavelength of the incident light and a symbol $n(\lambda)$ denotes a refractive index of the hologram means made of a glass material for the incident light having the wavelength $\lambda$, and a difference in phase modulation degree between the incident light transmitting through a bottom portion of the grating pattern and the incident light transmitting through a top portion of the grating pattern be lower than $2\pi$ radians to set a diffraction efficiency of the hologram means to a value lower than 100%.

In the above configuration, because the height of the relief in the grating pattern is lower than a value $\lambda/(n(\lambda)-1)$, the difference in phase modulation degree is induced to be lower than $2\pi$ radians. Therefore, the diffraction efficiency of the hologram means is set to a value lower than 100% over the entire grating pattern, so that the transmitted light and the diffracted light are simultaneously formed in the hologram lens.

The first object is also achieved by the provision of a compound objective lens, comprising:

lens means for converging a beam of first incident light on a front surface of a first information medium having a first thickness T1 and converging a beam of second incident light on a front surface of a second information medium having a second thickness T2 (T2<T1), the first incident light passing through the first information medium from its rear surface, and the second incident light passing through the second information medium from its rear surface; and aperture limiting means for selectively limiting an aperture of the lens means for the second incident light which is incident on the lens means, a second numerical aperture of the lens means for the second incident light which is incident on the lens means being lower than a first numerical aperture of the lens means for the first incident light which is incident on the lens means.

In the above configuration, an aperture of the lens means for the second incident light is limited by the aperture limiting means, and another aperture of the lens means for the first incident light is limited. Thereafter, the first incident light is converged by the lens means on the first information medium at a high numerical aperture, and the second incident light is converged by the lens means on the second information medium at a low numerical aperture. Accordingly, the compound objective lens has two focal points. Also, the intensity of the first incident light can be larger than that of the second incident light.

The first object is also achieved by the provision of a compound objective lens, comprising:

lens means for converging a beam of first incident light on a front surface of a first information medium having a first thickness and converging a beam of second incident light on a front surface of a second information medium having a second thickness, the first incident light passing through the first information medium from its rear surface, and the second incident light passing through the second information medium from its rear surface; and curvature changing means for changing a curvature of spherical waves of a part of incident light to form the first incident light which is incident on the lens means and not changing a curvature of spherical waves of a remaining part of incident light to form the second incident light which is incident on the lens means.

In the above configuration, a curvature of spherical waves of a part of incident light is changed by the curvature changing means to form a beam of first incident light, and a curvature of spherical waves of a remaining part of incident light is not changed to form a beam of second incident light. Thereafter, the first incident light is converged on the first information medium, and the second incident light is converged on the second information medium.

Accordingly, the compound objective lens has two focal points.

The second object is achieved by the provision of an imaging optical system, comprising:

a light source for radiating a beam of incident light of which a far field pattern is distributed to decrease intensity of the incident light toward a peripheral portion of the beam;

hologram means for transmitting a part of the incident light radiated from the light source without any diffraction to form a beam of transmitted light and diffracting a remaining part of the incident light to form a beam of diffracted light, a grating pattern being formed in relief in the hologram means to concentrically form alternating rows of bottom portions and top portions on condition that a height H of relief in the grating pattern is set to $H < \lambda/(n(\lambda)-1)$ where a symbol $\lambda$ denotes a wavelength of the incident light and a symbol $n(\lambda)$ denotes a refractive index of the hologram means made of a glass material for the incident light having the wavelength $\lambda$, a difference in phase modulation degree between the incident light transmitting through the bottom portions of the grating pattern and the incident light transmitting through the top portions of the grating pattern being lower than $2\pi$ radians to set a diffraction efficiency of the hologram means to a value lower than 100%, the height H of the relief in the grating pattern being gradually lowered toward an outer direction of a pattern region in which the grating pattern is drawn, and the diffraction efficiency of the hologram means for the incident light being gradually lowered toward the outer direction of the pattern region to distribute intensity of the transmitted light in a gently-sloping shape; and lens means for converging the transmitted light formed in the hologram means to form a first converging spot at a first focal point and converging the diffracted light formed in the hologram means to form a second converging spot at a second focal point.

In the above configuration, a beam of incident light is radiated from a light source. A far field pattern of the incident light is distributed to decrease intensity of the incident light toward a peripheral portion of the beam. For example, the light source is a semiconductor laser, the far field pattern of the incident light is distributed in the Gaussian distribution. Thereafter, the incident light transmits through the hologram means. In this case, because a grating pattern is drawn in relief in the hologram means and because the height of the relief is lower than a value $\lambda/(n(\lambda)-1)$, the difference in phase modulation degree between the incident light transmitting through a bottom portion of the grating pattern and the incident light transmitting through a top portion of the grating pattern is induced to be lower than $2\pi$ radians. Therefore, the diffraction efficiency of the hologram means for the incident light is set to a value lower than 100% over the entire grating pattern, so that the transmitted light and the diffracted light are simultaneously formed in the hologram lens. In addition, because the height H of the relief in the grating pattern is gradually lowered toward the outer direction of the pattern region, the diffraction efficiency of the hologram means for the incident light is gradually lowered toward the outer direction of the pattern region. Therefore, the incident light positioned at a center portion of its beam are mainly changed to the diffracted light, and the incident light positioned at a peripheral portion of its beam are mainly changed to the transmitted light.

Thereafter, the transmitted light is refracted and converged by the lens means, so that the transmitted light is focused on a first converging spot positioned at a first focal point. Also, the diffracted light is refracted and converged by the lens means, so that the diffracted light is focused on a second converging spot positioned at a second focal point. In this case, because a propagation direction of the transmitted light differs from that of the diffracted light, the first focal point for the transmitted light differs from the second focal point for the diffracted light.

Accordingly, even though the far field pattern of the incident light is distributed in the Gaussian distribution, the far field pattern of the transmitted light is distributed in a gently-sloping shape. Therefore, secondary maxima (or side lobes) of the transmitted light can be prevented from occurring at the first converging spot.

Also, because the height H of the relief in the grating pattern is gradually lowered over the entire pattern region, a numerical aperture of the lens means for the diffracted light can be sufficiently heightened.

The second object is also achieved by the provision of an imaging optical system, comprising:

a light source for radiating a beam of incident light of which a far field pattern is distributed to decrease intensity of the incident light toward a peripheral portion of the beam;

hologram means for transmitting a part of the incident light radiated from the light source without any diffraction to form a beam of transmitted light and diffracting a remaining part of the incident light to form a beam of diffracted light, a grating pattern being formed in relief in the hologram means to concentrically form alternating rows of bottom portions and top portions on condition that a height H of relief in the grating pattern is set to $H < \lambda/(n(\lambda)-1)$ where a symbol $\lambda$ denotes a wavelength of the incident light and a symbol $n(\lambda)$ denotes a refractive index of the hologram means made of a glass material for the incident light having the wavelength $\lambda$, a difference in phase modulation degree between the incident light passing through the bottom portions of the grating pattern and the incident light passing through the top portions of the grating pattern being lower than $2\pi$ radians to set a diffraction efficiency of the hologram means to a value lower than 100%, the height H of the relief in the grating pattern being gradually lowered toward an inner direction of a pattern region in which the grating pattern is drawn, and the diffraction efficiency of the hologram means for the incident light being gradually lowered toward the inner direction of the pattern region to distribute intensity of the diffracted light in a gently-sloping shape; and lens means for converging the transmitted light formed in the hologram means to form a first converging spot at a first focal point and converging the diffracted light formed in the hologram means to form a second converging spot at a second focal point.

In the above configuration, the transmitted light and the diffracted light are simultaneously formed in the hologram lens in the same manner. Also, because the height H of the relief in the grating pattern is gradually lowered toward the inner direction of the pattern region, the diffraction efficiency of the hologram means for the incident light is gradually lowered toward the inner direction of the pattern region. Therefore, the incident light positioned at a center portion of its beam are mainly changed to the transmitted light, and the incident light positioned at a peripheral portion of its beam are mainly changed to the diffracted light.

Accordingly, even though the far field pattern of the incident light is distributed in the Gaussian distribution, the far field pattern of the diffracted light is distributed in a gently-sloping shape. Therefore, secondary maxima (or side lobes) of the diffracted light can be prevented from occurring at the second converging spot.

Also, because the height H of the relief in the grating pattern is gradually lowered over the entire pattern region, a numerical aperture of the lens means for the transmitted light can be sufficiently heightened.

The third object is achieved by the provision of an optical head apparatus for recording or reproducing a piece of information on or from a thin type of first information medium having a first thickness or a thick type of second information medium having a second thickness larger than the first thickness, comprising:

a light source for radiating a beam of incident light;

hologram means for transmitting a part of the incident light radiated from the light source without any diffraction on an outgoing path to form a beam of transmitted light and diffracting a remaining part of the incident light radiated from the light source on the outgoing path to form a beam of diffracted light, the hologram means functioning as a lens for the diffracted light to diverge the diffracted light from the hologram means or converge the diffracted light;

lens means for converging the transmitted light formed in the hologram means at a first focal length on the outgoing path to form a first converging spot at a front surface of the first information medium or converging the diffracted light formed in the hologram means at a second focal length on the outgoing path to form a second converging spot at a front surface of the second information medium, the transmitted light being incident on a rear surface of the first information medium and being converged at the front surface of the first information medium, the transmitted light being reflected at the rear surface of the first information medium and again passing through the lens means and the hologram means on an incoming path, the diffracted light being incident on a rear surface of the second information medium and being converged at the front surface of the second information medium, and the diffracted light being reflected at the rear surface of the first information medium and again passing through the lens means and the hologram means on the incoming path;

wavefront changing means for changing a wavefront of the transmitted light or the diffracted light passing through the lens means and the hologram means on the incoming path to form one or more beams of information light; and detecting means for detecting intensities of the information light formed by the wavefront changing means and generating an information signal according to the intensities of the information light, the information signal expressing a piece of information recorded on the first information medium or the second information medium.

In the above configuration, a beam of incident light is radiated from the light source, and a part of the incident light transmits through the hologram lens to form a beam of transmitted light. Also, a remaining part of the incident light is diffracted by the hologram lens to form a beam of diffracted light. Thereafter, the transmitted light and the diffracted light are converged by the converging means. In cases where a piece of information is recorded or reproduced on or from the first information medium, the transmitted light is incident on the rear surface of the first information medium and is converged at the front surface of the first information medium to form the first converging spot. Thereafter, the transmitted light is reflected at the rear surface of the first information medium and again passes through the lens means and the hologram means without any diffraction. In contrast, in cases where a piece of information is recorded or reproduced on or from the second information medium, the diffracted light is incident on the rear surface of the second information medium and is converged at the front surface of the second information medium to form the second converging spot. Thereafter, the diffracted light is reflected at the rear surface of the second information medium and again passes through the lens means. Thereafter, the diffracted light is again diffracted by the hologram means.

Thereafter, a wavefront of the transmitted light or the diffracted light is changed by the wavefront changing means to form a plurality of beams of reflected light, and the intensities of the reflected light is detected by the detecting means. Therefore, an information signal expressing the information recorded on the first or second information medium is generated according to the intensities of the reflected light.

Accordingly, because the first converging spot of the transmitted light differs from the second converging spot of the diffracted light. a compound objective lens composed of the hologram lens and the lens means has two focal points. Therefore, a piece of information can be recorded or reproduced on or from an information medium regardless of whether the information medium has the first thickness or the second thickness.

The third object is also achieved by the provision of an optical head apparatus for recording or reproducing a piece of information on or from a first information medium having a first thickness T1 or a second information medium having a second thickness T2 (T1<T2), comprising:

lens means for converging a beam of first incident light on a front surface of a first information medium having a first thickness T1 or converging a beam of second incident light on a front surface of a second information medium having a second thickness T2 (T2<T1), the first incident light passing through the first information medium from its rear surface, and the second incident light passing through the second information medium from its rear surface;

aperture limiting means for selectively limiting an aperture of the lens means for the second incident light which is incident on the lens means, a second numerical aperture of the lens means for the second incident light which is incident on the lens means being lower than a first numerical aperture of the lens means for the first incident light which is incident on the lens means, the first incident light being reflected at the front surface of the first information medium and again passing through the lens means and the aperture limiting means on an incoming path, and the second incident light being reflected at the front surface of the second information medium and again passing through the lens means and the aperture limiting means on the incoming path;

a light source for radiating the first incident light and the second incident light to the aperture limiting means;

wavefront changing means for changing a wavefront of the first or second incident light passing through the lens means and the aperture limiting means on the incoming path to form one or more beams of information light; and detecting means for detecting intensities of the information light formed by the wavefront changing means and generating an information signal according to the intensities of the information light, the information signal expressing a piece of information recorded on the first information medium or the second information medium.

In the above configuration, a compound objective lens composed of the lens means and the aperture limiting means has two focal points, and the intensity of the first incident light is larger than that of the second incident light.

Accordingly, a piece of information can be recorded or reproduced on or from an information medium regardless of whether the information medium has the first thickness or the second thickness. Also, a piece of information can be efficiently recorded on the first information medium with the first incident light having a high intensity, and a piece of information can be efficiently reproduced from the second information medium with the second incident light having a comparatively low intensity.

The third object is also achieved by the provision of an optical head apparatus for recording or reproducing a piece of information on or from a first information medium having a first thickness or a second information medium having a second thickness, comprising:

lens means for converging a beam of first incident light on a front surface of the first information medium and converging a beam of second incident light on a front surface of the second information medium, the first incident light passing through the first information medium from its rear surface, and the second incident light passing through the second information medium from its rear surface; and curvature changing means for changing a curvature of spherical waves of a part of incident light to form the first incident light which is incident on the lens means and not changing a curvature of spherical waves of a remaining part of incident light to form the second incident light which is incident on the lens means, the first incident light being reflected at the front surface of the first information medium and again passing through the lens means and the curvature changing means on an incoming path, and the second incident light being reflected at the front surface of the second information medium and again passing through the lens means and the curvature changing means on the incoming path;

a light source for radiating the incident light to the curvature changing means;

wavefront changing means for changing a wavefront of the first or second incident light passing through the lens means and the curvature changing means on the incoming path to form one or more beams of information light; and detecting means for detecting intensities of the information light formed by the wavefront changing means and generating an information signal according to the intensities of the information light, the information signal expressing a piece of information recorded on the first information medium or the second information medium.

In the above configuration, because a compound objective lens is composed of the lens means and the curvature changing means, the compound objective lens has two focal points. Accordingly, a piece of information can be recorded or reproduced on or from an information medium regardless of whether the information medium has the first thickness or the second thickness.

The fourth object is achieved by the provision of an optical disk, comprising:

an information recording substrate partitioned into a first region and a second region, the first region having a first thickness, and the second region having a second thickness smaller than the first thickness;

a plurality of first recording pits placed at the first region of the information recording substrate for recording pieces of recording information at a high recording density, the first recording pits being formed at narrow intervals; and a plurality of second recording pits placed at the second region of the information recording substrate for recording pieces of distinguishing information at an ordinary recording density of a compact disk, the distinguishing information informing that the recording information are recorded on the information recording substrate having the first thickness, and the recording density of the recording information being higher than that of the distinguishing information.

In the above configuration, a substrate of a conventional compact disk has the same second thickness as that of the second region of the information recording substrate in the optical disk according to the present invention. Therefore, in cases where a beam of reproducing light is incident on a prescribed region of an unknown disk selected from a group of the conventional compact disk and the optical disk, the reproducing light is focused on a recording pit of the conventional compact disk or one of the second recording pits of the optical disk regardless of whether the unknown disk is the conventional compact disk or the optical disk.

In cases where the unknown disk is the optical disk, a piece of distinguishing information is read by the reproducing light. Because the distinguishing information informs that pieces of recording information are recorded on the information recording substrate having the first thickness, a curvature of the reproducing light is automatically changed to focus the reproducing light on the information recording substrate having the first thickness, and the reproducing light is automatically focused on one of the first recording pits. Therefore, a piece of recording information is reproduced.

In contrast, in cases where the unknown disk is the conventional compact disk, a piece of recording information is read by the reproducing light in the same manner as in a prior art.

Accordingly, a piece of recording information formed on an information recording substrate can be reliably reproduced even though the thickness of the information recording substrate is unknown.

The fourth object is also achieved by the provision of an optical disk, comprising:

an information recording substrate having a thin thickness, the thin thickness of the information recording substrate being thinner than that of a compact disk;

a plurality of first recording pits placed at a first region of the information recording substrate for recording pieces of recording information at a high recording density, the first recording pits being formed at narrow intervals; and a plurality of second recording pits placed at a second region of the information recording substrate for recording pieces of distinguishing information at a low recording density, the distinguishing information informing that the recording information are recorded on the information recording substrate having the thin thickness, the recording density of the recording information being higher than that of the distinguishing information, each of the second recording pits being larger than that of a recording pit in the compact disk, and a converging spot of a beam of reproducing light, which is converged to focus on an ordinary recording pit formed on a substrate having an ordinary thickness of the compact disk, being formed in one of the second recording pits to read the distinguishing information.

In the above configuration, a beam of reproducing light, of which a curvature is adjusted to focus the reproducing light on a recording pit formed on an information recording substrate of the compact disk, is incident on a prescribed region of an unknown disk selected from a group of the compact disk having an ordinary thickness and the optical disk according to the present invention. In cases where the unknown disk is the optical disk, the reproducing light is converged on one of the second recording pits in defocus because the information recording substrate of the optical disk has the thin thickness. However, because each of the second recording pits is large in size, a converging spot of the reproducing light is formed in the second recording pit. Therefore, a piece of distinguishing information is read by the reproducing light. Because the distinguishing information informs that pieces of recording information are recorded on the information recording substrate having the thin thickness, a curvature of the reproducing light is automatically changed to focus the reproducing light on the information recording substrate having the thin thickness, and the reproducing light is automatically focused on one of the first recording pits. Therefore, a piece of recording information is reproduced.

In contrast, in cases where the unknown disk is the compact disk, a piece of recording information is read by the reproducing light in the same manner as in a prior art.

Accordingly, a piece of recording information formed on an information recording substrate can be reliably reproduced even though the thickness of the information recording substrate is unknown.

The fifth object is achieved by the provision of an optical disk apparatus for recording or reproducing pieces of recording information on or from an optical disk in which the recording information are recorded or reproduced at a high density on or from a first substrate having a first thickness and a piece of distinguishing information informing that the recording information are recorded or reproduced on or from the first substrate having the first thickness is recorded at an ordinary density on a second substrate having a second thickness larger than the first thickness, comprising:

rotating means for rotating the optical disk at a regular speed;

a light source for radiating a beam of incident light;

hologram means for transmitting a part of the incident light radiated from the light source without any diffraction on an outgoing path to form a beam of transmitted light and diffracting a remaining part of the incident light radiated from the light source on the outgoing path to form a beam of diffracted light, the hologram means functioning as a lens for the diffracted light to diverge the diffracted light from the hologram means;

lens means for converging the transmitted light formed in the hologram means on the first substrate of the optical disk rotated by the rotating means to record or reproduce a piece of recording information on or from the optical disk and converging the diffracted light formed in the hologram means on the second substrate of the optical disk rotated by the rotating means to reproduce the distinguishing information from the optical disk, the transmitted light being reflected by the first substrate of the optical disk and again passing through the lens means and the hologram means on an incoming path, and the diffracted light being reflected by the second substrate of the optical disk and again passing through the lens means and the hologram means on the incoming path;

wavefront changing means for changing a wavefront of the transmitted light passing through the lens means and the hologram means on the incoming path to form one or more beams of recording information light and changing a wavefront of the diffracted light passing through the lens means and the hologram means on the incoming path to form one or more beams of distinguishing information light;

detecting means for detecting intensities of the recording information light formed by the wavefront changing means to generate a recording information signal according to the intensities of the recording information light and detecting intensities of the distinguishing information light formed by the wavefront changing means to generate a distinguishing information signal according to the intensities of the distinguishing information light, the distinguishing information signal expressing the distinguishing information recorded on the second substrate of the optical disk, and the recording information signal expressing the recording information recorded on the first substrate of the optical disk; and moving means for moving an optical head apparatus comprising the light source, the hologram means, the lens means and the detecting means to converge the diffracted light formed in the hologram means on the second substrate of the optical disk and moving the optical disk, in which the diffracted light formed in the hologram means is converged on the second substrate of the optical disk, to converge the transmitted light formed in the hologram means on the first substrate of the optical disk in cases where the distinguishing information is detected in the detecting means.

In the above configuration, an optical head apparatus comprising the light source, the hologram means, the lens means and the detecting means has the same configuration as that described before. Initially, the optical head apparatus is moved by the moving means to converge in focus the diffracted light formed in the hologram means on the second substrate of the optical disk rotated by the rotating means. Therefore, the distinguishing information recorded on the second substrate is reproduced in the detecting means, and it is informed that pieces of recording information are recorded or reproduced on or from the first substrate having the first thickness. Thereafter, the optical head apparatus is moved by the moving means to converge in focus the transmitted light formed in the hologram means on the first substrate of the optical disk rotated by the rotating means. Therefore, a piece of recording information is recorded or reproduced on or from the first substrate of the optical disk.

Accordingly, even though a high density type of optical disk, in which pieces of recording information is recorded or reproduced on or from the substrate having the first thickness smaller than the second thickness of a conventional optical disk, is utilized, the recording information can be reliably recorded or reproduced.

The fifth object is also achieved by the provision of an optical disk apparatus for recording or reproducing pieces of recording information on or from an optical disk in which the recording information are recorded or reproduced at a high density on or from a first substrate having a thin thickness thinner than that of a compact disk and a piece of distinguishing information informing that the recording information are recorded or reproduced on or from the first substrate having the thin thickness is recorded at a low density on a second substrate having the thin thickness, comprising:

rotating means for rotating the optical disk at a regular speed;

a light source for radiating a beam of incident light;

hologram means for transmitting a part of the incident light radiated from the light source without any diffraction on an outgoing path to form a beam of transmitted light and diffracting a remaining part of the incident light radiated from the light source on the outgoing path to form a beam of diffracted light, the hologram means functioning as a lens for the diffracted light to diverge the diffracted light from the hologram means;

lens means for converging in focus the transmitted light formed in the hologram means on the first substrate of the optical disk rotated by the rotating means to record or reproduce a piece of recording information on or from the optical disk and converging in defocus the diffracted light formed in the hologram means on the second substrate of the optical disk rotated by the rotating means to reproduce the distinguishing information from the optical disk, the transmitted light being reflected by the first substrate of the optical disk and again passing through the lens means and the hologram means on an incoming path, and the diffracted light being reflected by the second substrate of the optical disk and again passing through the lens means and the hologram means on the incoming path;

wavefront changing means for changing a wavefront of the transmitted light passing through the lens means and the hologram means on the incoming path to form one or more beams of recording information light and changing a wavefront of the diffracted light passing through the lens means and the hologram means on the incoming path to form one or more beams of distinguishing information light;

detecting means for detecting intensities of the recording information light formed by the wavefront changing means to generate a recording information signal according to the intensities of the recording information light and detecting intensities of the distinguishing information light formed by the wavefront changing means to generate a distinguishing information signal according to the intensities of the distinguishing information light, the distinguishing information signal expressing the distinguishing information recorded on the second substrate of the optical disk, and the recording information signal expressing the recording information recorded on the first substrate of the optical disk; and moving means for moving an optical head apparatus comprising the light source, the hologram means, the lens means and the detecting means, to converge the diffracted light formed in the hologram means in defocus on the second substrate of the optical disk and moving the optical disk, in which the diffracted light formed in the hologram means is converged on the second substrate of the optical disk in defocus, to converge the transmitted light formed in the hologram means on the first substrate of the optical disk in focus in cases where an intensity of the distinguishing information signal generated in the detecting means is larger than a threshold value.

In the above configuration, an optical head apparatus comprising the light source, the hologram means, the lens means and the detecting means has the same configuration as that described before. Initially, the optical head apparatus is moved by the moving means to converge in defocus the diffracted light formed in the hologram means on the second substrate of the optical disk rotated by the rotating means. In this case, because the distinguishing information is recorded at a low density, a plurality of recording pits expressing the distinguishing information are respectively large in size. Therefore, even though the diffracted light is converged on each of the recording pits in defocus, a converging spot of the diffracted light is formed in each of the recording pits. Therefore, the distinguishing information recorded on the second substrate is reproduced in the detecting means, and it is informed that pieces of recording information are recorded or reproduced on or from the first substrate having the thin thickness. Thereafter, the optical head apparatus is moved by the moving means to converge in focus the transmitted light formed in the hologram means on the first substrate of the optical disk rotated by the rotating means. Therefore, a piece of recording information is recorded or reproduced on or from the first substrate of the optical disk.

Accordingly, even though a high density type of optical disk, in which pieces of recording information are recorded or reproduced on or from the substrate having the thin thickness smaller than an ordinary thickness of a conventional optical disk, is utilized, the recording information can be reliably recorded or reproduced.

The sixth object is achieved by the provision of a binary focus microscope for simultaneously observing a first image put on a first image plane and a second image put on a second image plane, comprising:

an objective lens for refracting a beam of first light diverging from the first image and a beam of second light diverging from the second image, a first distance between the objective lens and the first image of the first image plane differing from a second distance between the objective lens and the second image of the second image plane;

a hologram lens for transmitting the first light refracted by the objective lens without any diffraction to form a beam of transmitted light and diffracting the second light refracted by the objective lens to form a beam of diffracted light, the hologram lens functioning as a lens for the second light to pass the diffracted light through the same optical path as the transmitted light passes through, and a beam of superposed light being formed of the transmitted light and the diffracted light;

an inner lens for converging the superposed light formed by the hologram lens at an image point of a third image plane to simultaneously form the first image and the second image enlarged on the third image plane; and an ocular lens for converging the superposed light which is converged by the inner lens and diverges from the image point to simultaneously form the first image and the second image moreover enlarged.

In the above configuration, a beam of first light diverging from the first image and a beam of second light diverging from the second image are refracted together by the objective lens. In this case, because a first distance between the objective lens and the first image of the first image plane differs from a second distance between the objective lens and the second image of the second image plane, a curvature of the first light refracted differs from another curvature of the second light refracted. Thereafter, the first light refracted transmits through the hologram lens without any diffraction to form a beam of transmitted light, and the second light refracted is diffracted by the hologram lens to form a beam of diffracted light. In this case, because the hologram lens functions as a lens for the diffracted light, a curvature of the diffracted light agrees with that of the transmitted light. In other words, the diffracted light passes through the same optical path as the transmitted light passes through. Therefore, a beam of superposed light is formed of the transmitted light and the diffracted light. Thereafter, the superposed light is converged by the inner lens at an image point of a third image plane, so that the first image and the second image enlarged are simultaneously formed on the third image plane. Thereafter, the superposed light diverging from the image point is converged by the ocular lens, so that the first image and the second image moreover enlarged are simultaneously formed.

Accordingly, an operator can observe the first image and the second image sufficiently enlarged.

The sixth object is also achieved by the provision of a binary focus microscope for simultaneously observing a first image put on a first image plane and a second image put on a second image plane, comprising:

an objective lens for refracting a beam of first light diverging from the first image and a beam of second light diverging from the second image, a first distance between the objective lens and the first image of the first image plane differing from a second distance between the objective lens and the second image of the second image plane;

a hologram lens for transmitting the first light refracted by the objective lens without any diffraction to form a beam of transmitted light and diffracting the second light refracted by the objective lens to form a beam of diffracted light, the hologram lens functioning as a lens for the second light to pass the diffracted light through the same optical path as the transmitted light passes through, and a beam of superposed light being formed of the transmitted light and the diffracted light;

an inner lens for converging the superposed light formed by the hologram lens at an image point of a third image plane to simultaneously form the first image and the second image enlarged on the third image plane; and photographing means for photographing a superposed image formed of the first and second images enlarged on the third image plane by converging the superposed light in the inner lens.

In the above configuration, the first image and the second image enlarged are simultaneously formed on the third image plane in the same manner. Thereafter, the first image and the second image enlarged are photographed by the photographing means as a superposed image.

Accordingly, the first image and the second image enlarged can be observed.

The seventh embodiment is achieved by the provision of an alignment apparatus for aligning a first reference image drawn on a photomask with a second reference image drawn on a sample, comprising:

a light source for radiating beams of alignment light to illuminate the first and second reference images;

an objective lens for refracting both a beam of first alignment light diverging from the first reference image and a beam of second alignment light diverging from the second reference image which are illuminated with the alignment light radiated from the light source, a first distance between the objective lens and the first reference image of the photomask differing from a second distance between the objective lens and the second reference image of the sample;

a hologram lens for transmitting the first alignment light refracted by the objective lens without any diffraction to form a beam of transmitted light and diffracting the second alignment light refracted by the objective lens to form a beam of diffracted light, the hologram lens functioning as a lens for the second alignment light to pass the diffracted light through the same optical path as the transmitted light passes through, and a beam of superposed light being formed of the transmitted light and the diffracted light;

an inner lens for converging the superposed light formed by the hologram lens at an image point of an image plane to simultaneously form the first and second reference images enlarged on the image plane, an optical axis passing through centers of the objective lens, the hologram lens and the inner lens;

photographing means for photographing a superposed image formed of the first and second images enlarged on the image plane by converging the superposed light in the inner lens; and moving means for moving the photomask or the sample according to the superposed image photographed by the photographing means to align the first reference image with the second reference image along the optical axis.

In the above configuration, the objective lens, the hologram lens and the inner lens are the same as those in the binary focus microscope. Therefore, the first and second images enlarged on the image plane is photographed by the photographing means as a superposed image. Thereafter, the photomask or the sample is moved in a direction perpendicular to the optical axis by the moving means to align the first reference image with the second reference image along the optical axis.

Accordingly, because the superposed image formed of the first and second reference images enlarged is photographed by the photographing means, a relative position between the first and second reference images can be accurately observed. Therefore, the first reference image can be accurately aligned with the second reference image.

The eighth embodiment is achieved by the provision of a focusing method for focusing light on a first information medium having a first thickness or a second information medium having a second thickness to record or reproduce a piece of information on or from the first information medium or the second information medium, comprising the steps of:

moving an optical head apparatus in a direction to decrease or increase the distance between the optical head apparatus and the first or second information medium, the optical head apparatus comprising a light source for radiating a beam of incident light, hologram means for transmitting a part of the incident light radiated from the light source without any diffraction on an outgoing path to form a beam of transmitted light and diffracting a remaining part of the incident light radiated from the light source on the outgoing path to form a beam of diffracted light, the hologram means functioning as a lens for the diffracted light to diverge the diffracted light from the hologram means or converge the diffracted light, lens means for converging the transmitted light formed in the hologram means at a first focal length on the outgoing path to form a first converging spot at a front surface of the first information medium or converging the diffracted light formed in the hologram means at a second focal length on the outgoing path to form a second converging spot at a front surface of the second information medium, the transmitted light being incident on a rear surface of the first information medium and being converged at the front surface of the first information medium, the transmitted light being reflected at the rear surface of the first information medium and again passing through the lens means and the hologram means on an incoming path, the diffracted light being incident on a rear surface of the second information medium and being converged at the front surface of the second information medium, and the diffracted light being reflected at the rear surface of the first information medium and again passing through the lens means and the hologram means on the incoming path, wavefront changing means for changing a wavefront of the transmitted light or the diffracted light passing through the lens means and the hologram means on the incoming path to form one or more beams of information light, and detecting means for detecting intensities of the information light formed by the wavefront changing means and generating an information signal and a focus error signal according to the intensities of the information light, the information signal expressing a piece of information recorded on the first information medium or the second information medium;

judging whether or not an intensity of the focus error signal generated in the detecting means is larger than a threshold value; and adjusting the position of the optical head apparatus to decrease the intensity of the focus error signal to zero when the intensity of the focus error signal becomes larger than the threshold value.

In the above steps, the focusing method is performed by utilizing the optical head apparatus described above. The intensity of the focus error signal is largely increased when the distance between the lens means and the first or second information medium is near to a focal length of the lens means. Therefore, when the intensity of the focus error signal becomes larger than a threshold value, the lens means is placed near to a just-focus point in which the transmitted light or the diffracted light is converged on the first or second information medium in focus.

Accordingly, in cases where the position of the optical head apparatus is adjusted to decrease the intensity of the focus error signal to zero when the intensity of the focus error signal becomes larger than the threshold value, the transmitted light or the diffracted light can be focused on the first or second information medium.

The ninth embodiment is achieved by the provision of an information reproducing method for reproducing a piece of recording information from an optical disk in which the recording information are recorded at a high density on a first substrate having a first thickness and a piece of distinguishing information informing that the recording information are recorded on the first substrate is recorded at an ordinary density on a second substrate having a second thickness larger than the first thickness, comprising the step of:

moving an optical disk apparatus under the second substrate of the optical disk, the optical disk comprising rotating means for rotating the optical disk at a regular speed, a light source for radiating a beam of incident light;

hologram means for transmitting a part of the incident light radiated from the light source without any diffraction on an outgoing path to form a beam of transmitted light and diffracting a remaining part of the incident light radiated from the light source on the outgoing path to form a beam of diffracted light, the hologram means functioning as a lens for the diffracted light to diverge the diffracted light from the hologram means, lens means for converging the transmitted light formed in the hologram means on the first substrate of the optical disk rotated by the rotating means to record or reproduce a piece of recording information on or from the optical disk and converging the diffracted light formed in the hologram means on the second substrate of the optical disk rotated by the rotating means to reproduce the distinguishing information from the optical disk, the transmitted light being reflected by the first substrate of the optical disk and again passing through the lens means and the hologram means on an incoming path, and the diffracted light being reflected by the second substrate of the optical disk and again passing through the lens means and the hologram means on the incoming path, wavefront changing means for changing a wavefront of the transmitted light passing through the lens means and the hologram means on the incoming path to form one or more beams of recording information light and changing a wavefront of the diffracted light passing through the lens means and the hologram means on the incoming path to form one or more beams of distinguishing information light, and detecting means for detecting intensities of the recording information light formed by the wavefront changing means to generate a recording information signal according to the intensities of the recording information light and detecting intensities of the distinguishing information light formed by the wavefront changing means to generate a distinguishing information signal according to the intensities of the distinguishing information light, the distinguishing information signal expressing the distinguishing information recorded on the second substrate of the optical disk, and the recording information signal expressing the recording information recorded on the first substrate of the optical disk; and converging the diffracted light on the second substrate of the optical disk to reproduce the distinguishing information;

moving the optical disk apparatus to a position under the first substrate of the optical disk to converge the transmitted light on the first substrate of the optical disk when the distinguishing information is detected in the detecting means; and reproducing the recording information by generating the recording information signal in the detecting means.

In the above steps, the information reproducing method is performed by utilizing the optical disk apparatus described above. The distinguishing information placed on the second substrate of the optical disk is reproduce with the diffracted light. In this case, because the second substrate has the second thickness, the diffracted light is just focused on the second substrate. Thereafter, when the distinguishing information is detected, the optical disk apparatus is moved to a position under the first substrate of the optical disk, and the transmitted light is converged on the first substrate of the optical disk. In this case, because the first substrate has the first thickness, the diffracted light is just focused on the first substrate.

Accordingly, the recording information can be reliably reproduced.

BRIEF DESCRIPTION OF THE DRAWINGS

The objects, features and advantages of the present invention will be apparent from the following description taken in conjunction with the accompanying drawings, in which:

FIG. 5 is a plan view of a hologram lens shown in FIGS. 4A, 4B, a grating pattern of the hologram lens being depicted;

DETAIL DESCRIPTION OF THE PREFERRED EMBODIMENTS

Preferred embodiments of a compound objective lens, an imaging optical system, an optical head apparatus, an optical disk, an optical disk apparatus, a binary focus microscope and an alignment apparatus according to the present invention are described with reference to drawings.

(First Embodiment)

Figure 1:
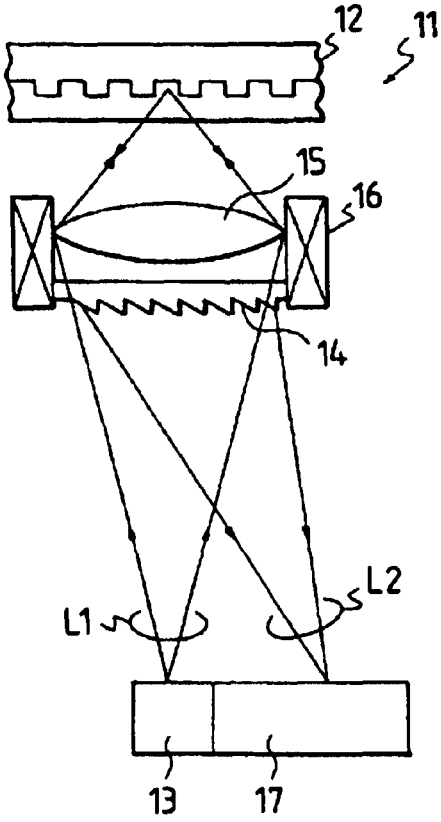
FIG. 1 PRIOR ART
FIG. 1 is a constitutional view of a conventional optical head apparatus proposed in Japanese Patent Application No. 46630 of 1991.
Figure 2A:
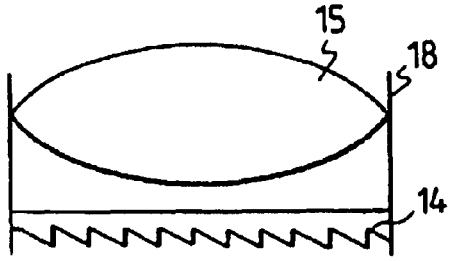
FIG. 2A PRIOR ART
FIGS. 2A, 2B are respectively a cross sectional view of a set of an objective lens and a blazed hologram shown in FIG. 1.
Figure 2B:
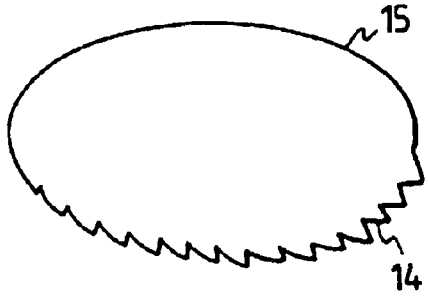
FIG. 2B PRIOR ART
Figure 3:
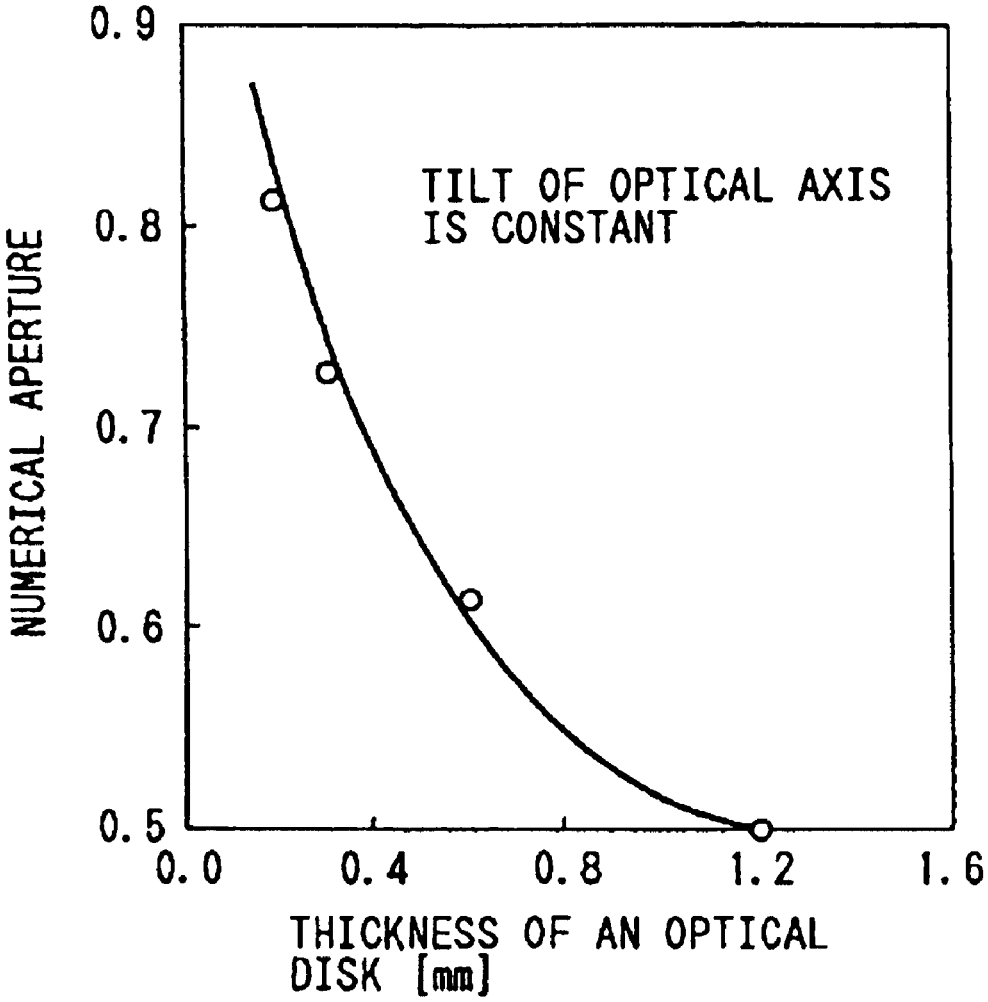
FIG. 3 PRIOR ART
FIG. 3 shows a relationship between the thickness of an optical disk and a numerical aperture of an objective lens on condition that the tilt of the optical axis is constant.
Figure 4A:
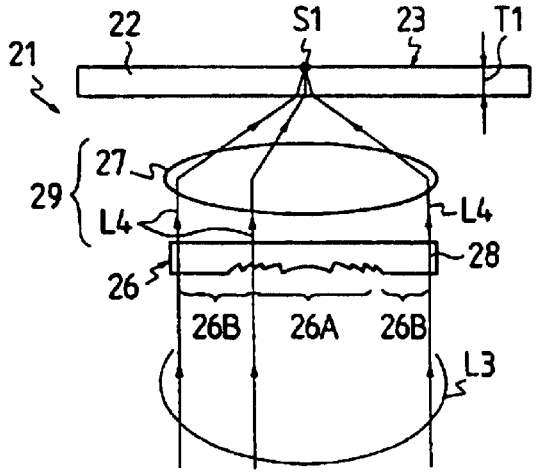
FIG. 4A is a constitutional view of an imaging optical system having a compound objective lens according to a first embodiment of the present invention, a beam of transmitted light not diffracted being converged on a thin type of information medium.
Figure 4B:
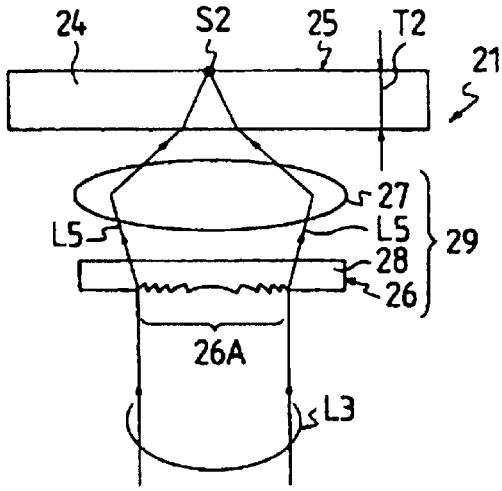
FIG. 4B is a constitutional view of the imaging optical system shown in FIG. 4A, a beam of first-order diffracted light being converged on a thick type of information medium.

FIG. 4A is a constitutional view of an imaging optical system having a compound objective lens according to a first embodiment of the present invention, a beam of transmitted light not diffracted being converged on a thin type of information medium. FIG. 4B is a constitutional view of the imaging optical system shown in FIG. 4A, a beam of first-order diffracted light being converged on a thick type of information medium. FIG. 5 is a plan view of a hologram lens shown in FIGS. 4A, 4B, a grating pattern of the hologram lens being depicted.

As shown in FIGS. 4A, 4B, an imaging optical system 21 for converging light on a first substrate 22 of a thin type of first information medium 23 (a thickness T1) or a second substrate 24 of a thick type of second information medium 25 (a thickness T2) to form a diffraction-limited converging spot comprises a blazed hologram lens 26 for transmitting a part of incident light L3 radiated from a light source without any diffraction to form a beam of transmitted light L4 and diffracting a remaining part of the incident light L3 to form a beam of first-order diffracted light L5, and an objective lens 27 for converging the transmitted light L4 on the first information medium 23 or converging the first-order diffracted light L5 on the second information medium 25.

The first information medium 23 represents a prospective optical disk having a high density memory capacity, and the thickness T1 of the first information medium 23 ranges from 0.4 mm to 0.8 mm. The second information medium 25 represents a compact disk or a laser disk appearing on the market now, and the thickness T2 of the second information medium 25 is about 1.2 mm.

The term "convergence" denotes in this specification that divergent light or collimated light is focused to form a diffraction-limited micro spot.

In the above configuration, a part of incident light L3 collimated transmits through the hologram lens 26 without any diffraction, and a beam of transmitted light L4 (that is, a beam of zero-order diffracted light L4) is formed. Thereafter, the transmitted light L4 is converged by the objective lens 27. Also, a remaining part of the incident light L3 is diffracted and refracted by the hologram lens 26, and a beam of first-order diffracted light L5 is formed. In this case, the hologram lens 26 selectively functions as a concave lens for the first-order diffracted light L5, so that the first-order diffracted light L5 diverges from the hologram lens 26. Thereafter, the first-order diffracted light L5 is converged by the objective lens 27.

In cases where the thin type of first information medium 23 is utilized to record or reproduce pieces of information on or from a front surface of the medium 23, as shown in FIG. 4A, the transmitted light L4 is incident on a rear surface of the first information medium 23 and is focused on its front surface by the objective lens 27 to form a diffraction-limited converging spot S1 on the first information medium 23. In contrast, in cases where the thick type of second information medium 25 is utilized to record or reproduce pieces of information on or from a front surface of the medium 25, the diffracted light L5 is incident on a rear surface of the second information medium 25 and is focused on its front surface to form a diffraction-limited converging spot S2 on the second information medium 25. Because the hologram lens 26 functions as a concave lens to diverge the first-order diffracted light L5, the diffraction-limited converging spots S1, S2 are formed even though the thickness T1 of the first information medium 23 differs from the thickness T2 of the second information medium 25. Therefore, a compound objective lens 29 composed of the hologram lens 26 and the objective lens 27 has substantially two focal points.

As shown in FIG. 5, the hologram lens 26 is formed by drawing a grating pattern P1 in a pattern region 26A of a transparent substrate 28 in a concentric circle shape. The pattern region 26A is positioned in a center portion of the transparent substrate 28, and a no-pattern region 26B is positioned in a peripheral portion of the transparent substrate 28 to surround the pattern region 26A. An optical axis of the imaging optical system 21 passes through a central point of the grating pattern P1 and a central axis of the objective lens 27.

Figure 6:
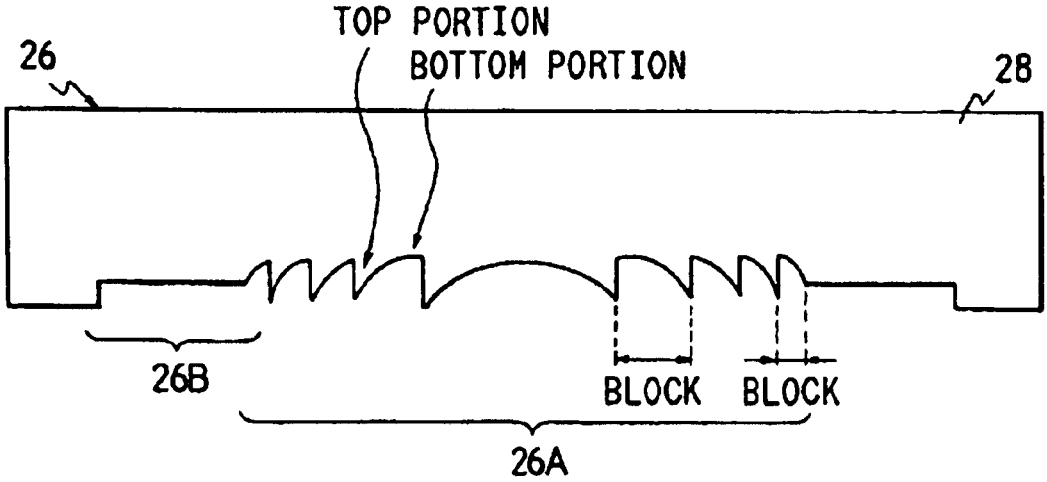
FIG. 6 is a cross sectional view of the hologram lens shown in FIG. 5, the grating pattern formed in relief on the hologram lens being shown.

In addition, as shown in FIG. 6, the grating pattern P1 of the hologram lens 26 is formed in relief to produce a phase modulation type of hologram lens. That is, blocks which each are composed of a bottom portion and a top portion are concentrically formed in the grating pattern P1. The height H of the relief in the grating pattern P1 is set to:

$$H < \lambda/(n(\lambda)-1), \quad (1)$$

where the symbol $\lambda$ denotes a wavelength of the incident light L3 and the symbol $n(\lambda)$ denotes a refractive index of the transparent substrate 28 for the incident light L3. In this case, a difference in phase modulation degree between the incident light L3 transmitting through a bottom portion of the grating pattern P1 and the incident light L3 transmitting through a top portion of the grating pattern P1 is lower than $2\pi$ radians. Therefore, a diffraction efficiency of the hologram lens 26 for the incident light L3 transmitting through the grating pattern P1 is less than 100% to generate the light L4 transmitting through the grating pattern P1. Also, the incident light L3 transmitting through the no-pattern region 26B is not diffracted. As a result, the intensity of the transmitted light L4 can be sufficient to record or reproduce pieces of information on or from the first information medium 23.

Figure 7:
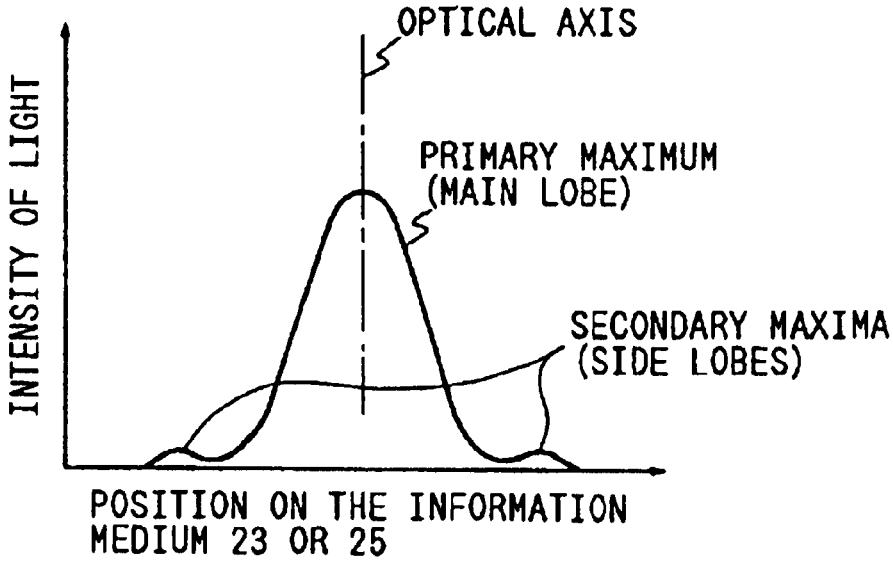
FIG. 7 is an explanatory diagram showing an intensity distribution of transmitted light L4 converged on a converging spot S1 of a first information medium, a primary maximum and secondary maxima suppressed occurring in the converging spot S1.

Also, because the intensity of the transmitted light L4 is sufficient over the entire surface of the hologram lens 26, secondary maxima (side lobes) of the transmitted light L4 undesirably occurring in the converging spot S1 can be suppressed. In detail, as an intensity distribution of the transmitted light L4 converged on the converging spot S1 is shown in FIG. 7, a primary maximum (a main lobe) of the transmitted light L4 positioned in a center of the converging spot S1 is utilized to record or reproduce a piece of information on or from the first information medium 23, and secondary maxima positioned around the primary maximum are unnecessary because the secondary maxima deteriorate a recording pit or a reproducing signal formed by the primary maximum.

The grating pattern P1 of hologram lens 26 formed in relief is blazed as shown in FIG. 6, so that the occurrence of minus first-order diffracted light is considerably suppressed. Therefore, the intensity sum of the transmitted light L4 and the first-order diffracted light L5 is maximized. In other words, a utilization efficiency of the incident light L3 is enhanced.

The numerical aperture NA of the objective lens 27 is equal to or more than 0.6. Also, when the transmitted light L4 is converged by the objective lens 27, the diffraction-limited converging spot S1 is formed on the first information medium 23 having a thickness T1.

A diameter of the hologram lens 26 is almost the same as an aperture of the objective lens 27, so that a diameter of the pattern region 26A is smaller than the aperture of the objective lens 27. Because the incident light L3 transmitting through the no-pattern region 26B is not diffracted, not only the light L4 transmitting through the pattern region 26A but also the light L4 transmitting through the no-pattern region 26B are converged on the first information medium 23 by the objective lens 27 having a high numerical aperture. Therefore, the intensity of the transmitted light L4 converged at the converging point S1 can be increased. In contrast to the transmitted light L4, only the incident light L3 transmitting through the pattern region 26A of the hologram lens 26 is changed to the first-order diffracted light L5, and the first-order diffracted light L5 is converged on the second information medium 25 by the objective lens 27 having substantially a low numerical aperture.

The phase of the light L4 transmitting through the grating pattern P1 of the pattern region 26A is determined by an average value of the phase modulation degrees in the light L4 transmitting through the bottom and top portions of the grating pattern P1. In contrast, because the height of the no-pattern region 26B is constant, the phase of the light L4 transmitting through the no-pattern region 26B is modulated at a phase modulation degree. Therefore, as shown in FIG. 6, the height of the no-pattern region 26B is set even with an average height of the grating pattern P1 to enhance the convergence function of the objective lens 27.

Figure 8A:
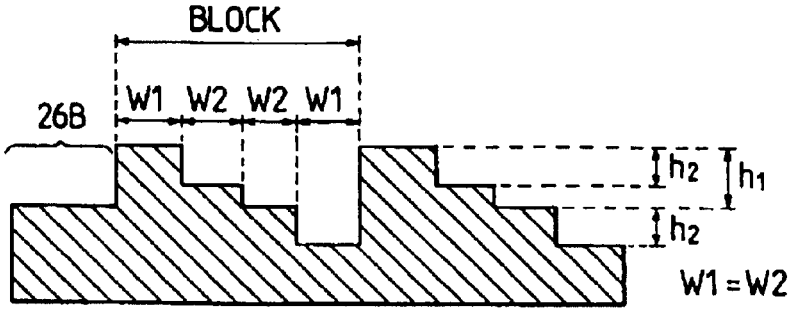
FIG. 8A is a cross sectional view of the hologram lens shown in FIG. 5, the grating pattern approximating to a step-wise shape composed of four stairs being shown.

For example, as shown in FIG. 8A, in cases where each block of the grating pattern P1 in the hologram lens 26 shown in FIG. 6 approximates to a step-wise shape composed of four stairs, a first step is etched at a depth h1+h2 and a width W1, a second step is etched at a depth hi and a width W2, a third step is etched at a depth h2 and a width W2, and a fourth step is etched at a width W1. Therefore, the grating pattern P1 approximating to the step-wise shape is formed in the pattern region 26A. Thereafter, a peripheral portion of the transparent substrate 28 is etched by a depth h1 or h2 to form the no-pattern region 26B. Therefore, the height of the no-pattern region 26B is almost the same as an average height of the pattern region 26A, so that the phase of the light L4 transmitting through the pattern region 26A is almost the same as that of the light L4 transmitting through the no-pattern region 26B.

Figure 8B:
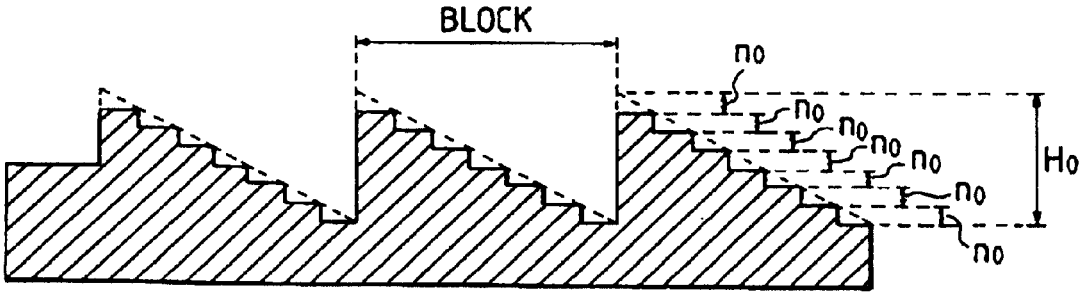
FIG. 8B is a cross sectional view of the hologram lens shown in FIG. 5, the grating pattern approximating to a step-wise shape composed of a plurality of stairs being shown.

In addition, as shown in FIG. 8B, an ideal blazed shape of the hologram lens 26 shown in FIG. 6 can approximate to a step-wise shape which is obtained by etching a center portion of the transparent substrate 28 many times. In this case, the height H0 of the step-wise shape is set to satisfy an equation $H0<\lambda/(n(\lambda)-1)$ so that the difference in phase modulation degree is set to a value lower than $2\pi$ radians. Specifically, in cases where the step-wise shape of the hologram lens 26 is composed of a flight of N stairs having the same difference $n_o$ in level, the difference $n_o$ in level is set to satisfy an equation $n_o<\lambda/\{(n(\lambda)-1)*N\}$ to set the difference in phase modulation degree of each stairs to a value lower than $2\pi/N$ radians. A peripheral portion of the transparent substrate 28 is etched to set the thickness of the no-pattern region 26B to a thickness of the pattern region 26A at one of the N stairs which is not the top stair or the bottom stair. Therefore, the height of the no-pattern region 26B is almost the same as an average height of the pattern region 26A, so that the phase of the light L4 transmitting through the pattern region 26A is almost the same as that of the light L4 transmitting through the no-pattern region 26B.

The grating pattern P1 of the hologram lens 26 is designed to correct any aberration occurring in the objective lens 27 and the second information medium 25, so that the first-order diffracted light L5 transmits through the second information medium 25 having a thickness T2 and is converged on the medium 25 to form the diffraction-limited converging spot S2 without any aberration. A method for designing the hologram lens 26 having an aberration correcting function is described.

After the first-order diffracted light L5 is converged on the second information medium 25, spherical waves diverge from the converging spot S2 and transmit through the second substrate 24 and the objective lens 27. Thereafter, the spherical waves transmit through the transparent substrate 28 and optically interfere with the incident light L3. Therefore, an interference pattern is formed by the interference between the spherical waves and the incident light L3. The interference pattern can be calculated by subtracting the phase of the spherical waves from an inverted phase obtained by inverting the phase of the incident light L3. Accordingly the grating pattern P1 of the hologram lens 26 which agrees with the interference pattern calculated can be easily formed according to a computer generated hologram technique.

Accordingly, because the compound objective lens 29 is composed of the objective lens 27 and the hologram lens 26 in which a part of the incident light L3 is diffracted and refracted, a diffraction-limited converging spot can be reliably formed on an information medium regardless of whether the information medium has a thickness T1 or a thickness T2. Also, two diffraction-limited converging spots can be simultaneously formed on an information medium at difference depths. In other words, the compound objective lens has substantially two focal points.

Also, because the diffraction efficiency of the hologram lens 26 is less than 100% and the intensity of the light L4 transmitting through the hologram lens 26 is sufficient to record or reproduce information on or from the first information medium 23, the secondary maxima of the transmitted light L4 converged on the converging spot S1 can be suppressed.

Also, because the hologram lens 26 is blazed, the occurrence of minus first-order diffracted light can be considerably suppressed. Therefore, the intensity sum of the transmitted light L4 and the first-order diffracted light L5 can be maximized, and a utilization efficiency of the incident light L3 can be enhanced.

Also, because the hologram lens 26 functions as a lens only for the first-order diffracted light, the position of the converging point S1 formed by the transmitted light L4 differs from that of the converging point S2 formed by the first-order diffracted light L5 in an optical axis direction. Therefore, when the transmitted light L4 is converged in focus on an information recording plane of the information medium 23 to record or read a piece of information, the first-order diffracted light L5 converged on the information medium 23 is out of focus at the information recording plane. In the same manner, when the first-order diffracted light L5 is converged in focus on an information recording plane of the information medium 25, the transmitted light L4 converged on the information medium 25 is out of focus at the information recording plane. Accordingly, when the light L4 (or L5) is converged on the converging spot S1 (or S2) in focus to record or read the information, the light L5 (or L4) not converged on the converging spot S1 (or S2) in focus does not adversely influence on the recording or reading of the information. To reliably prevent the adverse influence on the recording or reading of the information, a difference in the optical axis direction between the converging spots S1, S2 is required to be equal to or more than 50 μm. That is, when the difference is equal to or more than 50 μm, the light L5 (or L4) largely diverges to reduce the intensity of the light L5 (or L4) at an information recording plane when the light L4 (or L5) is converged on the converging spot S1 (or S2) of the information recording plane at a high intensity.

Also, because the thickness T2 of the second information medium 25 representing the compact disk or the laser disk is about 1.2 mm and because the thickness T1 of the first information medium 23 representing a prospective optical disk ranges from 0.4 mm to 0.8 mm, the difference in the optical axis direction between the converging points S1, S2 is required to be equal to or less than 1.0 mm by considering a moving range of an actuator with which the position of the compound objective lens 29 composed of the objective lens 27 and the hologram lens 26 is adjusted according to a focus servo signal. Because the hologram lens 26 functions as a concave lens for the first-order diffracted light, the difference between the converging points S1, S2 can be increased to about 1 mm.

Accordingly, even though the transmitted light L4 and the first-order diffracted light L5 are simultaneously converged by the objective lens 27, no adverse influence is exerted on the recording or reproduction of the information on condition that the difference between the converging points S1, S2 ranges from 50 μm to 1 mm.

Examples of the utilization of the imaging optical system 21 for various types of optical disks are described.

In cases where the image optical system 21 is utilized for an optical disk device in which pieces of information recorded in a thin type of high density optical disk and a thick type of compact disk are exclusively reproduced, the diffraction efficiency of the hologram lens 26 for changing the incident light L3 to the diffracted light L5 is set in a range from about 20% to 70%. In this case, the intensity of the transmitted light L4 converged on the high density optical disk is almost the same as that of the first-order diffracted light L5 converged on the compact disk. Therefore, the output power of the incident light L3 can be minimized.

Also, in cases where the image optical system 21 is utilized for an optical disk device in which pieces of information recorded in a thin type of high density optical disk are recorded or reproduced and pieces of information recorded in a thick type of optical disk are exclusively reproduced, the diffraction efficiency of the hologram lens 26 for changing the incident light L3 to the first-order diffracted light L5 is set to a value equal to or lower than 30%. In this case, even though a high intensity of transmitted light L4 is required to record a piece of information on the high density optical disk, the recording of the information can be reliably performed without increasing the intensity of the incident light L3 because a transmission efficiency of the hologram lens 26 for the incident light L3 is high. In other words, a utilization efficiency of the incident light L3 can be enhanced when a piece of information is recorded on the high density optical disk, so that the output power of the incident light L3 can be minimized.

Figure 9A:
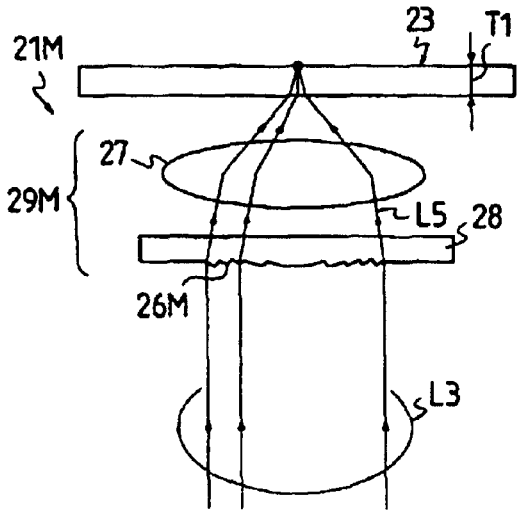
FIG. 9A is a constitutional view of an imaging optical system having a compound objective lens according to a modification of the first embodiment, a beam of first-order diffracted light being converged on a thin type of information medium.
Figure 9B:
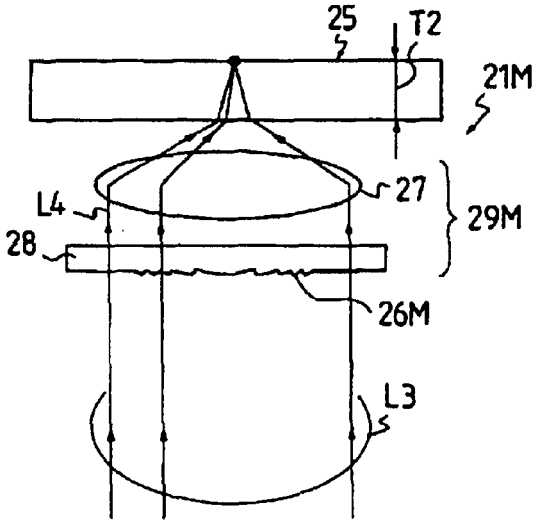
FIG. 9B is a constitutional view of the imaging optical system shown in FIG. 9A, a beam of transmitted light not diffracted being converged on a thick type of information medium.

In the first embodiment, the hologram lens 26 functions as a concave lens for the first-order diffracted light L5. However, it is applicable that a hologram lens 26M functioning as a convex lens for the first-order diffracted light L5 be utilized in place of the hologram lens 26. That is, as shown in FIGS. 9A, 9B, the diffracted light L5 is converged on the first information medium 23 by the objective lens 27 to form the diffraction limited converging spot S1, and the transmitted light L4 is converged on the second information medium 25 by the objective lens 27 to form the diffraction limited converging spot S2. In this case, the difference between the converging points S1, S2 is required to be equal to or less than 0.5 mm by considering the moving range of the actuator. However, the occurrence of a chromatic aberration can be prevented in an imaging optical system 21M in which the hologram lens 26M functioning as a concave lens for the diffracted light L5 is utilized. The achromatization function in the imaging optical system is described in detail.

When a focal length of the hologram lens 26M for the incident light L3 having a wavelength $\lambda_o$ is represented by $f_{Ho}$ and another focal length of the hologram lens 26M for the incident light L3 having a wavelength $\lambda_l$ is represented by $f_{Hl}$, an equation (2) is satisfied.

$$f_{H1}=f_{Ho}\times\lambda_o/\lambda_l \tag{2}$$

The focal length $f_H$ of the hologram lens 22 is shortened as the wavelength $\lambda$ of the incident light L3 becomes longer. Also, when a refractive index of the objective lens 27 for the incident light L3 having a wavelength $\lambda_o$ is represented by $n(\lambda_o)$ and another refractive index of the objective lens 27 for the incident light L3 having a wavelength $\lambda_l$ is represented by $n(\lambda_l)$, a focal length $f_D(\lambda)$ of the objective lens 27 for the incident light L3 having a wavelength $\lambda$ is formulated by an equation (3).

$$f_D(\lambda_l)=f_D(\lambda_o)\times(n(\lambda_o)-1)/(n(\lambda_l)-1) \tag{3}$$

The focal length $f_D(\lambda)$ of the objective lens 27 is lengthened as the wavelength $\lambda$ of the incident light L3 becomes longer. That is, the dependence of the focal length $f_D(\lambda)$ on the wavelength λ in the objective lens 27 is opposite to that of the focal length $f_H$ on the wavelength λ in the hologram lens 26M. Therefore, a condition that the compound objective lens 29M composed of the objective lens 27 and the hologram lens 26M functions as an achromatic lens is formulated by an equation (4).

$$1/f_{Ho}+1/f_D(\lambda_o)=1/f_{Hl}+1/f_D(\lambda_l)=1/(f_{Ho}\times\lambda_o/\lambda_l)+(n(\lambda_l)-1)/\{f_D(\lambda_o)\times(n(\lambda_o)-1)\} \quad (4)$$

Accordingly, because the dependence of the focal length $f_D(\lambda)$ on the wavelength λ in the objective lens 27 is opposite to that in the hologram lens 22, the compound objective lens 29M having an achromatic function can be formed by the combination of the lenses 26M, 27, and the occurrence of the chromatic aberration can be prevented. Also, even though the equation (4) is not strictly satisfied, the occurrence of the chromatic aberration can be largely suppressed.

Also, a curvature of the objective lens 27 can be small because the hologram lens 26M functions as a convex lens for the first-order diffracted light L5. Also, because the hologram lens 26M is a plane type of element, a lightweight type of compound objective lens having an achromatic function can be made in large scale manufacture. A principal of the achromatization has been proposed in a first literature (D. Faklis and M. Morris, Photonics Spectra(1991), November p.205 & December p.131), a second literature (M. A. Gan et al., S.P.I.E.(1991), Vol.1507, p.116), and a third literature (P. Twardowski and P. Meirueis, S.P.I.E.(1991), Vol.1507, p.55).

(Second Embodiment)

Figure 10A:
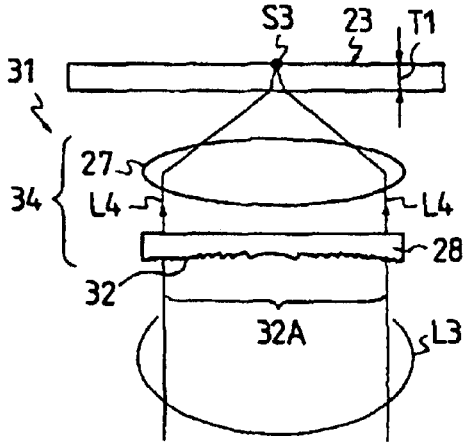
FIG. 10A is a constitutional view of an imaging optical system having a compound objective lens according to a second embodiment of the present invention, a beam of transmitted light not diffracted being converged on a thin type of information medium.
Figure 10B:
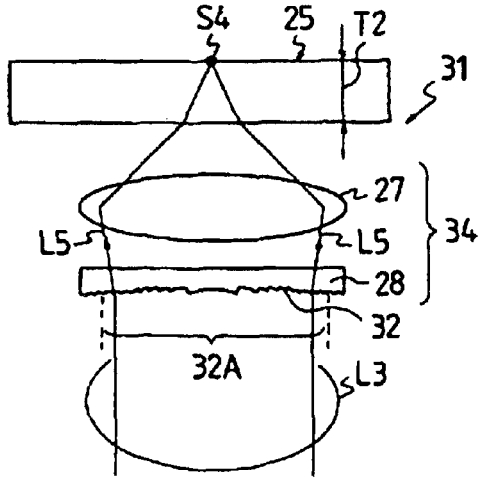
FIG. 10B is a constitutional view of the imaging optical system shown in FIG. 10A, a beam of first-order diffracted light being converged on a thick type of information medium.

FIG. 10A is a constitutional view of an imaging optical system having a compound objective lens according to a second embodiment of the present invention, a beam of transmitted light not diffracted being converged on a thin type of information medium. FIG. 10B is a constitutional view of the imaging optical system shown in FIG. 10A, a beam of first-order diffracted light being converged on a thick type of information medium.

As shown in FIGS. 10A, 10B, an imaging optical system 31 for converging light on the first substrate 22 of the first information medium 23 (the thickness T1) or the second substrate 24 of the second information medium 25 (the thickness T2) to form a diffraction-limited converging spot, comprises a blazed hologram lens 32 for transmitting a part of incident light L3 without any diffraction to form a beam of transmitted light L4 and diffracting a remaining part of incident light L3 to form a beam of first-order diffracted light L5, and the objective lens 27 for converging the transmitted light L4 on the first information medium 23 or converging the first-order diffracted light L5 on the second information medium 25.

The hologram lens 32 is formed by drawing a grating pattern P2 in a pattern region 32A of the transparent substrate 28 in a concentric circle shape. The pattern region 32A is positioned in a center portion of the transparent substrate 28. An diameter of the grating pattern P2 is equal to or larger than an aperture of the objective lens 27. Also, a diffraction efficiency of the hologram lens 32 for the incident light L3 transmitting through the grating pattern P2 is less than 100% in the same manner as in the first embodiment, so that the intensity of the transmitted light L4 is sufficient to record or reproduce a piece of information on or from the first information medium 23.

Figure 11:
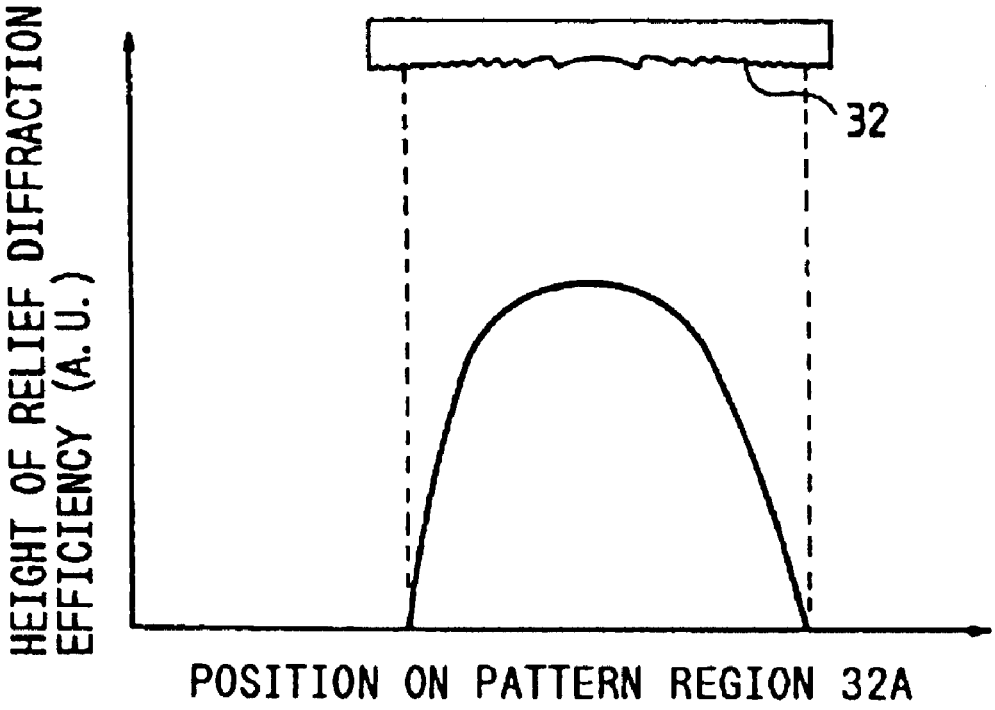
FIG. 11 shows a change of a diffraction efficiency of a hologram lens shown in FIGS. 10A, 10B.
Figure 12A:
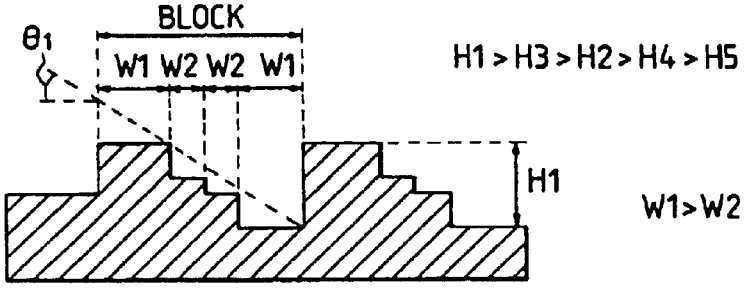
FIGS. 12A to 12E are respectively a cross sectional view of the hologram lens shown in FIGS. 10A, 10B, the grating pattern of the hologram lens approximating to a step-wise shape.

In addition, as shown in FIG. 11, the diffraction efficiency in a central portion of the pattern region 32A is high, and the diffraction efficiency is gradually decreased toward an outer direction of the pattern region 32A. In other words, in cases where the grating pattern P2 of the hologram lens 32 is formed in relief, the height H of the relief in the grating pattern P2 is gradually lowered toward the outer direction of the pattern region 32A. Or, in cases where an ideal blazed shape of the hologram lens 26 approximates to a step-wise shape, each block of the grating pattern P2 positioned in the central portion of the transparent substrate 28 is formed in a step-wise shape shown in FIG. 12A in which an inclined angle $\theta_1$ of stairs is large and a relationship W1 >W2 between a first etching width W1 and a second etching width W2 is satisfied, and the grating pattern P2 formed in the step-wise shape shown in FIG. 12A is gradually changed by decreasing the first etching width W1 and increasing the second etching width W2 toward the outer direction of the pattern region 32A while the height H of the grating pattern P2 is gradually decreased. Therefore, each block of the grating pattern P2 positioned in a peripheral portion of the transparent substrate 28 is formed in a step-wise shape shown in FIG. 12B in which an inclined angle $\theta_2$ of stairs is small and a relationship W1<W1 between the etching widths is satisfied. Also, each block of the grating pattern P2 positioned in a middle portion between the central and peripheral portions is formed in a step-wise shape shown in FIG. 12C in which the etching widths W1, W2 is the same.

In the above configuration of the imaging optical system 31, a part of the incident light L3 transmits through the hologram lens 32 without any diffraction to form a beam of transmitted light L4, and the transmitted light L4 is converged by the objective lens 27. Also, a remaining part of the incident light L3 is diffracted and refracted by the hologram lens 32. In this case, the hologram lens 32 functions as a concave lens for the incident light L3, so that a first-order diffracted light L5 diverges from the hologram lens 32. Thereafter, the first-order diffracted light L5 is converged by the objective lens 27.

In cases where the thin type of first information medium 23 is utilized to record or reproduce pieces of information on or from a front surface of the medium 23, as shown in FIG. 10A, the transmitted light L4 is incident on a rear surface of the first information medium 23 and is focused on its front surface by the objective lens 27 to form a diffraction-limited converging spot S3 on the first information medium 23. In this case, because the diffraction efficiency in the central portion of the grating pattern P2 is high and because the diffraction efficiency is gradually decreased toward the outer direction of the grating pattern P2, a diffraction probability of the incident light L3 is lowered in the peripheral portion of the grating pattern P2. Therefore, the light L4 transmits through the objective lens 27 on condition that the numerical aperture NA of the objective lens 27 is high.

In contrast, in cases where the thick type of second information medium 25 is utilized to record or reproduce pieces of information on or from a front surface of the medium 25, the diffracted light L5 is incident on a rear surface of the second information medium 25 and is focused on its front surface to form a diffraction-limited converging spot S5 on the second information medium 25. In this case, because the hologram lens 32 functions as a concave lens to diverge the first-order diffracted light L5, the diffraction-limited converging spots S3, S4 are formed even though the thickness T1 of the first information medium 23 differs from the thickness T2 of the second information medium 25. Therefore, a compound objective lens 34 composed of the hologram lens 32 and the objective lens 27 has substantially two focal points.

Accordingly, because the light L4 transmits through the objective lens 27 on condition that the numerical aperture NA of the objective lens 27 is high, the intensity of the transmitted light L4 converged on the first information medium 23 can be high.

Figure 13A:
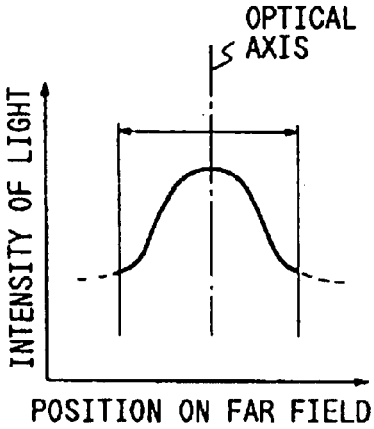
FIG. 13A shows an intensity distribution of incident light utilized in the second embodiment, a far field pattern of the incident light being distributed in a Gaussian distribution.
Figure 13B:
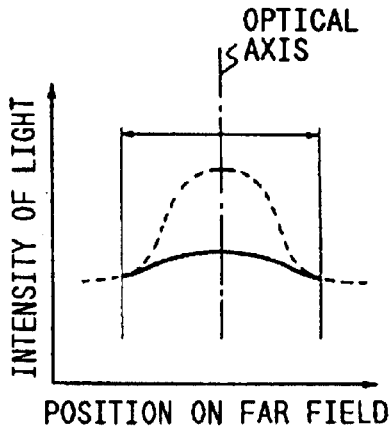
FIG. 13B shows an intensity distribution of transmitted light transmitting through a hologram lens shown in FIGS. 10A, 10B, a far field pattern of the incident light being distributed in a gently-sloping shape.

Also, in cases where the incident light L3 is radiated from a semiconductor laser, a far field pattern of the incident light L3 is distributed in a Gaussian distribution as shown in FIG. 13A. Therefore, because the diffraction efficiency is gradually decreased toward the outer direction of the grating pattern P2, a far field pattern of the transmitted light L4 is distributed in a gently-sloping shape as shown in FIG. 13B. In contrast to the second embodiment, because the incident light L3 is not diffracted in the no-pattern region 26b of the hologram lens 26 in the first embodiment, the intensity of the transmitted light L4 is suddenly increased at the peripheral portion of the hologram lens 26.

Accordingly, secondary maxima of the transmitted light L4 converged on the converging spot S3 can be moreover suppressed in the second embodiment as compared with in the first embodiment. That is, the recording and reproducing of the information can be performed without any deterioration of the information by utilizing the imaging optical system 31.

Figure 14A:
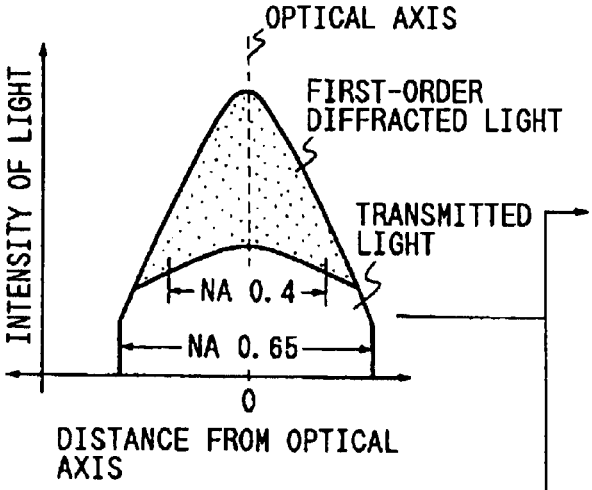
FIGS. 14A to 14C show intensity distributions of transmitted light and diffracted light transmitting through a hologram lens shown in FIGS. 10A, 10B.
Figure 14B:
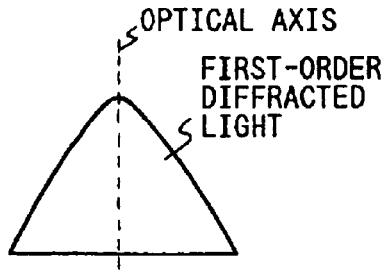
Figure 14C:
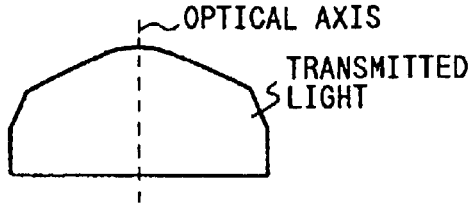

In addition, in cases where the first-order diffracted light L5 is converged on the second information medium 25 to form the diffraction-limited converging spot S4, a numerical aperture of the objective lens 27 for the first-order diffracted light L5 is low because the diffraction efficiency of the hologram lens 32 is decreased toward an outer direction of the pattern region 32A. As a result, the intensity of the first-order diffracted light L5 becomes lowered. In cases where the diffraction efficiency of the hologram lens 32 is heightened to increase the intensity of the first-order diffracted light L5, the intensity of the transmitted light L4 at its inner beam portion is largely decreased, and secondary maxima (or side lobes) of the transmitted light L4 at the converging spot S3 is undesirably increased. Therefore, the incident light L3 of which the far field pattern is distributed in the Gaussian distribution is radiated to the hologram lens 32 to increase the intensity of the first-order diffracted light L5 without any increase of the second maxima. In detail, as shown in FIG. 14A, the incident light L3 distributed not only in a central portion of the Gaussian distribution but also in a peripheral portion of the Gaussian distribution transmits through the hologram lens 32 and is refracted by the objective lens 27 because the diameter of the grating pattern P2 is equal to or larger than the aperture of the objective lens 27. Therefore, a numerical aperture NA of the objective lens 27 at a light source side for the incident light L3 becomes higher than that in the first embodiment, and the diffraction efficiency of the hologram lens 32 is heightened. As a result, the intensity of the first-order diffracted light L5 converged on the second information medium 25 can be increased, as shown in FIG. 14B. Also, because the intensity of the incident light L3 at the peripheral portion of the Gaussian distribution is low and because the diffraction efficiency of the hologram lens 32 is increased toward the inner direction of the grating pattern region 32A, intensity of the transmitted light L4 is distributed in a gently-sloping shape as shown in FIG. 14C. Accordingly, secondary maxima of the transmitted light L4 at the converging spot S3 can be suppressed.

Examples of the utilization of the imaging optical system 31 for various types of optical disks are described.

In cases where the image optical system 31 is utilized for an optical disk device in which pieces of information recorded in a thin type of high density optical disk and a thick type of compact disk are exclusively reproduced, the diffraction efficiency of the hologram lens 32 for the incident light L3 is set in a range from about 20% to 70%. In this case, the intensity of the transmitted light L4 converged on the high density optical disk is almost the same as that of the first-order diffracted light L5 converged on the compact disk. Therefore, the output power of the incident light L3 can be minimized.

Also, in cases where the image optical system 31 is utilized for an optical disk device in which pieces of information recorded in a thin type of high density optical disk are recorded or reproduced and pieces of information recorded in a thick type of optical disk are exclusively reproduced, the diffraction efficiency of the hologram lens 32 for the incident light L3 is set to a value equal to or lower than 30%. In this case, even though a high intensity of transmitted light L4 is required to record a piece of information on the high density optical disk, the recording of the information can be reliably performed without increasing the intensity of the incident light L3 because a transmission efficiency of the hologram lens 32 for the incident light L3 is high. In other words, a utilization efficiency of the incident light L3 can be enhanced when a piece of information is recorded on the high density optical disk, so that the output power of the incident light L3 can be minimized.

Figure 12B:
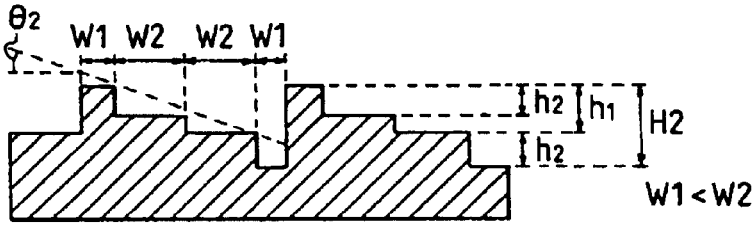
Figure 12C:
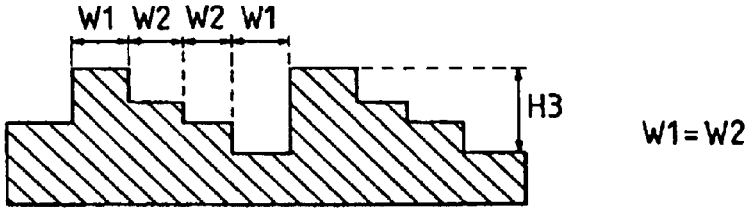

In the second embodiment, the grating pattern P2 positioned in the central portion of the transparent substrate 28 is gradually changed toward the outer direction of the pattern region 32A from the step-wise shape shown in FIG. 12A to the step-wise shape shown in FIG. 12B through the step-wise shape shown in FIG. 12C. However, because the occurrence of unnecessary diffracted light such as minus first-order diffracted light can be effectively prevented in the middle portion of the transparent substrate 28 in which the grating pattern P2 is formed in the step-wise shape shown in FIG. 12C, it is preferred that the middle portion occupy a large part of the pattern region 32A of the hologram lens 32. In this case, the intensity sum of the transmitted light L4 and the first-order diffracted light L5 can be maximized, so that a utilization efficiency of the incident light L3 can be enhanced.

Figure 12D:
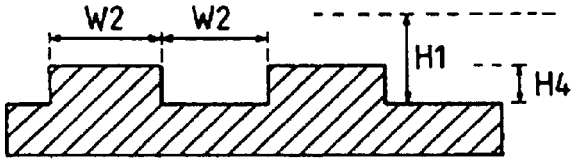
Figure 12E:
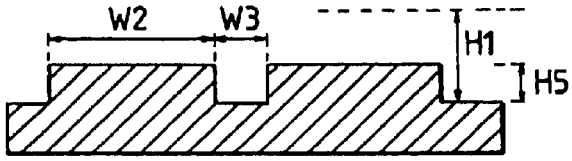

Also, because the first etching width W1 of the grating pattern P2 is gradually decreased toward the outer direction of the pattern region 32A, it is applicable that the grating pattern P2 formed in the step-wise shape shown in FIG. 12B be changed to a step-wise shape shown in FIG. 12D when the first width W1 is decreased to a value lower than about 1 μm. That is, a flight of four stairs shown in FIG. 12B is changed to a flight of two stairs. In this case, the grating pattern P2 formed in the step-wise shape shown in FIG. 12D can be easily made. In addition, in cases where a height H4 of the grating pattern P2 formed in the step-wise shape shown in FIG. 12D is moreover decreased toward the outer direction of the pattern region 32A, it is preferred that the grating pattern P2 be formed in a step-wise shape shown in FIG. 12E. That is, a third etching width W3 is gradually decreased toward the outer direction of the pattern region 32A while decreasing a height H5 of the grating pattern P2. Therefore, the diffraction efficiency of the hologram lens 32 can be gradually decreased toward the outer direction of the pattern region 32A without any manufacturing difficulty of the grating pattern P2.

Figure 15A:
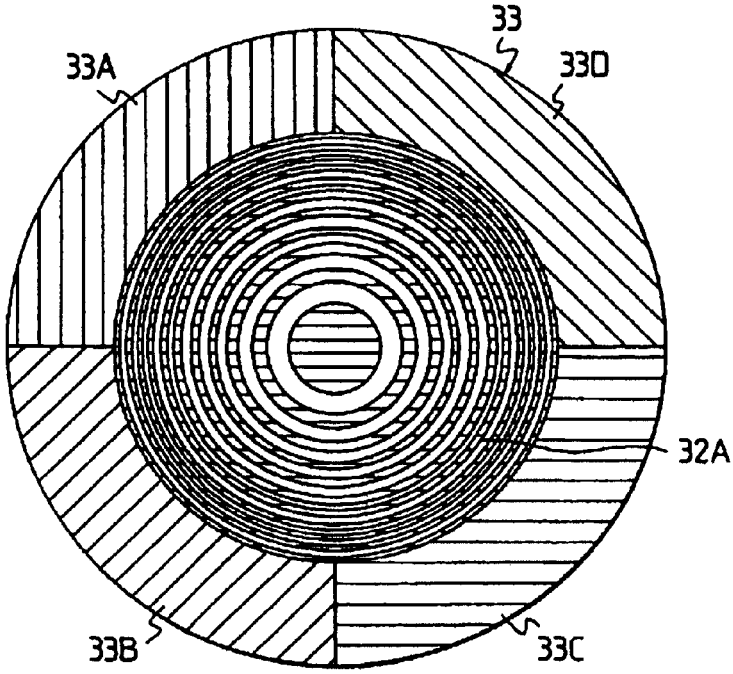
FIG. 15A is a plan view of a hologram lens according to a modification of the second embodiment, a grating pattern of the hologram lens being depicted.

In addition, as shown in FIG. 15A, it is applicable that a hologram lens 33 be formed, in place of the hologram lens 32, by placing the grating pattern P1 of the pattern region 32A in a central portion of the transparent substrate 28 and placing four types of diffraction regions 33A, 33B, 33C and 33D which surround the grating pattern P1. A part of the incident light L3 transmitting through each of the diffraction regions 33A to 33D is diffracted to control a transmission efficiency of the hologram lens 33. In this case, the intensity of the transmitted light L4 at its peripheral portion is decreased, so that secondary maxima occurring in the converging spot S3 can be suppressed. Also, it is applicable that the grating pattern P1 of the hologram be replaced with the grating pattern P2. Also, it is applicable that grating directions of the diffraction regions 33A to 33D differ from each other. In this case, even though the first-order diffracted light L5 diffracted in the diffraction region 33A is, for example, incident on the diffraction region 33c after the diffracted light L5 is reflected by the second information medium 25, the diffracted light L5 again diffracted in the diffraction region 33c does not pass in parallel to the optical axis. Therefore, in cases where a piece of information read from the second information medium 25 is detected in a detector to reproduce the information, the first-order diffracted light L5 diffracted in the diffraction regions 33A to 33D is not detected by the detector as stray light. Accordingly, the reproduction of the information does not deteriorate.

Figure 15B:
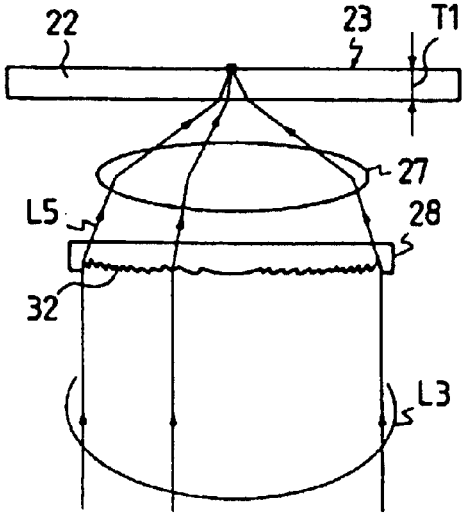
FIGS. 15B, 15C are respectively a constitutional view of an imaging optical system having a compound objective lens according to another modification of the second embodiment.
Figure 15C:
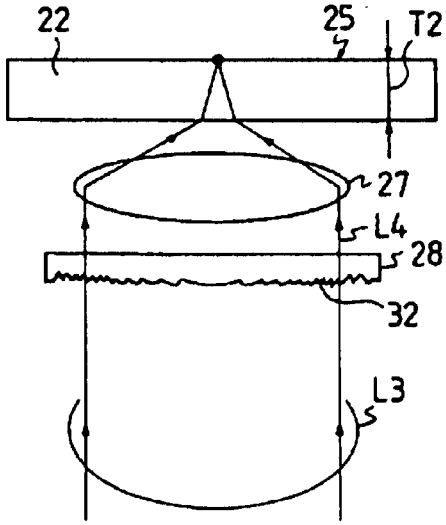

Also, as shown in FIG. 15B, it is applicable that the hologram lens 32 function as a convex lens. In this case, the diffracted light L5 is converged on the first information medium 23, and the transmitted light L4 is converged on the second information medium 25, as shown in FIG. 15C.

(Third Embodiment)

Figure 16A:
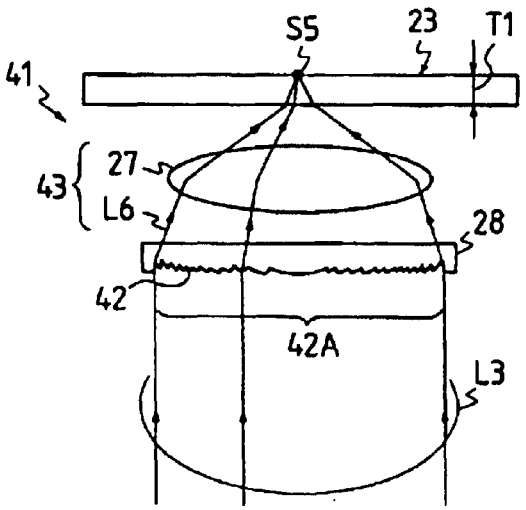
FIG. 16A is a constitutional view of an imaging optical system having a compound objective lens according to a third embodiment of the present invention, a beam of first-order diffracted light being converged on a thin type of information medium.
Figure 16B:
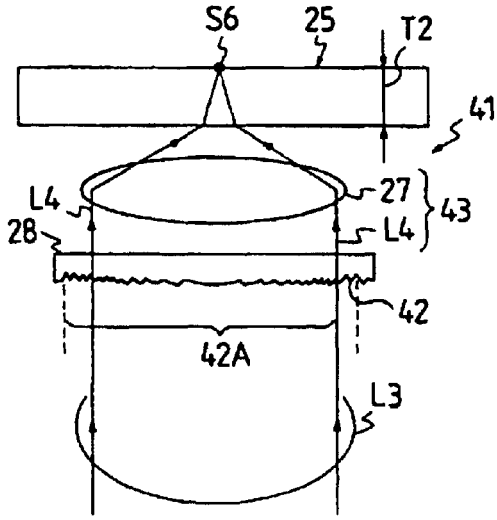
FIG. 16B is a constitutional view of the imaging optical system shown in FIG. 16A, a beam of transmitted light not diffracted being converged on a thick type of information medium.

FIG. 16A is a constitutional view of an imaging optical system having a compound objective lens according to a third embodiment of the present invention, a beam of first-order diffracted light being converged on a thin type of information medium. FIG. 16B is a constitutional view of the imaging optical system shown in FIG. 16A, a beam of transmitted light not diffracted being converged on a thick type of information medium.

As shown in FIGS. 16A, 16B, an imaging optical system 41 for converging light on the first substrate 22 of the first information medium 23 (the thickness T1) or the second substrate 24 of the second information medium 25 (the thickness T2) to form a diffraction-limited converging spot comprises a blazed hologram lens 42 for transmitting a part of incident light L3 without any diffraction to form a beam of transmitted light L4 and diffracting a remaining part of incident light L3 to form a beam of first-order diffracted light L6, and the objective lens 27 for converging the first-order diffracted light L6 on the first information medium 23 or converging the transmitted light L4 on the second information medium 25.

The hologram lens 42 is formed by drawing a grating pattern P3 in a pattern region 42A of the transparent substrate 28 in a concentric circle shape. The pattern region 42A is positioned in a center portion of the transparent substrate 28. An diameter of the grating pattern P3 is equal to or larger than an aperture of the objective lens 27. Also, a diffraction efficiency of the hologram lens 42 for the incident light L3 transmitting through the grating pattern P3 is less than 100% in the same manner as in the first embodiment, so that the intensity of the transmitted light L4 is sufficient to record or reproduce a piece of information on or from the second information medium 25.

Figure 17:
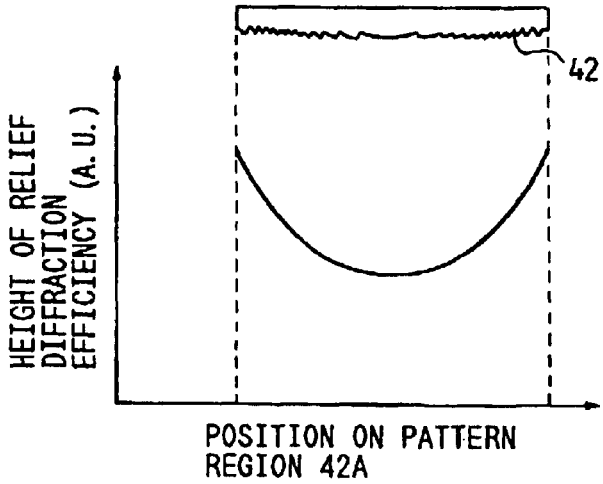
FIG. 17 shows a change of a diffraction efficiency of a hologram lens shown in FIGS. 16A, 16B.

In addition, as shown in FIG. 17, the diffraction efficiency of the hologram lens 42 is high in a peripheral portion of the pattern region 42A, and the diffraction efficiency is gradually decreased toward an inner direction of the pattern region 42A. In other words, in cases where the grating pattern P3 of the hologram lens 42 is formed in relief, the height H of the relief in the grating pattern P3 is gradually lowered toward the inner direction of the pattern region 42A. Or, in cases where an ideal blazed shape of the hologram lens 26 approximates to a step-wise shape, each pitch of the grating pattern P3 positioned in the peripheral portion of the transparent substrate 28 is formed in a step-wise shape shown in FIG. 12A in which the inclined angle $\theta_1$ of stairs is large and the relationship W1>W2 between the first and second etching widths W1, W2 is satisfied, and the grating pattern P3 formed in the step-wise shape shown in FIG. 12A is gradually changed by decreasing the first etching width W1 and increasing the second etching width W2 toward the inner direction of the pattern region 42A while the height H of the grating pattern P3 is gradually decreased. Therefore, each pitch of the grating pattern P3 positioned in a central portion of the transparent substrate 28 is formed in a stepwise shape shown in FIG. 12B in which the inclined angle $\theta_2$ of stairs is small and the relationship W1<W2 is satisfied. Also, each pitch of the grating pattern P3 positioned in a middle portion between the central and peripheral portions is formed in a step-wise shape shown in FIG. 12C in which the etching widths W1, W2 is the same.

In the above configuration of the imaging optical system 41, as shown in FIG. 16B, a part of the incident light L3 transmits through the hologram lens 42 without any diffraction to form a beam of transmitted light L4, and the transmitted light L4 is converged by the objective lens 27. Also, a remaining part of the incident light L3 is diffracted by the hologram lens 42 to form a beam of first-order diffracted light L6. In this case, the hologram lens 42 functions as a convex lens for the incident light L3, so that a first-order diffracted light L6 formed in the hologram lens 42 converges. Thereafter, the diffracted light L6 is converged by the objective lens 27.

In cases where the thin type of first information medium 23 is utilized to record or reproduce pieces of information on or from a front surface of the medium 23, as shown in FIG. 16A, the diffracted light L6 is incident on a rear surface of the first information medium 23 and is focused on its front surface to form a diffraction-limited converging spot S5 on the first information medium 23. In contrast, in cases where the thick type of second information medium 25 is utilized to record or reproduce pieces of information on or from a front surface of the medium 25, the transmitted light L4 is incident on a rear surface of the second information medium 25 and is focused on its front surface to form a diffraction-limited converging spot S6 on the second information medium 25.

In this case, because the hologram lens 42 functions as a convex lens to converge the diffracted light L6, the diffraction-limited converging spots S5, S6 are formed even though the thickness T1 of the first information medium 23 differs from the thickness T2 of the second information medium 25. Therefore, a compound objective lens 43 composed of the hologram lens 42 and the objective lens 27 has substantially two focal points.

Also, because the hologram lens 42 functions as a convex lens for the diffracted light L6, the diffracted light L6 transmits through the objective lens 27 on condition that the numerical aperture NA of the objective lens 27 is substantially high.

In addition, because the diffraction efficiency in the peripheral portion of the grating pattern P3 is high and because the diffraction efficiency is gradually decreased toward the inner direction of the grating pattern P3, a diffraction probability of the incident light L3 is higher in the peripheral portion of the grating pattern P3.

The grating pattern P3 of the hologram lens 42 is designed to correct any aberration occurring in the objective lens 27 and the first information medium 23, so that the diffracted light L6 transmits through the first information medium 23 having the thickness T1 and is converged on the medium 23 to form the diffraction-limited converging spot S5 without any aberration. A method for designing the hologram lens 42 having an aberration correcting function is described.

After the diffracted light L6 is converged on the first information medium 23, spherical waves diverge from the converging spot S5 and transmit through the first substrate 22 and the objective lens 27. Thereafter, the spherical waves transmit through the transparent substrate 28 and optically interfere with the incident light L3. Therefore, an interference pattern is formed by the interference between the spherical waves and the incident light L3. The interference pattern can be calculated by adding the phase of the spherical waves to an inverted phase obtained by inverting the phase of the incident light L3. Accordingly, the grating pattern P3 of the hologram lens 42 which agrees with the interference pattern calculated can be easily formed according to a computer generated hologram technique.

Accordingly, because the hologram lens 42 functions as a convex lens for the first-order diffracted light L6, a curvature of the objective lens 27 can be lowered. Also, a glass material having a high refractive index is not required to produce the objective lens 27.

Also, because the first-order diffracted light L6 formed in the hologram lens 42 converges before the diffracted light L6 is incident on the objective lens 27, the distance in an optical axis direction between the converging spots S5, S6 can be lengthened to about 1 mm. Therefore, even though the transmitted light L4 (or the first-order diffracted light L6) is converged on the converging spot S6 (or S5) in focus to record or read a piece of information, the light L6 (or L4) is not converged on the converging spot S6 (or S5) in focus to reduce the intensity of the light L6 (or L4) at the converging spot S6 (or S5). Accordingly, no adverse influence is exerted on the recording or reproduction of the information Also, because the hologram lens 42 functions as a convex lens for the first-order diffracted light L6, the occurrence of a chromatic aberration can be prevented in the imaging optical system 41. In detail, the focal length of the hologram lens 42 is shortened as the wavelength of the incident light L3 becomes longer. In contrast, the focal length of the objective lens 27 is lengthened as the wavelength of the incident light L3 becomes longer. That is, the dependence of the focal length on the wavelength in the objective lens 27 is opposite to that of the focal length on the wavelength in the hologram lens 42. Therefore, the compound objective lens 43 having an achromatic function can be formed by the combination of the lenses 27, 42, and the occurrence of the chromatic aberration can be prevented.

Also, because the hologram lens 42 is a plane type of element, a lightweight type of compound objective lens can be made in large scale manufacture.

Also, because the diffraction efficiency of the hologram lens 42 is gradually decreased toward an inner direction of the pattern region 42A, the numerical aperture of the objective lens 27 for the first-order diffracted light L6 becomes substantially enlarged. Therefore, the intensity of the first-order diffracted light L6 can be enlarged to record or reproduce a piece of information on or from the first information medium 23.

Also, in cases where the incident light L3 is radiated from a semiconductor laser, a far field pattern of the incident light L3 is distributed in a Gaussian distribution as shown in FIG. 13A. Therefore, because the diffraction efficiency of the hologram lens 42 is gradually decreased toward the inner direction of the grating pattern P2, a far field pattern of the first-order diffracted light L6 is distributed in a gently-sloping shape. Accordingly, secondary maxima of the first-order diffracted light L6 converged on the converging spot S5 can be moreover suppressed in the third embodiment as compared with in the first embodiment. That is, the recording and reproducing of the information can be performed without any deterioration of the information by utilizing the imaging optical system 41.

Figure 18A:
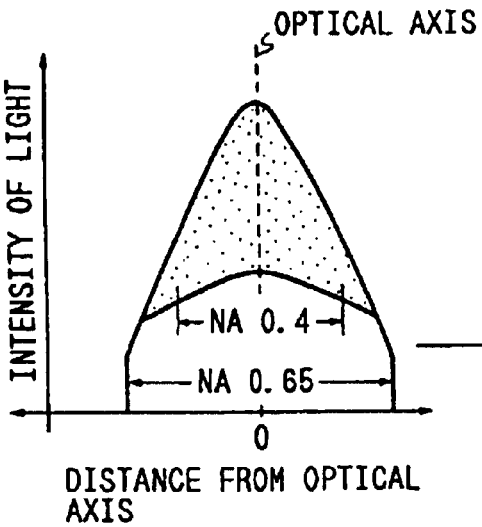
FIGS. 18A to 18C show intensity distributions of transmitted light and diffracted light transmitting through a hologram lens shown in FIGS. 16A, 16B.
Figure 18B:
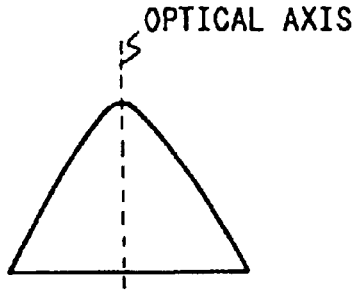
Figure 18C:
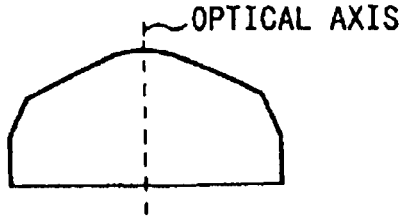

In addition, in cases where the transmitted light L4 is converged on the second information medium 25 to form the diffraction-limited converging spot S6, a numerical aperture of the objective lens 27 for the transmitted light L4 is low because the diffraction efficiency of the hologram lens 42 is increased toward an outer direction of the grating pattern 42A. As a result, the intensity of the transmitted light L4 becomes lowered. In cases where a transmission efficiency of the hologram lens 42 is heightened to increase the intensity of the transmitted light L4, the intensity of the first-order diffracted light L6 at its inner beam portion is largely decreased, and secondary maxima (or side lobes) of the first-order diffracted light L6 at the converging spot S6 is undesirably increased. Therefore, the incident light L3 of which the far field pattern is distributed in the Gaussian distribution is radiated to the hologram lens 42 to increase the intensity of the transmitted light L4 without any increase of the second maxima. In detail, as shown in FIG. 18A, the incident light L3 distributed in not only a central portion of the Gaussian distribution but also a peripheral portion of the Gaussian distribution transmits through the hologram lens 42 and is refracted by the objective lens 27 because the diameter of the grating pattern P3 is equal to or larger than the aperture of the objective lens 27. Therefore, a numerical aperture NA of the objective lens 27 at a light source side for the incident light L3 becomes higher than that in the first embodiment, and a transmission efficiency of the hologram lens 42 is heightened. As a result, the intensity of the transmitted light L4 converged on the second information medium 25 can be increased, as shown in FIG. 18B. Also, because the intensity of the incident light L3 at the peripheral portion of the Gaussian distribution is low and because the diffraction efficiency of the hologram lens 42 is decreased toward the inner direction of the grating pattern 42A, the first-order diffracted light L6 is distributed in a gently-sloping shape as shown in FIG. 18C. Accordingly, secondary maxima of the first-order diffracted light L6 at the converging spot S5 can be suppressed.

Examples of the utilization of the imaging optical system 41 for various types of optical disks are described.

In cases where the image optical system 41 is utilized for an optical disk device in which pieces of information recorded in a thin type of high density optical disk and a thick type of compact disk are exclusively reproduced. the diffraction efficiency of the hologram lens 42 for the incident light L3 is set in a range from about 20% to 70%. In this case, the intensity of the transmitted light L4 converged on the compact disk is almost the same as that of the first-order diffracted light L6 converged on the high density optical disk. Therefore, the output power of the incident light L3 can be minimized.

Also, in cases where the image optical system 41 is utilized for an optical disk device in which pieces of information recorded in a thin type of high density optical disk are recorded or reproduced and pieces of information recorded in a thick type of optical disk are exclusively reproduced, the diffraction efficiency of the hologram lens 42 for the incident light L3 is set to a value equal to or higher than 55%. In this case, even though a high intensity of the first-order diffracted light L6 is required to record a piece of information on the high density optical disk, the recording of the information can be reliably performed without increasing the intensity of the incident light L3 because the diffraction efficiency of the hologram lens 42 for changing the incident light L3 to the first-order diffracted light L6 is high. In other words, a utilization efficiency of the incident light L3 can be enhanced when a piece of information is recorded on the high density optical disk, so that the output power of the incident light L3 can be minimized. Also, because the diffraction efficiency of the hologram lens 42 is gradually decreased toward an inner direction of the pattern region 42A, the numerical aperture of the objective lens 27 for the first-order diffracted light L6 becomes substantially enlarged. Therefore, the intensity of the first-order diffracted light L6 can be enlarged to record or reproduce a piece of information on or from the high density optical disk.

In the third embodiment, the grating pattern P3 positioned in the pattern region 42A of the transparent substrate 28 is gradually changed toward the outer direction of the pattern region 42A from the step-wise shape shown in FIG. 12B to the step-wise shape shown in FIG. 12A through the step-wise shape shown in FIG. 12C while increasing the height H of the grating pattern P3. However, because the occurrence of unnecessary diffracted light such as minus first-order diffracted light can be effectively prevented in the middle portion of the transparent substrate 28 in which the grating pattern P3 is formed in the step-wise shape shown in FIG. 12C, it is preferred that the middle portion occupy a large part of the pattern region 42A of the hologram lens 42. In this case, the intensity sum of the transmitted light L4 and the first-order diffracted light L6 can be maximized, so that a utilization efficiency of the incident light L3 can be enhanced.

Also, because the first etching width W1 of the grating pattern P3 is gradually decreased toward the inner direction of the pattern region 42A, it is applicable that the grating pattern P3 formed in the step-wise shape shown in FIG. 12B be changed to a step-wise shape shown in FIG. 12D when the first width W1 is decreased to a value lower than about 1 μm. In this case, the grating pattern P3 formed in the step-wise shape shown in FIG. 12D can be easily made. In addition, in cases where a height H4 of the grating pattern P3 formed in the step-wise shape shown in FIG. 12D is moreover decreased toward the inner direction of the pattern region 42A, it is preferred that the grating pattern P3 be formed in a step-wise shape shown in FIG. 12E. In this case, a third etching width W3 is gradually decreased toward the inner direction of the pattern region 42A while decreasing a height H5 of the grating pattern P3. Therefore, the diffraction efficiency of the hologram lens 42 can be gradually decreased toward the inner direction of the pattern region 42A without any manufacturing difficulty of the grating pattern P3.

In the first to third embodiments of the image optical systems 21, 31 and 41, the grating patterns P1, P2 and P3 of the hologram lenses 26, 32 and 42 are respectively formed on a front side of the transparent substrate 28 not facing the objective lens 27. Therefore, a beam of light reflected at the front side of the transparent substrate 28 does not adversely influence as stray light on the recording or reproduction of the information. In detail, because the reflected light is diffracted by the hologram lens, the reflected light is scattered. Also, even though the first-order diffracted light L5 or L6 is reflected at a reverse side of the transparent substrate 28, the diffracted light reflected is again diffracted by the hologram lens and is scattered. Therefore, the light reflected at the front or reverse side of the hologram lens does not adversely influence on the recording or reproduction of the information.

However, in cases where an anti-reflection film is coated on a front side of the hologram lens 28 at which the grating pattern is not formed, it is applicable that the grating patterns P1, P2 and P3 of the hologram lenses 26, 32 and 42 be respectively formed on a reverse side of the transparent substrate 28 facing the objective lens 27. In this case, because the first-order diffraction light L5, L6 is not refracted at the front side of the hologram lens 28, the design of the image optical systems 21, 31 and 41 can be simplified.

Also, in the first to third embodiments, the grating patterns P1, P2 and P3 of the hologram lenses 26, 32 and 42 are respectively formed in relief to produce a phase modulation type of hologram lens. However, as is described in Provisional Publication No. 189504/86 (S61-189504) and Provisional Publication No. 241735/88 (S63-241735), the phase modulation type of hologram lens can be produced by utilizing a liquid crystal cell. Also, the phase modulation type of hologram lens can be produced by utilizing a birefringece material such as lithium niobate. For example, the phase modulation type of hologram lens can be produced by proton-exchanging a surface part of a lithium niobate substrate.

(Fourth Embodiment)

Figure 19A:
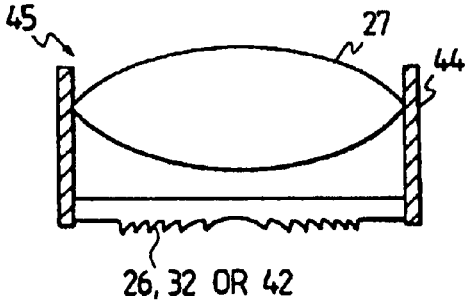
FIG. 19A is a cross sectional view of a compound objective lens according to a fourth embodiment of the present invention.
Figure 19B:
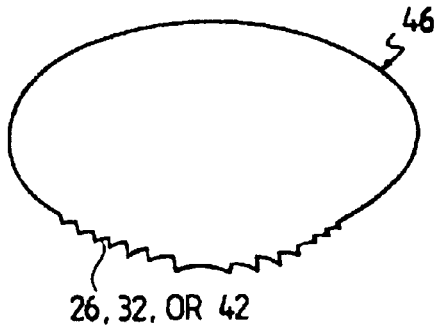
FIG. 19B is a cross sectional view of a compound objective lens according to a modification of the fourth embodiment of the present invention.

Also, in the first to third embodiments, the compound objective lens 29, 34 or 43 having two focal points is composed of the objective lens 27 and the hologram lens 26, 32 or 42. However, as a compound objective lens according to a fourth embodiment is shown in FIG. 19A, it is preferred that each of the hologram lenses 26, 32 and 42 and the objective lens 27 be unified with a packaging means 44 to form a compound objective lens 45 in which a relative position between each of the hologram lenses 26, 32 and 42 and the objective lens 27 is fixed. In this case, the transmitted light L4 and the first-order diffracted light L5, L6 can be easily converged on the first or second information medium 23, 25 by adjusting the position of the packing means 44 with an actuator. Also, as another compound objective lens according to a modified fourth embodiment is shown in FIG. 19B, it is preferred that each of the grating patterns P1, P2 and P3 be directly drawn on a curved side of the objective lens 27 facing a light source side to form a compound objective lens 46 in which each of the hologram lenses 26, 32 and 42 is integrally formed with the objective lens 27.

Accordingly, the central axis of the objective lens 27 can always agree with that of each of the hologram lenses 26, 32 and 42, so that abaxial aberrations of each of the hologram lenses 26, 32 and 42 such as a coma aberration and an astigmatic aberration occurring in the first-order diffracted light can be prevented in the fourth embodiment. Also, because the hologram lens 26, 32 or 42 is placed on a lens surface of the objective lens 27 of which a curvature is higher than those of other lens surfaces of the objective lens 27, a sine condition for the hologram lens treated as a lens can be easily satisfied. Therefore, the degree of aberrations resulting from a constitutional error of an optical head apparatus can be sufficiently reduced.

(Fifth Embodiment)

Figure 20:
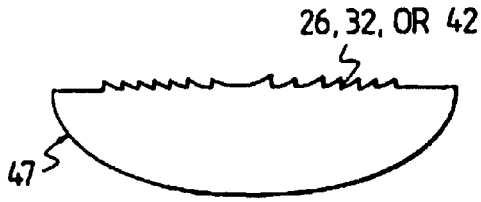
FIG. 20 is a cross sectional view of a compound objective lens according to a fifth embodiment of the present invention.

Also, as a compound objective lens according to a fifth embodiment is shown in FIG. 20, it is preferred that each of the grating patterns P1, P2 and P3 be directly drawn on a side of the objective lens 27 facing the information medium 23 or 25 to form a compound objective lens 47 in which each of the hologram lenses 26, 32 and 42 is integrally formed with the objective lens 27. In this case, a curvature at the side of the objective lens 27 can be small or in a plane shape. Therefore, each of the grating patterns P1, P2 and P3 can be made at a low cost. Also, in cases where an aberration is caused by tilting the hologram lens from the optical axis, the aberration can be prevented by fixing the hologram lens and a light source of the incident light L3 on the same base.

(Sixth Embodiment)

An optical head apparatus with one of the compound objective lenses 29, 29M, 34, 43, 45, 46 and 47 shown in the first to fifth embodiments is described with reference to FIGS. 21 to 26 according to a sixth embodiment of the present invention. X, Y and Z co-ordinates shown in FIGS. 21 to 26 are utilized in common.

Figure 21:
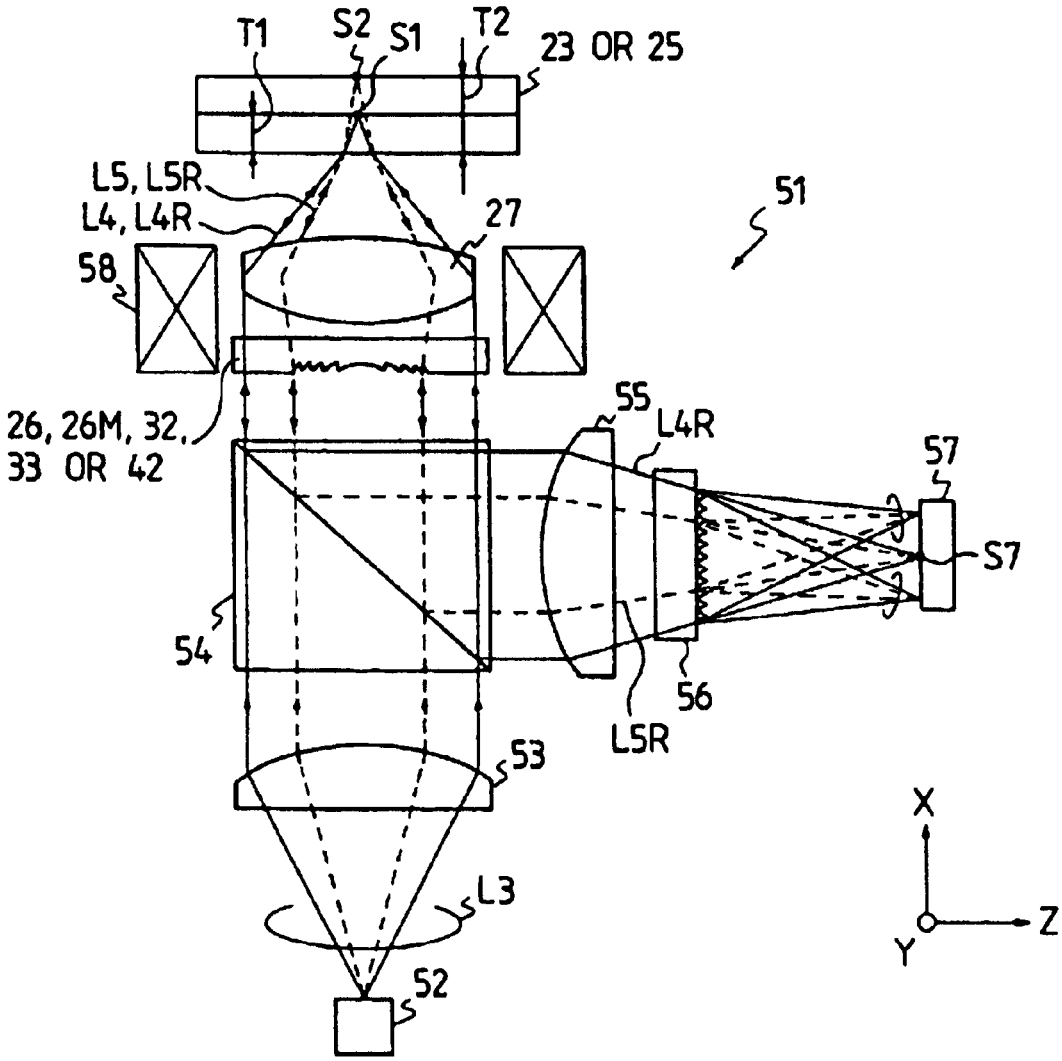
FIG. 21 is a constitutional view of an optical head apparatus according to a sixth embodiment of the present invention.

FIG. 21 is a constitutional view of an optical head apparatus according to a sixth embodiment.

As shown in FIG. 21, an optical head apparatus 51 for recording or reproducing pieces of information on or from the information medium 23 or 25, comprises a light source 52 such as a semiconductor laser for radiating the incident light L3, a collimator lens 53 for collimating the incident light L3, a beam splitter 54 for transmitting the incident light L3 on an outgoing optical path and reflecting a beam of transmitted light L4 R formed by reflecting the transmitted light L4 on the information medium 23 or 25 or a beam of diffracted light L5R (or L6R) formed by reflecting the diffracted light L5 (or L6) on the information medium 23 or 25 on an incoming optical path, the compound objective lens 29 (or 29M, 34, 43, 45, 46 or 47) composed of the hologram lens 26 (or 26M, 32, 33 or 42) and the objective lens 27, a converging lens 55 for converging the transmitted light L4R or the diffracted light L5R reflected by the beam splitter 54, a wavefront changing device 56 such as a hologram for changing a wavefront of the transmitted light L4R or the diffracted light L5R to form a plurality of converging spots of the transmitted light L4R or the diffracted light L5R, a photo detector 57 for detecting intensities of the converging spots of the transmitted light L4R or the diffracted light L5R of which the wavefront is changed by the wavefront changing device 56 to obtain an information signal recorded on the information medium 23 or 25 and servo signals such as a focus error signal and a tracking error signal, and an actuating unit 58 for moving the compound objective lens composed of the hologram lens 26 and the objective lens 27 according to the servo signals.

In the above configuration, a beam of incident light L3 radiated from the light source 52 is collimated in the collimator lens 53 and transmits through the beam splitter 54. Thereafter, a part of the incident light L3 transmits through the compound objective lens 29 without any diffraction, and a remaining part of the incident light L3 is diffracted.

Thereafter, in cases where a piece of information is recorded or reproduced on or from the first information medium 23, the transmitted light L4 is converged on the first information medium 23 to form the first converging spot S1. That is, the transmitted light L4 is incident on a rear surface of the first information medium 23, and the first converging spot S1 is formed on a front surface of the first information medium 23. Thereafter, a beam of transmitted light L4R reflected at the front surface of the first information medium 23 passes through the same optical path in the reverse direction. That is, a part of the transmitted light L4R again transmits through the compound objective lens 29 without any diffraction and is reflected by the beam splitter 54. In this case, the transmitted light L4R is collimated. Thereafter, the transmitted light L4R is converged by the converging lens 55, and the wavefront of a large part of the transmitted light L4R is changed to form a plurality of converging spots on the photo detector 57. Thereafter, the intensities of the converging spots of the transmitted light L4R are detected in the photo detector 57. Therefore, an information signal and servo signals such as a focus error signal and a tracking error signal are obtained. The actuating unit 58 are operated according to the servo signals to move the compound objective lens 29 at high speed, so that the transmitted light L4 is converged on the first information medium 23 in focus.

Also, in cases where a piece of information is recorded or reproduced on or from the second information medium 25, the diffracted light L5 is converged on the second information medium 25 to form the second converging spot S2. That is, the diffracted light L5 is incident on a rear surface of the second information medium 25, and the second converging spot S2 is formed on a front surface of the second information medium 25. Thereafter, a beam of diffracted light L5R reflected at the front surface of the second information medium 25 passes through the same optical path in the reverse direction. That is, a part of the diffracted light L5R is again diffracted by the hologram lens 26 and is reflected by the beam splitter 54. In this case, the diffracted light L5R is collimated. Thereafter, the diffracted light L5R is converged by the converging lens 55, and the wavefront of a large part of the diffracted light L5R is changed to form a plurality of converging spots on the photo detector 57. In this case, the diffracted light L5R incident on the converging lens 55 is collimated in the same manner as the transmitted light L4R incident on the converging lens 55, the converging spots of the diffracted light L5R are formed at the same positions as those of the transmitted light L4R. Thereafter, the intensities of the converging spots of the diffracted light L5R are detected in the photo detector 57. Therefore, an information signal and servo signals such as a focus error signal and a tracking error signal are obtained. The actuating unit 58 are operated according to the servo signals to move the compound objective lens 29 at high speed, so that the diffracted light L5 is converged on the second information medium 25 in focus.

In this case, because the transmitted light L4R again transmits through the compound objective lens without any diffraction and the diffracted light L5R is again diffracted by the hologram lens 26, the outgoing optical path agrees with the incoming optical path in a range between the information medium 23 or 25 and the beam splitter 54 even though the converging spot S1 differs from the converging spot S2. Therefore, a converging spot S7 on the photo detector 57 at which the light L4R or L5R not diffracted by the wavefront changing device 56 is converged relates to a radiation point of the light source 52 in a mirror image, so that the light L4R and L5R not diffracted by the wavefront changing device 56 are converged at the same converging point S7. In the same manner, the light L4R and L5R diffracted by the wavefront changing device 56 are converged at the same other converging points.

Accordingly, even though the compound objective lens has two focal points, the wavefront changing unit 56 and the photo detector 57 required to detect the intensity of the transmitted light L4R can be utilized to detect the intensity of the diffracted light L5R. Therefore, the number of parts required to manufacture the optical head apparatus 51 can be reduced, and a small sized optical head apparatus can be manufactured at a low cost and in light weight even though pieces of information are recorded or reproduced on or from an information medium by utilizing the optical head apparatus 51 regardless of whether the information medium is thick or thin.

In cases where the hologram lens 26 (or 32, 33, 42) is integrally formed with the objective lens 27 as shown in FIG. 19A, 19B or 20, each of the compound objective lenses 45, 46 and 47 can be manufactured in light weight because the hologram lens 26 (or 32, 33, 42) is a plane type of optical device. For example, the hologram lens 26 (or 32, 33, 42) is less than several tens mg in weight. Therefore, the hologram lens 26 integrally formed with the objective lens 27 can be easily moved by the actuating unit 58.

Figure 22:
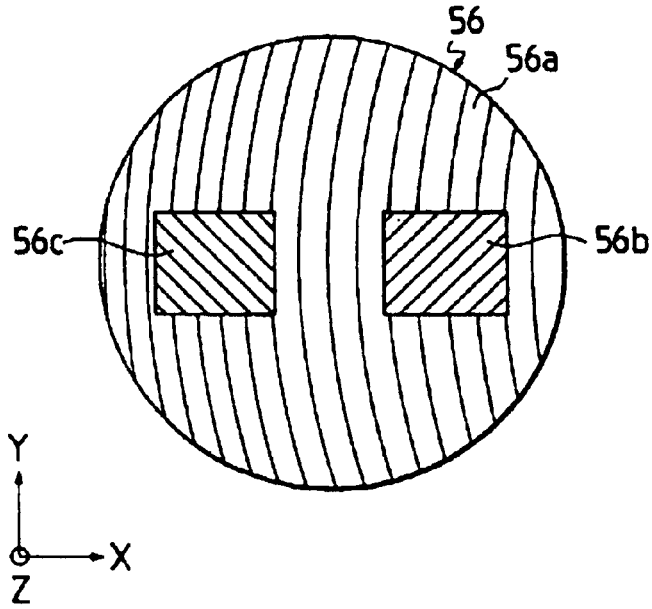
FIG. 22 is a plan view of a wavefront changing device utilized in the six, ninth and twelfth embodiments, a grating pattern of a hologram lens utilized as the wavefront changing device being depicted.
Figure 23:
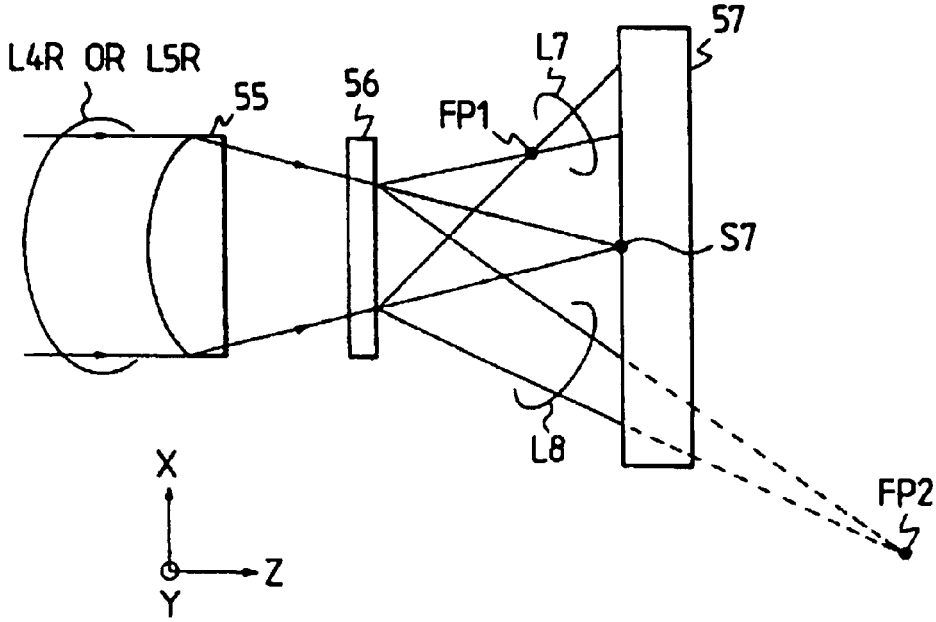
FIG. 23 shows a positional relation between focal points of diffracted light occurring in the wavefront changing device shown in FIG. 22 and a photo detector.

Next, a detecting method of the servo signals is described. FIG. 22 is a plan view of the wavefront changing unit 56. FIG. 23 is an enlarged view of first-order diffracted light and transmitted light detected in the photo detector 57. As shown in FIG. 22, the wavefront changing unit 56 is partitioned into as diffracted light generating region 56a in which a grating pattern P4 is drawn and a pair of diffracted light generating regions 55b, 56c in which a pair of grating patterns P5, P6 are drawn. The light L4R or L5R incident on the diffracted light generating region 56a is diffracted to obtain a focus error signal. The light L4R or L5R incident on each of the diffracted light generating regions 56b, 56c is diffracted to obtain a tracking error signal.

Initially, a spot size detection method utilized to detect a focus error signal is described as an example of a detecting method of a focus error signal. The method is proposed in Japanese Patent Application No. 185722 of 1990. In short, in cases where the method is adopted, an allowable assembly error in an optical head apparatus can be remarkably enlarged, and the servo signal such as a focus error signal can be stably obtained to adjust the position of the compound objective lens even though the wavelength of the incident light L3 varies.

In detail, as shown in FIG. 23, the grating pattern P4 is designed to change the transmitted light L4R (or the diffracted light L5R) transmitting through the diffracted light generating region 56a of the wavefront changing unit 56 to a beam of first-order diffracted light L7 and a beam of minus first-order diffracted light L8. The diffracted light L7, L8 are expressed by two types of spherical waves having different curvatures. That is, interference fringes are produced by actually interfering a spherical wave having a focal point FP1 in the front of the photo detector 57 with another spherical wave diverging from the converging spot S7 according to a two-beam interferometric process, so that the grating pattern P4 agreeing with the interference fringes is formed. In other case, the interference fringes are calculated according to a computer generated hologram method. As a result, the transmitted light L4R (or the diffracted light L5R) transmitting through the diffracted light generating region 56a of the wavefront changing unit 56 is diffracted and changed to beams of conjugate diffracted light such as a beam of first-order diffracted light L7 and a beam of minus first-order diffracted light L8. The beam of first-order diffracted light L7 has the focal point FP1 at the front surface of the photo detector 57, and the beam of minus first-order diffracted light L8 has a focal point FP2 in the rear of the photo detector 57.

Figure 24:
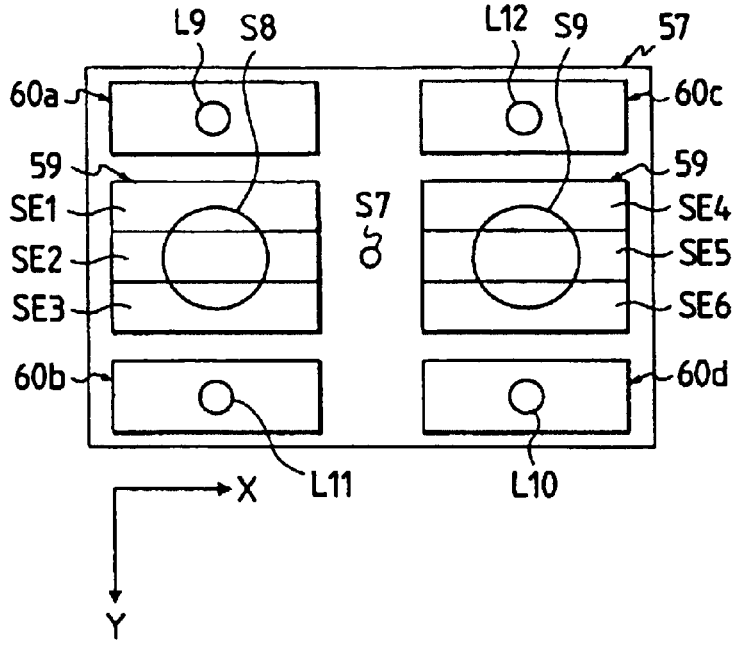
FIG. 24 is a plan view of a photo detector utilized in the six, ninth, tenth, twelfth, thirteenth and seventeenth embodiments.

As shown in FIG. 24, the photo detector 57 comprises a sextant photo-detector 59 (or a six-division photo detector) in which six detecting sections SE1, SE2, SE3, SE4, SE5 and SE6 are provided. The intensity of the first-order diffracted light L7 is detected by each of the detecting sections SE1, SE2 and SE3 of the sextant photo-detector 59 and is changed to electric current signals SC1, SC2 and SC3. Also, the intensity of the minus first-order diffracted light L8 is detected by each of the detecting sections SE4, SE5 and SE6 of the sextant photo-detector 59 and is changed to electric current signals SC4, SC5 and SC6.

Figure 25A:
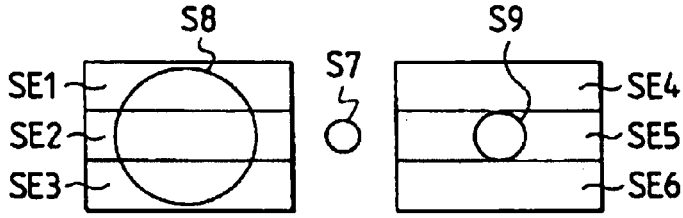
FIG. 25A and 25C respectively show a converging spot of first-order diffracted light radiated to detecting sections SE1, SE2 and SE3 of a sextant photo-detector shown in FIG. 24 and another converging spot of minus first-order diffracted light radiated to detecting sections SE4, SE5 and SE6 of the sextant photo-detector on condition that an objective lens shown in FIG. 21 is defocused on an information medium.
Figure 25B:
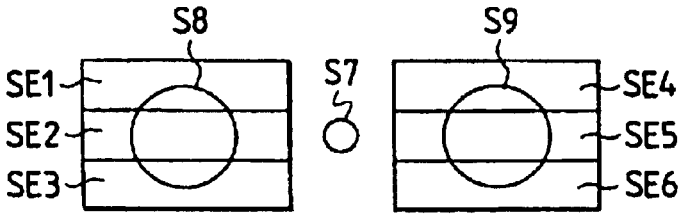
FIG. 25B shows a converging spot of first-order diffracted light radiated to the detecting sections SE1, SE2 and SE3 of the sextant photo-detector and another converging spot of minus first-order diffracted light radiated to the detecting sections SE4, SE5 and SE6 of the sextant photo-detector on condition that the objective lens is just focused on the information medium.
Figure 25C:
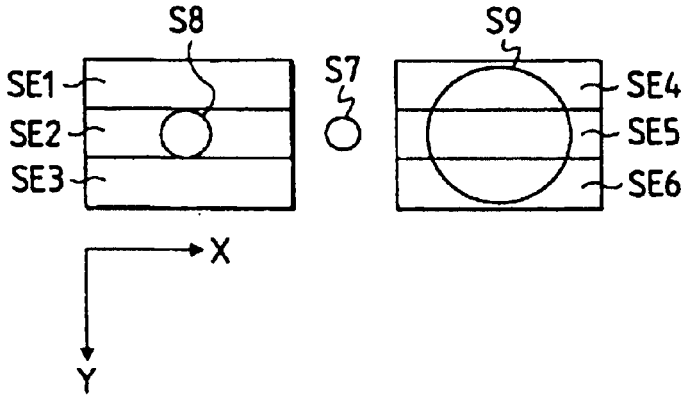

FIG. 25A and 25C respectively show a converging spot of the first-order diffracted light L7 radiated to the detecting sections SE1, SE2 and SE3 of the sextant photo-detector 59 and another converging spot of the minus first-order diffracted light L8 radiated to the detecting sections SE4, SE5 and SE6 of the sextant photo-detector 59 on condition that the objective lens 27 is defocused on the information medium 23 or 25. FIG. 25B shows a converging spot of the first-order diffracted light L7 radiated to the detecting sections SE1,' SE2 and SE3 of the sextant photo-detector 59 and another converging spot of the minus first-order diffracted light L8 radiated to the detecting sections SE4, SE5 and SE6 of the sextant photo-detector 59 on condition that the objective lens 27 is just focused on the information medium 23 or 25.

As shown in FIGS. 25A to 25C, in cases where the transmitted light L4 (or the diffracted light L5) is converged on the information medium 23 (or 25) on condition that the objective lens 27 is defocused on the information medium 23 (or 25), a converging spot S8 of the diffracted light L7 shown at the left side of FIGS. 25A, 25C is formed on the sextant photo-detector 59, and another converging spot S9 of the diffracted light L8 shown at the right side of FIG. 25A or 25C is formed on the sextant photo-detector 59. In contrast, in cases where the transmitted light L4 (or the diffracted light L5) is converged on the information medium 23 (or 25) on condition that the objective lens 27 is just focused on the information medium 23 (or 25), a converging spot S8 of the diffracted light L7 shown at the left side of FIG. 25B is formed on the sextant photo-detector 59, and another converging spot S9 of the diffracted light L8 shown at the right side of FIG. 25B is formed on the sextant photo-detector 59. The intensity of the diffracted light L7 is detected in each of the detecting sections SE1, SE2 and SE3 of the sextant photo-detector 59 and is changed to electric current signals SC1, SC2, SC3. Also, the intensity of the diffracted light L8 is detected in the detecting sections SE4, SE5 and SE6 of the sextant photo-detector 59 and is changed to electric current signals SC4, SC5 and SC6. Thereafter, a focus error signal $S_{f\theta}$. is obtained according to the spot size detection method by calculating an equation (5).

$$S_{f\theta}=(SC1+SC3-SC2)-(SC4+SC6-SC5) \quad (5)$$

Thereafter, the position of the compound objective lens is moved in a direction along an optical axis at high speed so as to minimize the absolute value of the focus error signal $S_{f\theta}$.

In the spot size detection method, the diffracted light L7, L8 are expressed by two types of spherical waves having different curvatures to detect the focus error signal $S_{f\theta}$. However, two beams of diffracted light L7, L8 radiated to the photo detector 57 are not limited to the spherical waves. That is, because the change of the diffracted light L7, L8 in a Y-direction is detected by the photo detector 57 according to the spot size detection method, it is required that a one-dimensional focal point of the diffracted light L7 is positioned in the front of the photo detector 57 and a one-dimensional focal point of the diffracted light L8 is positioned in the rear of the photo detector 57. Therefore, it is applicable that diffracted light including astigmatic aberration be radiated to the photo detector 57.

In addition, an information signal $S_{in}$ is obtained by adding all of the electric current signals according to an equation (6).

$$S_{in}=SC1+SC2+SC3+SC4+SC5+SC6 \quad (6)$$

Because the information medium 23 or 25 is rotated at high speed, a patterned track pit radiated by the converging spots S8, S9 of the diffracted light L7,L8 is rapidly changed one after another, so that the intensity of the information signal $S_{in}$ is changed. Therefore, the information stored in the information medium 23 or 25 can be reproduced according to the information signal $S_{in}$.

Next, the detection of a tracking error signal depending on a relative position between a converging spot and a patterned track pit on the information medium 23 or 25 is described.

The grating pattern P5 drawn in the diffracted light generating region 56b shown in FIG. 22 is designed to change the transmitted light LR (or the diffracted light L5R) transmitting through the diffracted light generating region 56b of the wavefront changing unit 56 to a beam of first-order diffracted light L9 and a beam of minus first-order diffracted light L10. Also, the grating pattern P6 drawn in the diffracted light generating region 56c shown in FIG. 22 is designed to change the transmitted light L4R (or the diffracted light L5R) transmitting through the diffracted light generating region 56c of the wavefront changing unit 56 to a beam of first-order diffracted light L11 and a beam of minus first-order diffracted light L12.

Figure 26:
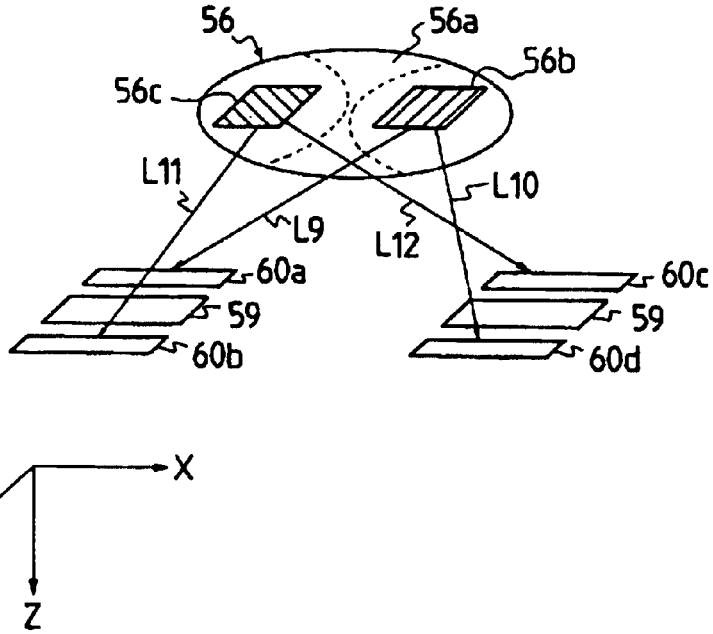
FIG. 26 shows a relationship between beams of diffracted light occurring in the wavefront changing device shown in FIG. 22 and the photo detector shown in FIG. 24.

As shown in FIG. 24, the photo detector 57 further comprises four tracking photo-detectors 60a to 60d for detecting intensities of the diffracted light L9 to L12. As shown in FIG. 26, the intensity of the diffracted light L9 is detected by the tracking photo-detector 60a and is changed to an electric current signal SC7, the intensity of the diffracted light L10 is detected by the tracking photo-detector 60d and is changed to an electric current signal SC10, the intensity of the diffracted light L11 is detected by the tracking photo-detector 60b and is changed to an electric current signal SC8, and the intensity of the diffracted light L12 is detected by the tracking photo-detector 60c and is changed to an electric current signal SC 9. A tracking error signal $S_{t\theta}$ is calculated according to an equation (7).

$$S_{t\theta}=SC7-SC8-SC9+SC10 \quad (10)$$

Therefore, the asymmetry of the intensity distribution of the transmitted light L4R (or the diffracted light L5R) incident on the wavefront changing unit 56, which changes in dependence on the positional relation between the converging spot S1 (or S2) and a patterned track pit radiated by the light L4 or L5, is expressed by the tracking error signal $S_{t\theta}$.

Thereafter, the objective lens 27 is moved in a radial direction so as to reduce a tracking error indicated by the tracking error signal $S_{t\theta}$. The radial direction is defined as a direction perpendicular to both the optical axis and a series of patterned track pits. Therefore, the converging spot S1 (or S2) of the transmitted light L4 (or the diffracted light L5) on the information medium 23 (or 25) can be formed in the middle of the patterned track pit, so that the tracking error becomes zero.

Accordingly, focus and tracking servo characteristics can be stably obtained in the optical head apparatus 51. That is, because the wavefront changing unit 56 has a wavefront changing function, a focus error signal can be easily obtained. Also, because the diffracted light generating regions 56b, 56c are provided in the wavefront changing unit 56, a tracking error signal can be easily obtained. Therefore, the number of parts required to manufacture the optical head apparatus 51 can be reduced, and the number of manufacturing steps can be reduced. In addition, the optical head apparatus can be manufactured at a low cost and in light weight.

Also, because the compound objective lens having two focal points is utilized in the optical head apparatus 51, pieces of information can be reliably recorded or reproduced from an information medium by utilizing the optical head apparatus 51 regardless of whether the information medium is thick or thin.

(Seventh Embodiment)

Next, an optical head apparatus in which servo signals such as a focus error signal and a tracking error signal are detected according to an astigmatic aberration method is described according to a seventh embodiment of the present invention.

Figure 27:
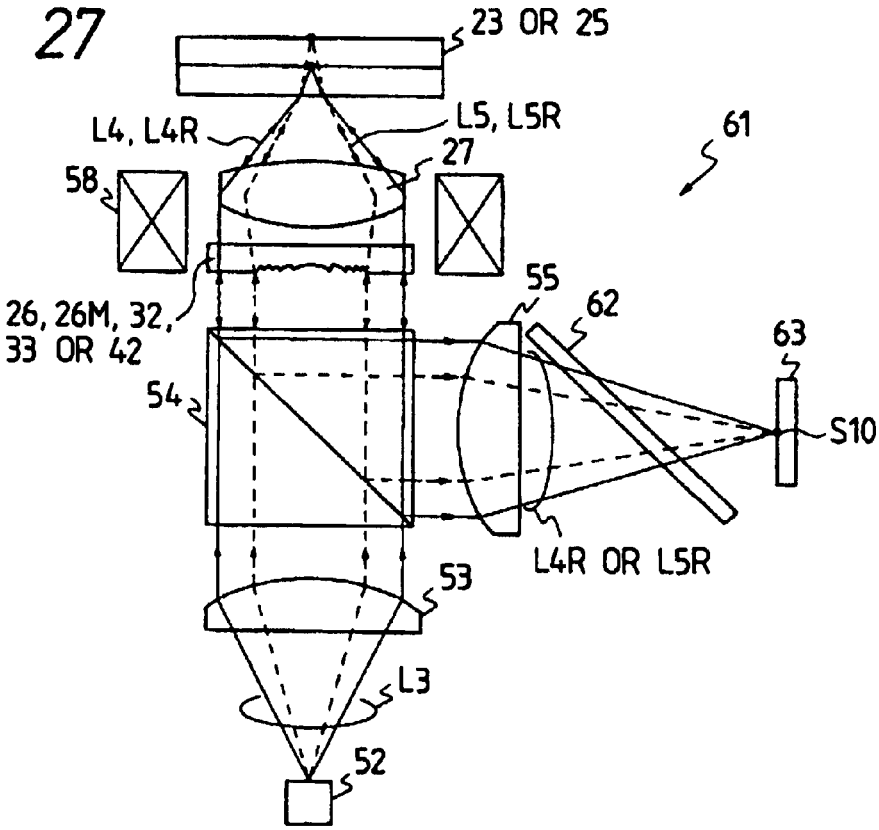
FIG. 27 is a constitutional view of an optical head apparatus according to a seventh embodiment.

FIG. 27 is a constitutional view of an optical head apparatus according to a seventh embodiment.

As shown in FIG. 27, an optical head apparatus 61 for recording or reproducing pieces of information on or from the information medium 23 or 25, comprises the light source 52, the collimator lens 53, the beam splitter 54, the compound objective lens 29 (or 29M, 34, 43, 45, 46 or 47) composed of the hologram lens 26 (or 26M, 32, 33 or 42) and the objective lens 27, the actuating unit 58, the converging lens 55, an astigmatic aberration generating unit 62 such as a plane parallel plate for generating an astigmatic aberration in the transmitted light L4R or the diffracted light L5 R converged by the converging lens 55, and a photo detector 63 for detecting the intensity of the transmitted light L4R or the diffracted light L5R in which the astigmatic aberration is generated to obtain an information signal and servo signals such as a focus error signal and a tracking error signal.

The astigmatic aberration generating unit 62 is classified into one of the wavefront changing unit 56 because a wavefront of the transmitted light L4R or the diffracted light L5R is changed by the generating unit 62 to generate the astigmatic aberration in the light L4R or L5R. Also, a normal line of the unit 62 is tilted from an optical axis.

Figure 28:
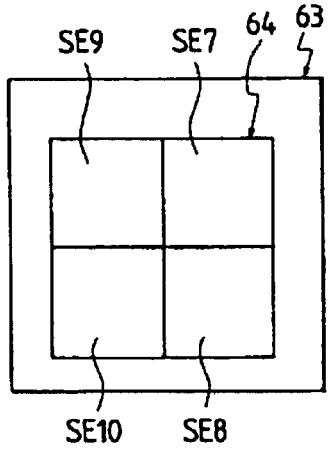
FIG. 28 is a plan view of a photo detector utilized in the seven, ninth, tenth, twelfth and thirteenth embodiments.

As shown in FIG. 28, the photo detector 63 comprises a quadrant photo-detector 64 in which four detecting sections SE7, SE8, SE9 and SE10 are provided.

In the above configuration, the transmitted light L4R (or the diffracted light L5R) reflected by the information medium 23 (or 25) is converged by the converging lens 55 in the same manner as in the sixth embodiment. Thereafter, the transmitted light L4R (or the diffracted light L5R) transmits through the astigmatic aberration generating unit 62 and is converged on the photo detector 57 to form a converging spot S10 on the detecting sections SE7, SE8, SE9 and SE10 of the quadrant photo-detector 64. In this case, because the transmitted light L4R (or the diffracted light L5R) converged by the converging lens 55 is a spherical wave, an astigmatic aberration is generated in the transmitted light L4R (or the diffracted light L5R) by the astigmatic aberration generating unit 62. Therefore, as shown in FIGS. 29A to 29C, the shape of the converging spot S10 considerably changes depending on a distance between the compound objective lens 29 and the information medium 23 (or 25).

Figure 29A:
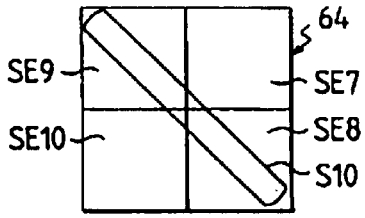
FIGS. 29A, 29B, 29C show various shapes of converging spots converged on the photo detector shown in FIG. 28.
Figure 29B:
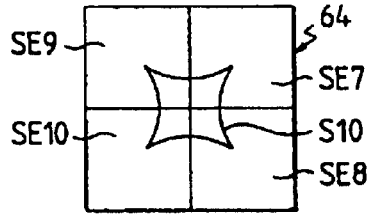
Figure 29C:
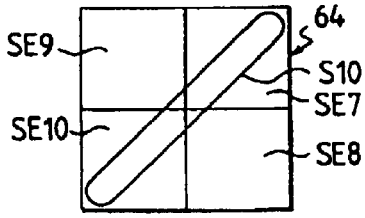

For example, in cases where the transmitted light L4 (or the diffracted light L5) is converged on the information medium 23 (or 25) on condition that the objective lens 27 is defocused on the information medium 23 (or 25), the converging spot S10 of the transmitted light L4R (or the diffracted light L5R) is formed on the quadrant photo-detector 64 as shown in FIGS. 29A, 29C. In contrast, in cases where the transmitted light L4 (or the diffracted light L5) is converged on the information medium 23 (or 25) on condition that the objective lens 27 is just focused on the information medium 23 (or 25), the converging spot S10 of the transmitted light L4R (or the diffracted light L5R) is formed on the quadrant photo-detector 64 as shown in FIG. 25B.

The intensity of the transmitted light L4R (or the diffracted light L5R) is detected in the detecting sections SE7, SE8, SE9 and SE10 of the quadrant photo-detector 64 and is changed to electric current signals SC11, SC12, SC13 and SC14. Thereafter, a focus error signal $S_{f\theta}$ is obtained according to an astigmatic aberration method by calculating an equation (8).

$$S_{f\theta}=(SC11+SC14)-(SC12+SC13) \quad (8)$$

Thereafter, the position of the compound objective lens 29 is moved in a direction parallel to an optical axis at high speed so as to minimize the absolute value of the focus error signal $S_{f\theta}$.

Figure 29D:
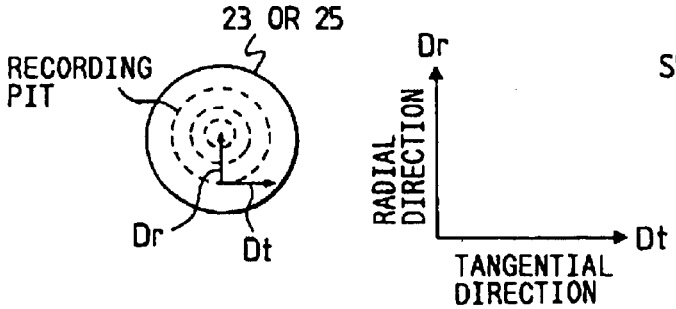
FIG. 29D shows a radial direction Dr and a tangential direction Dt.

Also, a tangential direction Dt agreeing with an extending direction of patterned recording pits and a radial direction Dr perpendicular to both the optical axis and the patterned recording pits are defined as shown in FIG. 29D. In this case, when the quadrant photo-detector 64 is directed as shown in FIGS. 29A to 29C, a tracking error signal $S_{t\theta}$ is calculated according to an equation (9) by utilizing an intensity distribution change of the transmitted light L4R (or the diffracted light L5R) which depends on a positional relation between the converging spot S10 and a recording pit radiated by the light L4 or L5.

$$S_{t\theta}=SC11+SC13-(SC12+SC14) \quad (9)$$

Thereafter, the objective lens 27 is moved in the radial direction so as to reduce a tracking error indicated by the tracking error signal $S_{t\theta}$. Therefore, the converging spot S1, (or S2) of the transmitted light L4 (or the diffracted light L5) on the information medium 23 (or 25) can be formed in the middle of the recording pit, so that the tracking error becomes zero.

In other case, the tracking error signal $S_{t\theta}$ is obtained according to a phase difference method by utilizing the result calculated in the equation (8).

In addition, an information signal $S_{in}$ is obtained by adding all of the electric current signals according to an equation (10).

$$S_{in}=SC11+SC12+SC13+SC14 \quad (10)$$

Accordingly, focus and tracking servo characteristics can be stably obtained in the optical head apparatus 61. That is, because an astigmatic aberration is generated in the transmitted light L4R (or the diffracted light L5R) by the astigmatic aberration generating unit 62 made of a plane parallel plate, the servo signals such as a focus error signal and a tracking error signal can be easily obtained. Therefore, the number of parts required to manufacture the optical head apparatus 61 can be reduced, and the number of manufacturing steps can be reduced. In addition, the optical head apparatus 61 can be manufactured at a low cost and in light weight.

Also, because the compound objective lens having two focal points is utilized in the optical head apparatus 61, pieces of information can be reliably recorded or reproduced from an information medium by utilizing the optical head apparatus 61 regardless of whether the information medium is thick or thin.

Figure 30:
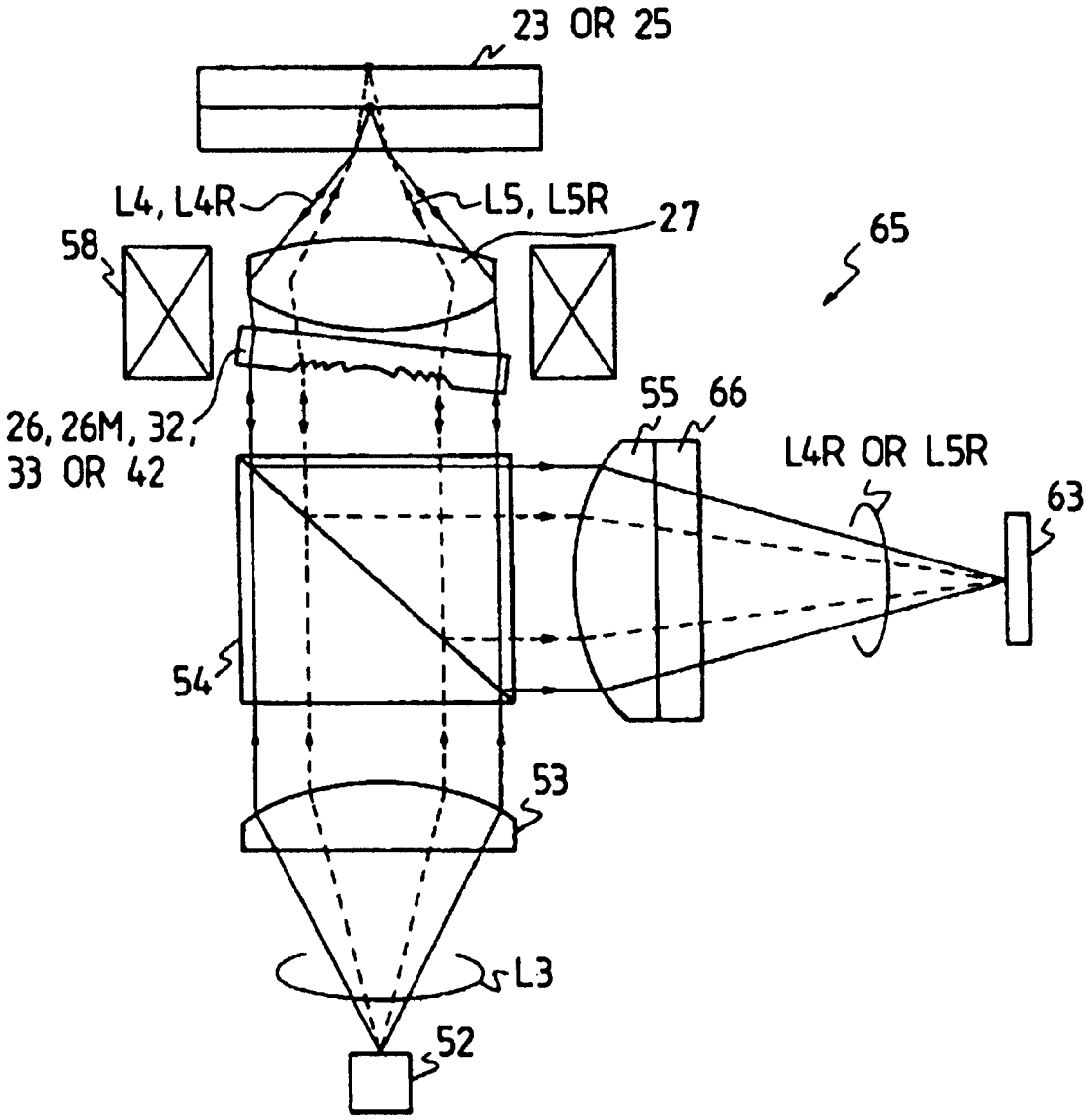
FIG. 30 is a constitutional view of an optical head apparatus according to a first modification of the seventh embodiment.

In the seventh embodiment, the astigmatic aberration generating unit 62 formed out of the plane parallel plate is arranged between the converging lens 55 and the photo detector 63. However, as an optical head apparatus 65 is shown in FIG. 30, it is applicable that a cylindrical lens 66 integrally formed with the converging lens 55 be arranged in place of the plane parallel plate to generate an astigmatic aberration in the transmitted light L4R (or the diffracted light L5R). In this case, because the cylindrical lens 66 is integrally formed with the converging lens 55, the optical head apparatus can be moreover manufactured at low cost. In addition, as shown in FIG. 30, it is applicable that a normal line of the hologram lens 26 (or 32, 33, 42) be tilted from an optical axis passing through the center of the objective lens 27 by about one degree to prevent stray light reflected in a surface of the hologram lens 26 from being incident on the photo detector 57 or 63. Also, it is applicable that the hologram lens 26 (or 32, 33, 42) be coated with an anti-reflection coating to prevent the occurrence of stray light.

Figure 31:
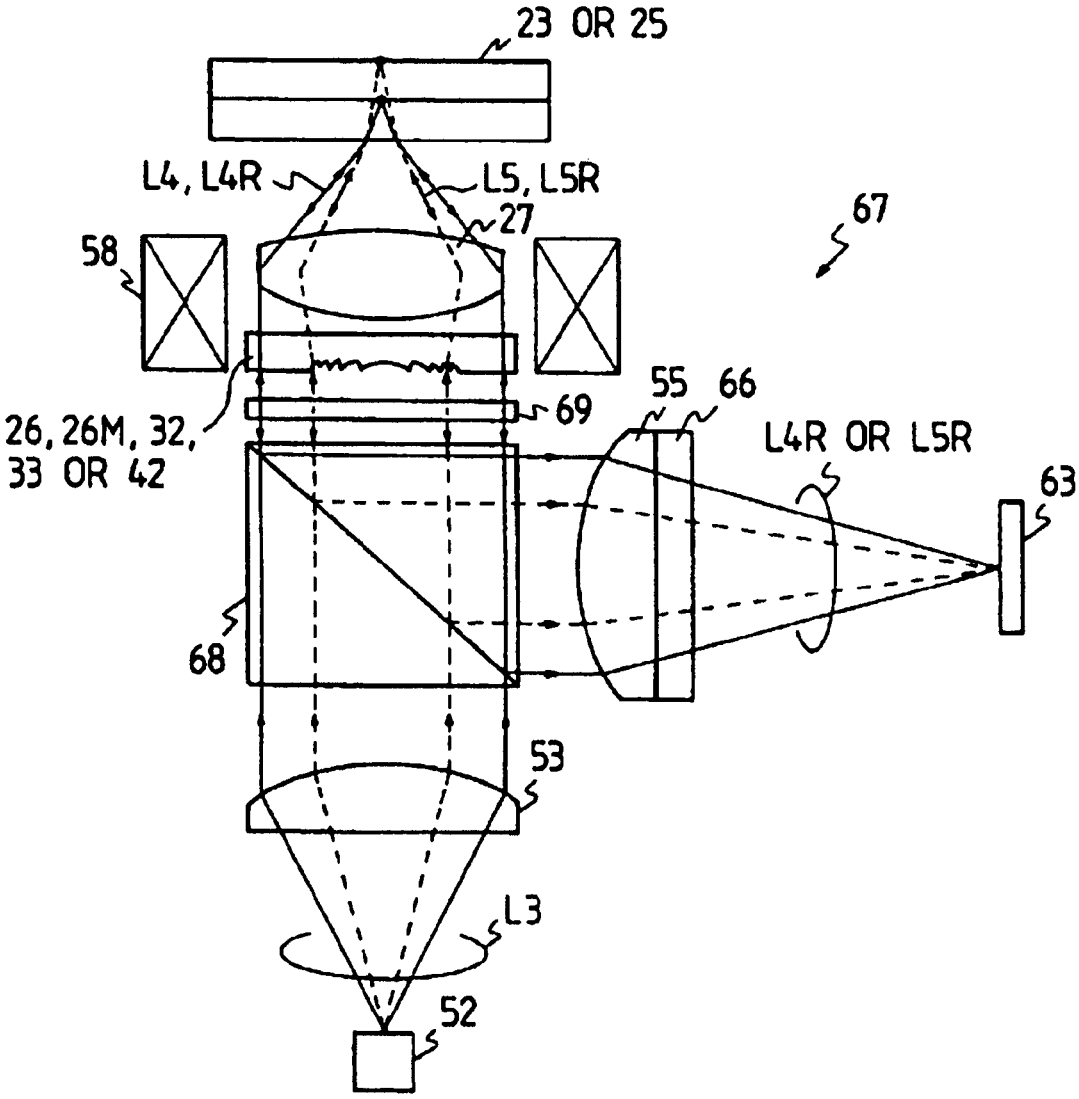
FIG. 31 is a constitutional view of an optical head apparatus according to a second modification of the seventh embodiment.

Also, as an optical head apparatus 67 is shown in FIG. 31, it is applicable that a polarized beam splitter 68 be arranged in place of the beam splitter 54 to perfectly transmit the incident light L3 and a ¼-λ plate 69 be additionally placed between the hologram lens 26 (or 32, 33, 42) and the polarized beam splitter 68. In this case, because the incident light L3 transmits through the ¼-λ plate 69 in an outgoing optical path and because the transmitted light L4R (or the diffracted light L5) again transmits through the ¼-λ plate 69 in an incoming optical path, the transmitted light L4R (or the diffracted light L5R) is perfectly reflected by the polarized beam splitter 68. Accordingly, a utilization efficiency of the incident light L3 can be enhanced. Also, a signal-noise ratio of each of the servo signals and the information signal can be enhanced.

Figure 32:
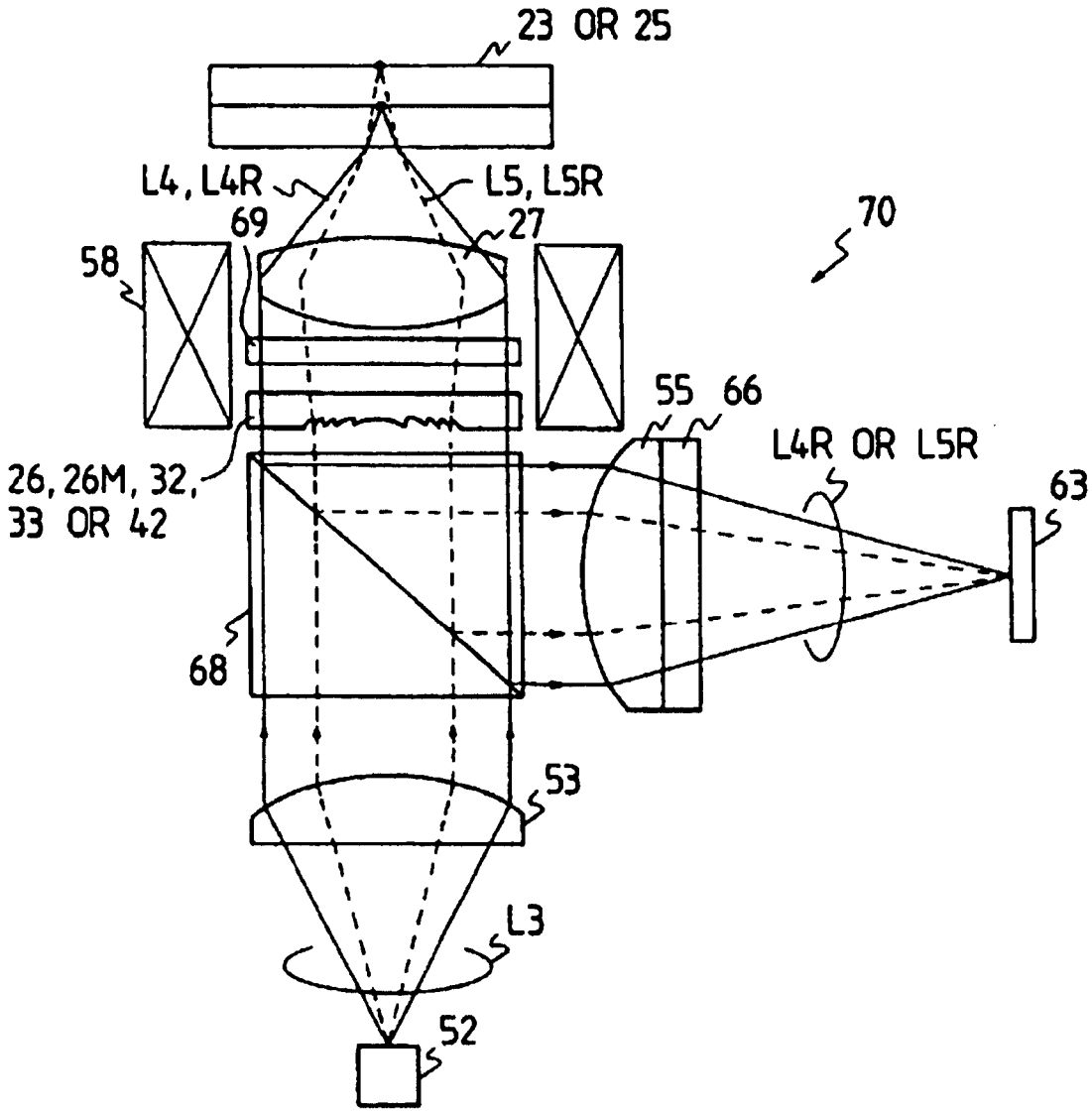
FIG. 32 is a constitutional view of an optical head apparatus according to a third modification of the seventh embodiment.

Also, as an optical head apparatus 70 is shown in FIG. 32, it is applicable that the polarized beam splitter 68 be arranged in place of the beam splitter 54 to perfectly transmit the incident light L3 and the ¼-λ plate 69 be additionally placed between the hologram lens 26 (or 32, 33, 42) and the objective lens 27. In this case, the transmitted light L4R (or the diffracted light L5R) is perfectly reflected by the polarized beam splitter 68 in the same manner as the optical head apparatus shown in FIG. 31. In addition, because stray light reflected from the hologram lens 26 (or 32, 33, 42) transmits through the polarized beam splitter 68, the stray light is not incident on the photo detector 63. Accordingly, a signal-noise ratio of each of the servo signals and the information signal can be moreover enhanced.

Figure 33:
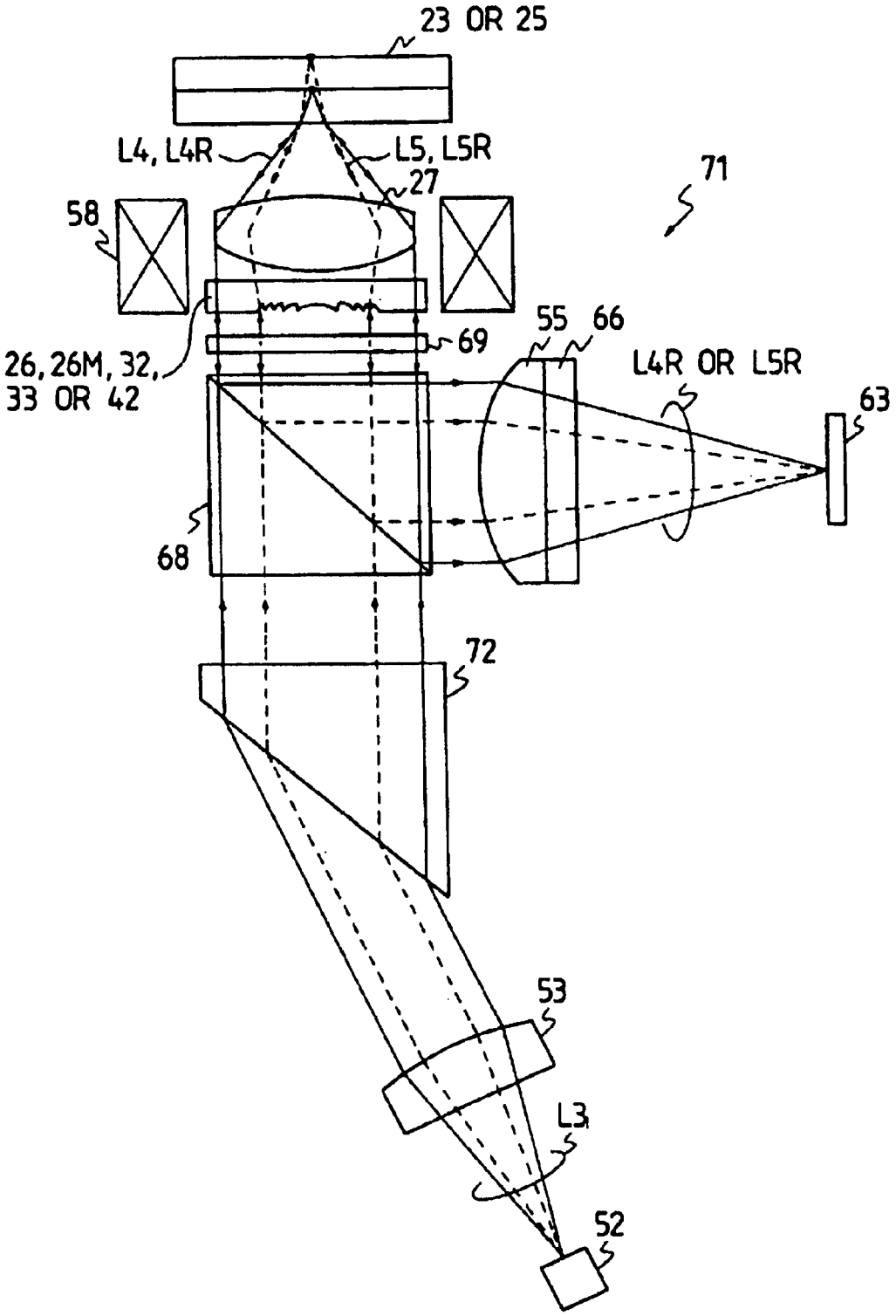
FIG. 33 is a constitutional view of an optical head apparatus according to a forth modification of the seventh embodiment.

Also, as an optical head apparatus 71 is shown in FIG. 33, it is applicable that a wedge-like prism 72 for reshaping the incident light L3 radiated from the light source 52 be additionally placed between the collimator lens 53 and the polarized beam splitter 68. In this case, an elliptic wavefront of the incident light L3 is reshaped to a circular wavefront by the wedge-like prism 72. Accordingly, a utilization efficiency of the incident light L3 can be enhanced.

Figure 34:
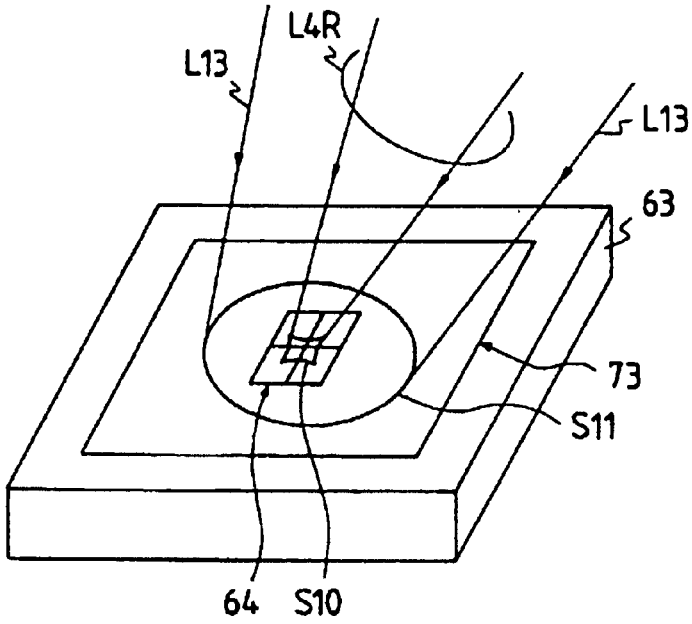
FIG. 34 shows a beam of transmitted light not diffracted on an incoming optical path and a beam of transmitted light diffracted on the incoming optical path, the beams being utilized to detect an information signal.

In the sixth and seventh embodiments, when the transmitted light L4 (that is, zero-order diffracted light L4) converged on the first information medium 23 is reflected toward the compound objective lens to reproduce a piece of information recorded on the first information medium 23, a part of the transmitted light L4R is diffracted in the hologram lens 26 (or 32, 33, 42) on the incoming optical path, so that the part of the transmitted light L4R is changed to a beam of first-order diffracted light L13. Therefore, the first-order diffracted light L13 diverges from the hologram lens 26, and a converging spot S11 of the diffracted light L13 is formed on the photo detector 57 or 63 in a relatively large size, as shown in FIG. 34. The size of the converging spot S11 is larger than those of the sextant photo-detector 59 and the quadrant photo-detector 64. Therefore, there is a drawback that a signal-noise ratio in the information signal deteriorates.

To solve the drawback, it is preferred that the photo detector 57 (or 63) further comprise an information photo-detector 73 surrounding the sextant photo-detector 59 (or the quadrant photo-detector 64). The size of the information photo-detector 73 is equal to or larger than a 1 mm square.

Therefore, in cases where the information signal is determined by the sum of the intensity of the transmitted light L4 detected in the sextant photo-detector 59 (or the quadrant photo-detector 64) and the intensity of the diffracted light L13 detected in the information photo-detector 73, the signal-noise ratio in the information signal can be enhanced, and frequency characteristics of the information signal can be enhanced.

(Eighth Embodiment)

Next, a method of focusing performed in the optical head apparatuses 51, 61, 65, 67, 70 and 71 is described according to an eighth embodiment of the present invention.

Figure 35A:
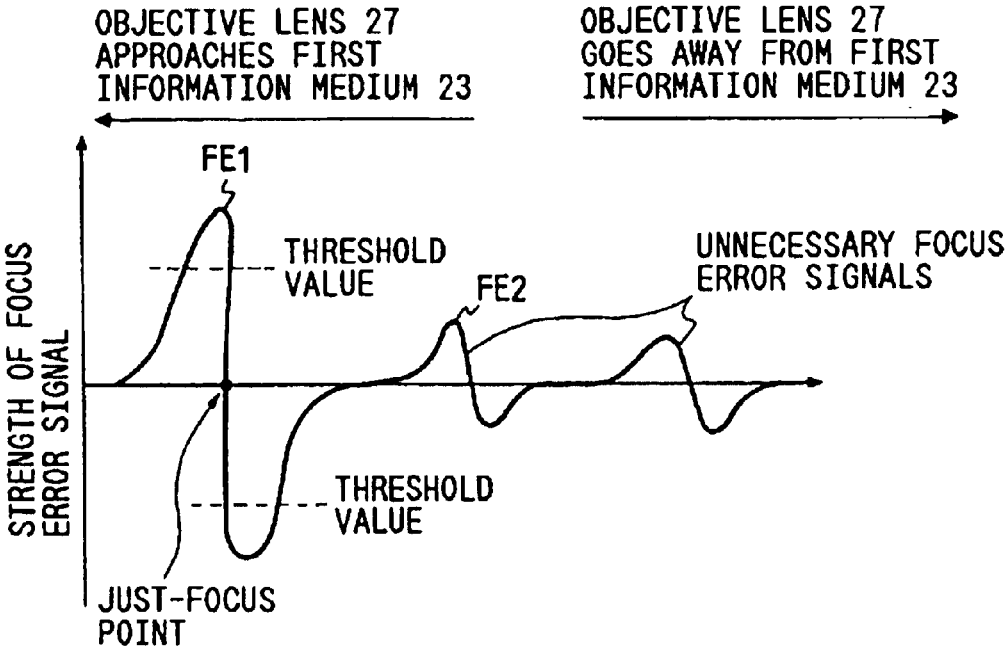
FIG. 35A graphically shows a change of a focus error signal obtained by detecting the intensity of transmitted light, the strength of the focus error signal depending on a distance between an objective lens and a first information medium.
Figure 35B:
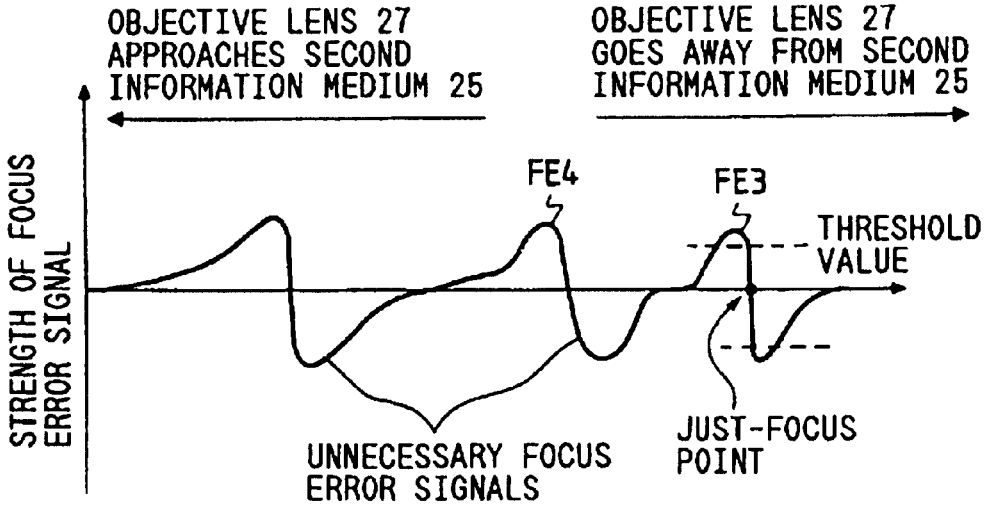
FIG. 35B graphically shows a change of a focus error signal obtained by detecting the intensity of diffracted light, the strength of the focus error signal depending on a distance between an objective lens and a second information medium.

FIG. 35A graphically shows a change of the focus error signal obtained by detecting the intensity of the transmitted light L4 formed in the hologram lens 26, 32 or 33, the strength of the focus error signal depending on a distance between the objective lens 27 and the first information medium 23. FIG. 35B graphically shows a change of the focus error signal obtained by detecting the intensity of the diffracted light L5 formed in the hologram lens 26, 32 or 33, the strength of the focus error signal depending on a distance between the objective lens 27 and the second information medium 25.

The intensity of the transmitted light L4 is high because the numerical aperture of the objective lens 27 for the transmitted light L4 is large. Therefore, as shown in FIG. 35A, a change of a focus error signal FE1 obtained in cases where the objective lens 27 is almost focused on the first information medium 23 is considerably large as compared with a change of an unnecessary focus error signal FE2 obtained in cases where the objective lens 27 is defocused on the first information medium 23. In addition, in cases where the hologram lens 26, 32 or 33 is utilized in each of the optical head apparatuses 51, 61, 65, 67, 70 and 71, the unnecessary focus error signal FE2 is generated when the distance between the objective lens 27 and the first information medium 23 is larger than the focal length of the objective lens 27 for the transmitted light L4.

In contrast, the intensity of the diffracted light L5 is comparatively low because the numerical aperture of the objective lens 27 for the diffracted light L5 is comparatively small. Therefore, as shown in FIG. 35B, a change of a focus error signal FE3 obtained in cases where the objective lens 27 is almost focused on the second information medium 25 is almost the same as that of an unnecessary focus error signal FE4 obtained in cases where the objective lens 27 is defocused on the second information medium 25. In addition, in cases where the hologram lens 26, 32 or 33 is utilized in each of the optical head apparatuses 51, 61, 65, 67, 70 and 71, the unnecessary focus error signal FE4 is generated when the distance between the objective lens 27 and the second information medium 25 is smaller than the focal length of the objective lens 27 for the diffracted light L5.

Therefore, in cases where the focusing of the transmitted light L4 on the first information medium 23 is performed, the objective lens 27 placed far from the first information medium 23 is gradually brought near to the first information medium 23. Thereafter, when the strength of the focus error signal reaches a threshold value, a focus servo loop provided in the photo detector 57 or 63 is set to an operation condition, so that the objective lens 27 is set to be focused on the first information medium 23. Also, in cases where the focusing of the diffracted light L5 on the second information medium 25 is performed, the objective lens 27 placed far from the second information medium 25 is gradually brought near to the second information medium 25 in the same manner. Thereafter, when the strength of the focus error signal reaches a threshold value, a focus servo loop provided in the photo detector 57 or 63 is set to an operation condition, so that the objective lens 27 is set to be focused on the second information medium 25.

Accordingly, the inverse influence of the unnecessary focus error signal FE4 on the focusing of the diffracted light L5 can be prevented. Also, because the objective lens 27 placed far from the information medium 23 or 25 is gradually brought near to the information medium 23 or 25 regardless of whether the information medium is T1 or T2 in thickness, a focusing operation in each of the optical head apparatuses 51, 61, 65, 67, 70 and 71 with the hologram lens 26, 32 or 33 can be performed according to a common procedure by changing the threshold value or performing an auto gain control in which the focus error signal is normalized by detecting the total intensity of the transmitted light L4R or the diffracted light L5R. Therefore, a control circuit required to perform the focusing operation can be made at a low cost.

Figure 36A:
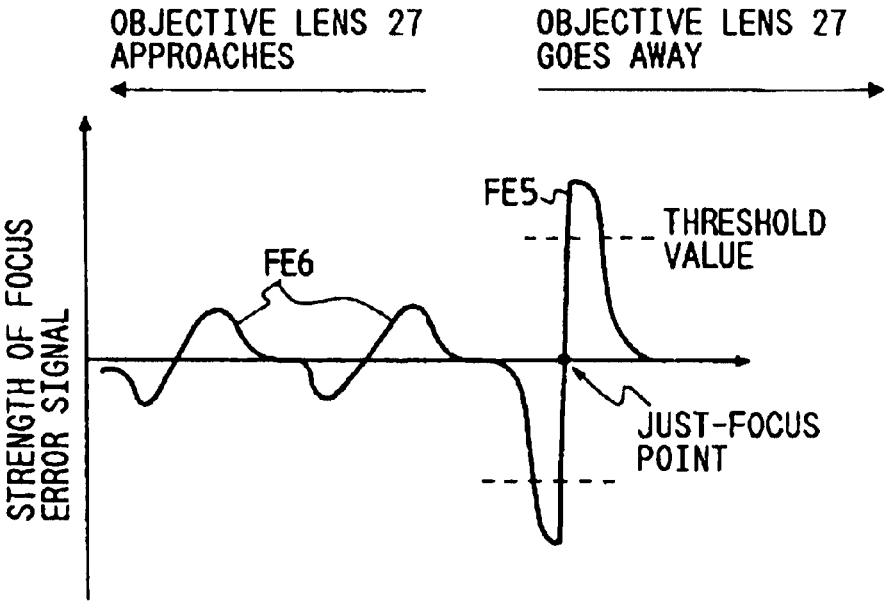
FIG. 36A graphically shows a change of a focus error signal obtained by detecting the intensity of diffracted light, the strength of the focus error signal depending on a distance between an objective lens and a first information medium.
Figure 36B:
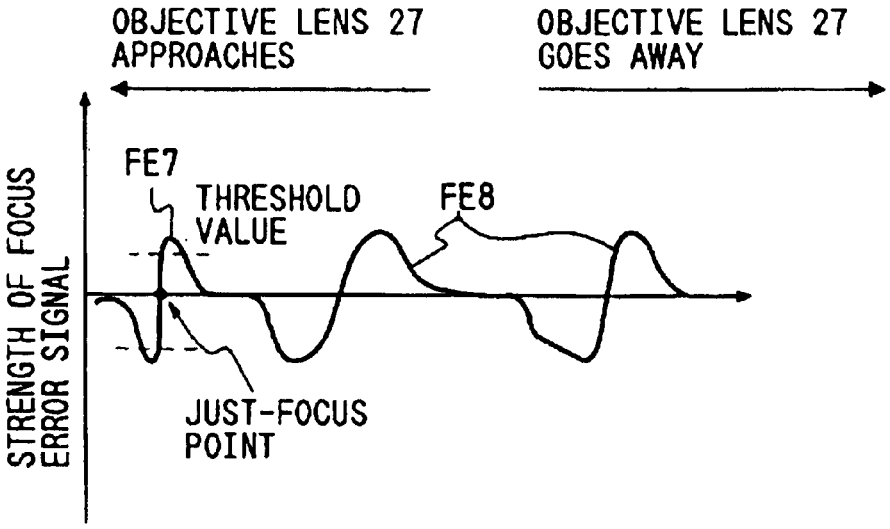
FIG. 36B graphically shows a change of a focus error signal obtained by detecting the intensity of transmitted light, the strength of the focus error signal depending on a distance between an objective lens and a second information medium.

FIG. 36A graphically shows a change of the focus error signal obtained by detecting the intensity of the diffracted light L6 formed in the hologram lens 42, the strength of the focus error signal depending on a distance between the objective lens 27 and the first information medium 23. FIG. 36B graphically shows a change of the focus error signal obtained by detecting the intensity of the transmitted light L4 formed in the hologram lens 42, the strength of the focus error signal depending on a distance between the objective lens 27 and the second information medium 25.

As shown in FIG. 36A, a change of a focus error signal FE5 obtained in cases where the objective lens 27 is almost focused on the first information medium 23 is considerably large as compared with a change of an unnecessary focus error signal FE6 obtained in cases where the objective lens 27 is defocused on the first information medium 23. In addition, in cases where the hologram lens 42 is utilized in each of the optical head apparatuses 51, 61, 65, 67, 70 and 71, the unnecessary focus error signal FE6 is generated when the distance between the objective lens 27 and the first information medium 23 is smaller than the focal length of the objective lens 27 for the diffracted light L6.

In contrast, as shown in FIG. 36B, a change of a focus error signal FE7 obtained in cases where the objective lens 27 is almost focused on the second information medium 25 is almost the same as that of an unnecessary focus error signal FE8 obtained in cases where the objective lens 27 is defocused on the second information medium 25. In addition, in cases where the hologram lens 42 is utilized in each of the optical head apparatuses 51, 61, 65, 67, 70 and 71, the unnecessary focus error signal FE8 is generated when the distance between the objective lens 27 and the second information medium 25 is larger than the focal length of the objective lens 27 for the transmitted light L4.

Therefore, in cases where the focusing of the diffracted light L6 on the first information medium 23 is performed, the objective lens 27 placed near to the first information medium 23 is gradually moved away from the first information medium 23. Thereafter, when the strength of the focus error signal reaches a threshold value, a focus servo loop provided in the photo detector 57 or 63 is set to an operation condition, so that the objective lens 27 is set to be focused on the first information medium 23. Also, in cases where the focusing of the transmitted light L4 on the second information medium 25 is performed, the objective lens 27 placed near to the second information medium 25 is gradually moved away from the second information medium 25 in the same manner. Thereafter, when the strength of the focus error signal reaches a threshold value, a focus servo loop provided in the photo detector 57 or 63 is set to an operation condition, so that the objective lens 27 is set to be focused on the second information medium 25.

Accordingly, the inverse influence of the unnecessary focus error signal FE8 on the focusing of the transmitted light L4 can be prevented. Also, because the objective lens 27 placed near to the information medium 23 or 25 is gradually moved away from the information medium 23 or 25 regardless of whether the information medium is T1 or T2 in thickness, a focusing operation in each of the optical head apparatuses 51, 61, 65, 67, 70 and 71 with the hologram lens 42 can be performed according to a common procedure by changing the threshold value or performing the auto gain control. Therefore, a control circuit required to perform the focusing operation can be made at a low cost.

(Ninth Embodiment)

An optical head apparatus with the compound objective lens 29, 34, 45, 46 or 47 in which the incident light L3 is efficiently utilized to obtain an information signal and servo signals is described with reference to FIGS. 29, 37 according to a ninth embodiment of the present invention.

Figure 37:
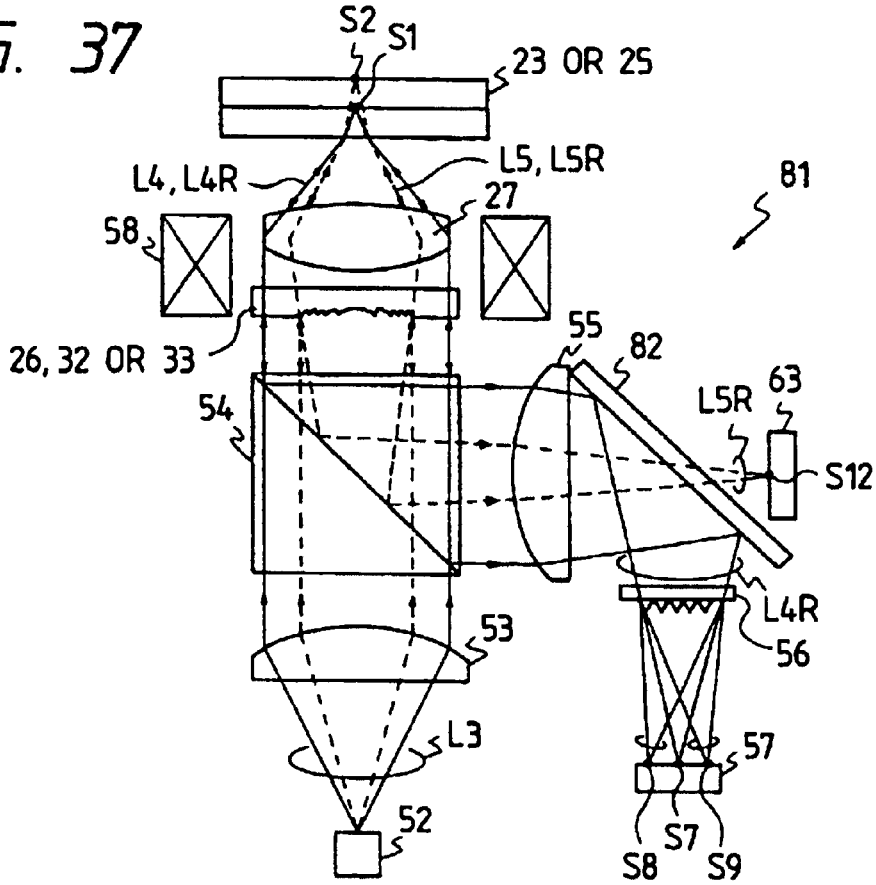
FIG. 37 is a constitutional view of an optical head apparatus according to a ninth embodiment.

FIG. 37 is a constitutional view of an optical head apparatus according to a ninth embodiment.

As shown in FIG. 37, an optical head apparatus 81 for recording or reproducing pieces of information on or from the information medium 23 or 25, comprises the light source 52, the collimator lens 53, the beam splitter 54, the compound objective lens the compound objective lens 29 (34, 45, 46 or 47) composed of the hologram lens 26 (or 32 or 33) and the objective lens 27, the actuating unit 58, the converging lens 55, a beam splitter 82 for transmitting a beam of diffracted light L5R or reflecting a beam of transmitted light L4R, the photo detector 63 for detecting the intensity of the diffracted light L5R transmitting through the beam splitter 82 to obtain servo signals and an information signal recorded on the second information medium 25, the wavefront changing device 56 such as a hologram for changing a wavefront of the transmitted light L4R reflected by the beam splitter 82, and the photo detector 57 for detecting the intensity of the transmitted light L4R to obtain servo signals and an information signal recorded on the first information medium 23. The beam splitter 82 is made of a plane parallel plate of which a normal line is tilted from an optical path, so that an astigmatic aberration is generated in the diffracted light L5R passing through the beam splitter 82. Also, a coating is applied on a surface of the plane parallel plate.

In the above configuration, the transmitted light L4 (or the diffracted light L5) are converged by the converging lens 27 in the same manner as in the sixth embodiment. Thereafter, in cases where a piece of information is recorded or reproduced on or from the first information medium 23, the transmitted light L4 is converged on the first information medium 23 to form the first converging spot S1. Thereafter, a beam of transmitted light L4R reflected by the first information medium 23 passes through the same optical path in the reverse direction. That is, a great part of the transmitted light L4R again transmits through the compound objective lens without any diffraction and is reflected by the beam splitter 54. Thereafter, the transmitted light L4R is converged by the converging lens 55, and a part of the transmitted light L4R is reflected by the beam splitter 82. Thereafter, the wavefront of a great part of the transmitted light L4R is changed by the wavefront changing unit 56, and the great part of the transmitted light L4R is converged on the photo detector 57 to form the converging spots S8, S9. Therefore, an information signal and servo signals such as a focus error signal and a tracking error signal are obtained in the same manner as in the sixth embodiment. Also, a remaining part of the transmitted light L4R not changed its wavefront is converged on the photo detector 57 to form the converging spot S7.

In contrast, in cases where a piece of information is recorded or reproduced on or from the second information medium 25, the diffracted light L5 is converged on the second information medium 25 to form the second converging spot S2. Thereafter, a beam of diffracted light L5R reflected by the second information medium 25 passes through the same optical path in the reverse direction, and a great part of the diffracted light L5R transmits through the hologram lens 26 without any diffraction. Therefore, the diffracted light L5R passes through the incoming optical path differing from the outgoing optical path. Thereafter, the diffracted light L5R is reflected by the beam splitter 54 and is converged by the converging lens 55. Thereafter, a part of the diffracted light L5R transmits through the beam splitter 82. In this case, an astigmatic aberration is generated in the diffracted light L5R. Thereafter, the diffracted light L5R is converged on the photo detector 63 to form a converging spot S12 of which the shape is the same as the converging spot S10 shown in FIGS. 29A to 29C, and the intensity of the diffracted light L5R is detected in the photo detector 63. Therefore, an information signal and servo signals such as a focus error signal and a tracking error signal are obtained in the same manner as in the seventh embodiment.

In this case, though a remaining part of the transmitted light L4R transmits through the beam splitter 82, the remaining part of the transmitted light L4R is not converged at the converging spot S12 because the transmitted light L4R passes through the same optical path. Also, though a remaining part of the diffracted light L5R is reflected the beam splitter 82, the remaining part of the diffracted light L5R is not converged at the converging spot S7, S8 or S9 because the diffracted light L5R passes through the incoming optical path differing from the outgoing optical path.

In the ninth embodiment, because the diffracted light L5R transmits through the hologram lens 26 without any diffraction, the converging spot S12 formed on the photo detector 63 does not relate to a radiating point of the light source 52 in a mirror image, while the converging spot S7 formed on the photo detector 57 relates to the radiating point of the light source 52 in the mirror image. In other words, a focal point of the diffracted light L5R converged by the converging lens 55 differs from that of the transmitted light L4R converged by the converging lens 55. Therefore, the photo detector 57 for detecting the intensity of the transmitted light L4R and the photo detector 63 for detecting the intensity of the diffracted light L5R are required.

Accordingly, because the compound objective lens having two focal points is utilized in the optical head apparatus 81, pieces of information can be reliably recorded or reproduced on or from an information medium regardless of whether the information medium is thick or thin.

An example of the utilization of the optical head apparatus 81 for various types of optical disks is described.

In cases where the optical head apparatus 81 is utilized for an optical disk device in which pieces of information recorded in a thin type of high density optical disk 23 are recorded or reproduced and pieces of information recorded in a thick type of optical disk 25 are exclusively reproduced, the diffraction efficiency of the hologram lens 26, 32 or 33 in the compound objective lens 29, 34, 45, 46 or 47 for changing a beam of light to a beam of first-order diffracted light is set to a value equal to or lower than 30%. Therefore, in cases where a piece of information recorded on the thick type of optical disk 25 is reproduced in the photo detector 63, a signal-noise ratio of each of the servo signals and the information signal obtained in the photo detector 63 can be enhanced because the diffracted light L5R transmitting through the hologram lens 26, 32 or 33 at a high transmission efficiency is utilized to obtain the servo signals and the information signal. In other words, a utilization efficiency of the incident light L3 can be enhanced when a piece of information recorded on the thick type of optical disk 25 is reproduced, so that the output power of the incident light L3 can be minimized. Also, even though a high intensity of the transmitted light L4 is required to record a piece of information on the high density optical disk 23, the recording of the information can be reliably performed without increasing the intensity of the incident light L3 because a transmission efficiency of the hologram lens 26, 32 or 33 for the incident light L3 is high. Also, in cases where a piece of information recorded on the high density optical disk 23 is reproduced in the photo detector 57, a signal-noise ratio of each signal obtained in the photo detector 57 can be enhanced because the transmission efficiency of the hologram lens 26, 32 or 33 for the light L3, L4R is high.

(Tenth Embodiment)

An optical head apparatus with the compound objective lens 29, 34, 45, 46 or 47 in which the incident light L3 is efficiently utilized to obtain an information signal and servo signals is described with reference to FIGS. 38, 39 according to a tenth embodiment of the present invention. X1 and Y1 coordinates shown in FIGS. 38, 39 are utilized in common.

Figure 38:
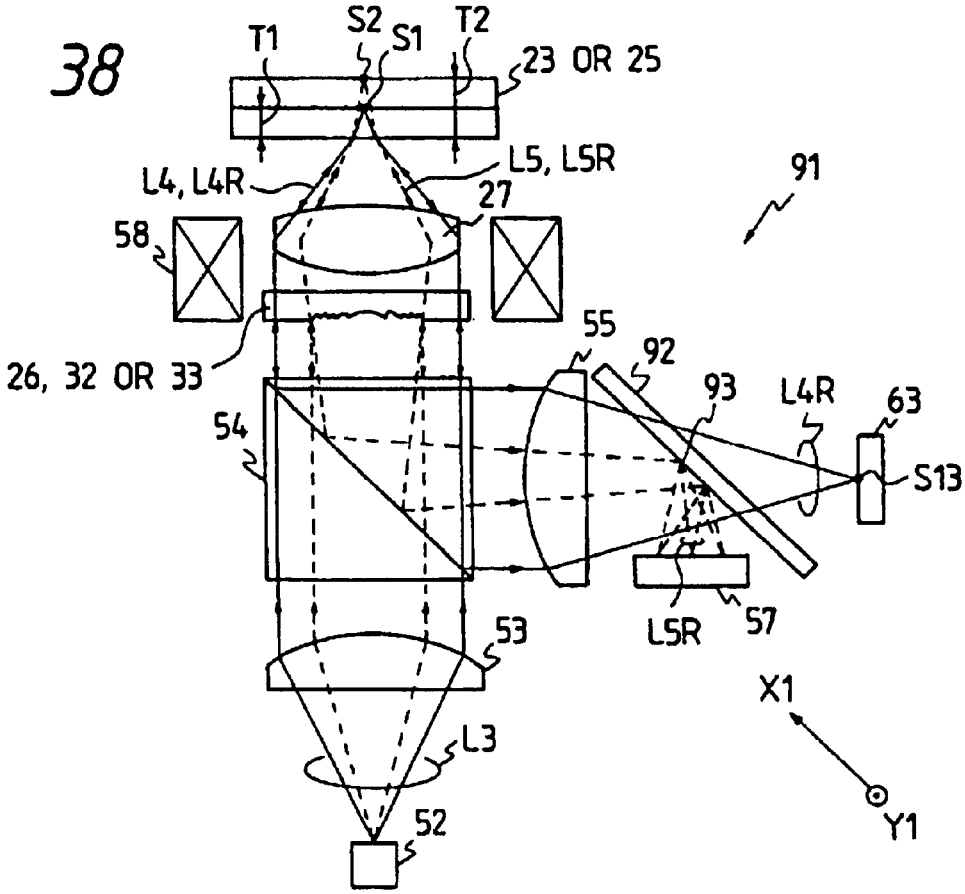
FIG. 38 is a constitutional view of an optical head apparatus according to a tenth embodiment.
Figure 39:
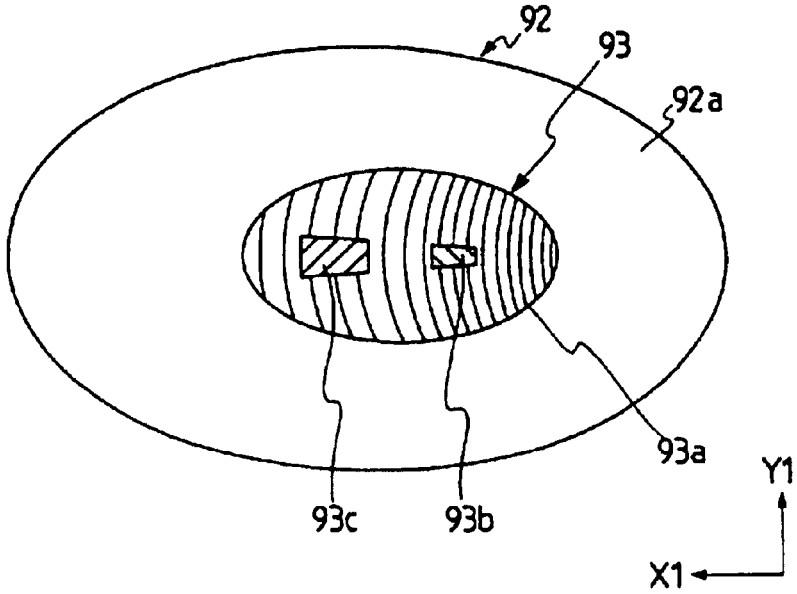
FIG. 39 is a plan view of a beam splitter having a reflection type of hologram utilized in the optical head apparatus shown in FIG. 38.

FIG. 38 is a constitutional view of an optical head apparatus according to a tenth embodiment. FIG. 39 is a plan view of a beam splitter having a reflection type of hologram utilized in the optical head apparatus shown in FIG. 38.

As shown in FIG. 38, an optical head apparatus 91 for recording or reproducing pieces of information on or from the information medium 23 or 25, comprises the light source 52, the collimator lens 53, the beam splitter 54, the compound objective lens 29 (or 34, 45, 46 or 47) composed of the hologram lens 26 (or 32 or 33) and the objective lens 27, the actuating unit 58, the converging lens 55, a beam splitter 92 having a reflection type of hologram 93 for transmitting a large part of the transmitted light L4R or reflecting all of the diffracted light L5R incident on the hologram 93, the photo detector 63 for detecting the intensity of the transmitted light L4R transmitting through the beam splitter 92 to obtain servo signals and an information signal recorded in the first information medium 23, and the photo detector 57 for detecting the intensity of the diffracted light L5R to obtain servo signals and an information signal recorded in the second information medium 25.

The beam splitter 92 is made of a plane parallel plate inclined to an optical path, so that an astigmatic aberration is generated in the transmitted light L4R passing through the beam splitter 92. Also, as shown in FIG. 39, the reflection type of hologram 93 is arranged at a center portion of the beam splitter 92, and a light transmitting region 92a is arranged at a peripheral portion of the beam splitter 92 to surround the hologram 93. Light incident on the light transmitting region 92a transmits without any diffraction. The hologram 92 is partitioned into a diffracted light generating region 93a in which a grating pattern P7 is drawn and a pair of diffracted light generating regions 93b, 93c in which a pair of grating patterns P8, P9 are drawn. The diffracted light L5R incident on the diffracted light generating region 93a is diffracted to obtain a focus error signal in the photo detector 57. The diffracted light L5R incident on each of the diffracted light generating regions 93b, 93c is diffracted to obtain a tracking error signal in the photo detector 57.

In the above configuration, the transmitted light L4 and the diffracted light L5 are converged by the converging lens 27 in the same manner as in the sixth embodiment. Thereafter, in cases where a piece of information is recorded or reproduced on or from the first information medium 23, the transmitted light L4 is converged on the first information medium 23 to form the first converging spot S1. Thereafter, a beam of transmitted light L4R reflected by the first information medium 23 passes through the same optical path in the reverse direction. That is, a large part of the transmitted light L4R again transmits through the compound objective lens 29 without any diffraction and is reflected by the beam splitter 54. Thereafter, the transmitted light L4R is converged by the converging lens 55, and a large part of the transmitted light L4R transmits through the beam splitter 92. In this case, an astigmatic aberration is generated in the transmitted light L4R. Thereafter, the transmitted light L4R is converged on the photo detector 63 to form a converging spot S13 of which the shape is the same as the converging spot S10 shown in FIGS. 29A to 29C, and the intensity of the transmitted light L4R is detected in the photo detector 63. Therefore, an information signal and servo signals such as a focus error signal and a tracking error signal are obtained in the same manner as in the seventh embodiment.

In contrast, in cases where a piece of information is recorded or reproduced on or from the second information medium 25, the diffracted light L5 is converged on the second information medium 25 to form the second converging spot S2. Thereafter, a beam of diffracted light L5R reflected by the second information medium 25 passes through the same optical path in the reverse direction, and a large part of the diffracted light L5R transmits through the hologram lens 26 without any diffraction. Therefore, the diffracted light L5R transmits on the incoming optical path differing from the outgoing optical path in the same manner as in the ninth embodiment. Thereafter, the diffracted light L5R is reflected by the beam splitter 54 and is converged by the converging lens 55 on the beam splitter 92 to form a converging spot on the reflection type of hologram 93 of the beam splitter 92. Therefore, all of the diffracted light L5R is diffracted and reflected by the hologram 93 to be converged on the photo detector 57. That is, the diffracted light L5R diffracted and reflected in the diffracted light generating region 93a of the hologram 93 is splitted into two beams and is converged on the detecting sections SE1 to SE6 of the sextant photodetector 59 in the photo detector 57 in the same manner as in the sixth embodiment. Also, the diffracted light L5R diffracted and reflected in the diffracted light generating region 93b of the hologram 93 is splitted into two beams, and the intensity of the diffracted light L5R is detected in the tracking photo-detectors 60a and 60d. Also, the diffracted light L5R diffracted and reflected in the diffracted light generating region 93c of the hologram 93 is splitted into two beams, and the intensity of the diffracted light L5R is detected in the tracking photo-detectors 60b and 60c. Therefore, an information signal and servo signals such as a focus error signal and a tracking error signal are obtained in the same manner as in the sixth embodiment.

In the tenth embodiment, because the transmitted light L4R transmits through the hologram lens 26 without any diffraction, the converging spot S13 formed on the photo detector 63 does not relate to a radiating point of the light source 52 in a mirror image. Therefore, the photo detector 57 for detecting the intensity of the diffracted light L5R and the photo detector 63 for detecting the intensity of the transmitted light L4R are required.

Accordingly, because the compound objective lens having two focal points is utilized in the optical head apparatus 91, pieces of information can be reliably recorded or reproduced on or from an information medium regardless of whether the information medium is thick or thin.

Also, because all of the diffracted light L5R is completely diffracted and reflected by the hologram 93 of the beam splitter 92, the diffracted light L5R can be utilized at high efficiency. Therefore, a signal-noise ratio of the signals obtained in the photo detector 57 can be enhanced.

An example of the utilization of the optical head apparatus 91 for various types of optical disks is described.

In cases where the optical head apparatus 91 is utilized for an optical disk device in which pieces of information recorded in a thin type of high density optical disk 23 are recorded or reproduced and pieces of information recorded in a thick type of optical disk 25 are exclusively reproduced, the diffraction efficiency of the hologram lens 26, 32 or 33 in the compound objective lens 29, 34, 45, 46 or 47 for changing a beam of light to a beam of first-order diffracted light is set to a value equal to or lower than 30%. Therefore, in cases where a piece of information recorded on the thick type of optical disk 25 is reproduced in the photo detector 57, a signal-noise ratio of each of the servo signals and the information signal obtained in the photo detector 57 can be enhanced because the diffracted light L5R transmitting through the hologram lens 26, 32 or 33 at a high transmission efficiency is utilized to obtain the servo signals and the information signal. In other words, a utilization efficiency of the incident light L3 can be enhanced when a piece of information recorded on the thick type of optical disk 25 is reproduced, so that the output power of the incident light L3 can be minimized. Also, even though a high intensity of the transmitted light L4 is required to record a piece of information on the high density optical disk 23, the recording of the information can be reliably performed without increasing the intensity of the incident light L3 because a transmission efficiency of the hologram lens 26, 32 or 33 for the incident light L3 is high. Also, in cases where a piece of information recorded on the high density optical disk 23 is reproduced in the photo detector 63, a signal-noise ratio of each signal obtained in the photo detector 63 can be enhanced because the transmission efficiency of the hologram lens 26, 32 or 33 for the light L3, L4R is high.

(Eleventh Embodiment)

An optical head apparatus with the compound objective lens 29, 34, 45, 46 or 47 in which the incident light L3 is efficiently utilized to obtain an information signal and servo signals is described with reference to FIGS. 40 to 42 according to an eleventh embodiment of the present invention. X1 and Y1 co-ordinates shown in FIGS. 40, 41 are utilized in common, and X, Y and Z co-ordinates shown in FIGS. 40, 42 are utilized in common.

Figure 40A:
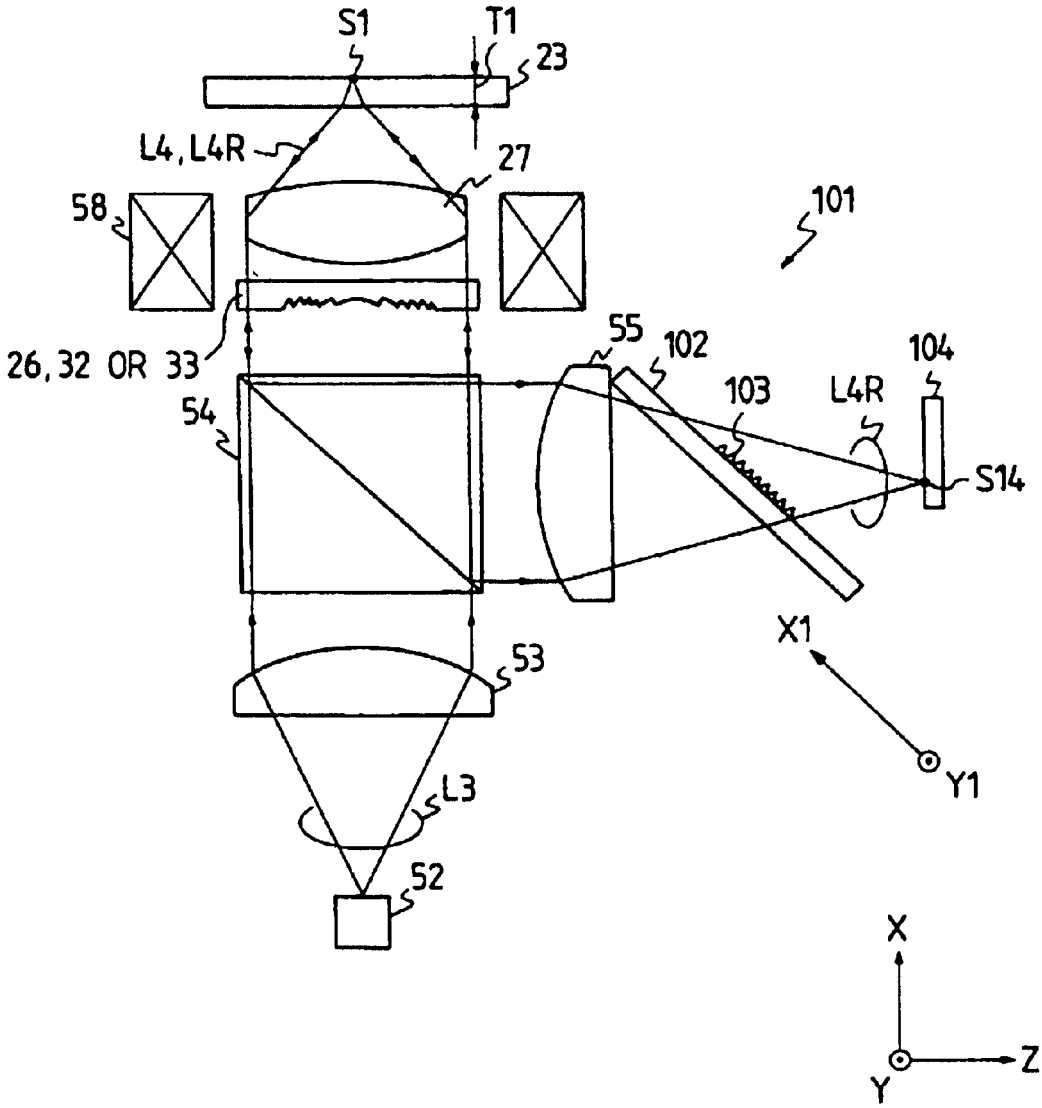
FIGS. 40A, 40B are respectively a constitutional view of an optical head apparatus according an eleventh embodiment.
Figure 40B:
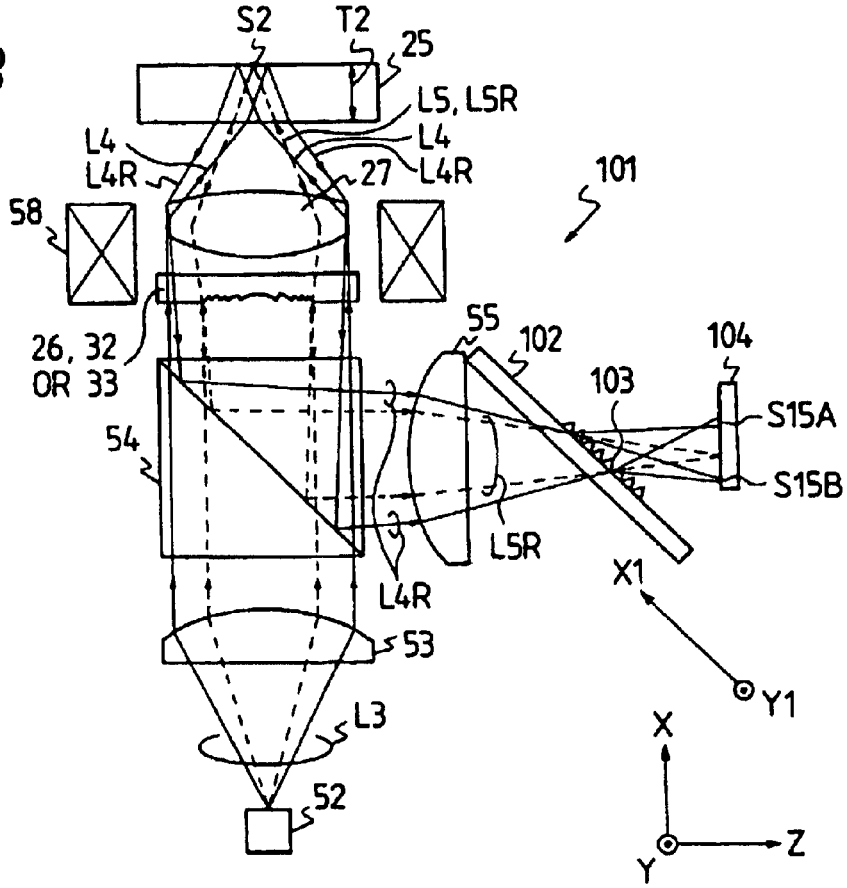
Figure 41:
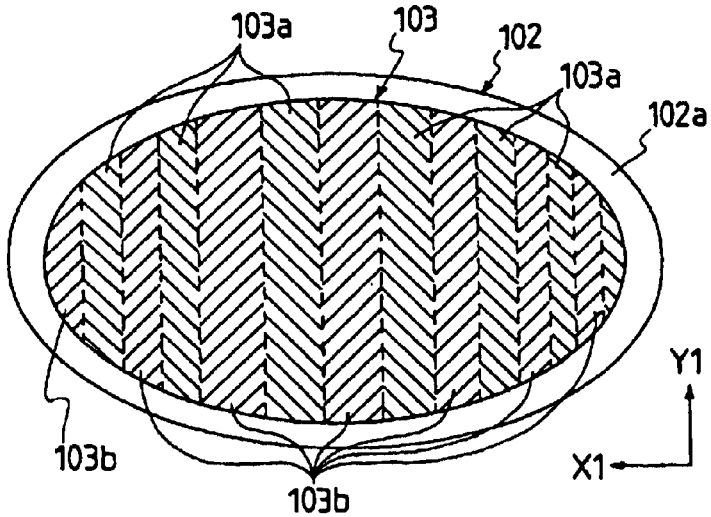
FIG. 41 is a plan view of a beam splitter having a reflection type of hologram utilized in the optical head apparatus shown in FIG. 38.

FIGS. 40A, 40B are respectively a constitutional view of an optical head apparatus according an eleventh embodiment. FIG. 41 is a plan view of a beam splitter having a reflection type of hologram utilized in the optical head apparatus shown in FIG. 38.

As shown in FIGS. 40A, 40B, an optical head apparatus 101 for recording or reproducing pieces of information on or from the information medium 23 or 25, comprises the light source 52, the collimator lens 53, the beam splitter 54, the compound objective lens 29 (or 34, 45, 46 or 47) composed of the hologram lens 26 (or 32 or 33) and the objective lens 27, the actuating unit 58, the converging lens 55, a beam splitter 102 having a transmission type of hologram 103 for transmitting the transmitted light L4R converged on the first information medium 23 and the diffracted light L5R converged on the second information medium 25 and diffracting the transmitted light L4R which is converged on the second information medium 25 in defocus, a photo detector 104 for detecting the intensity of the transmitted light L4R converged on the first information medium 23 to obtain servo signals and an information signal recorded in the first information medium 23, detecting in defocus the intensity of the diffracted light L5R to obtain an information signal recorded in the second information medium 25, and detecting the intensity of the transmitted light L4R converged on the second information medium 25 in defocus to obtain a focus error signal.

The beam splitter 102 is made of a plane parallel plate inclined to an optical path, so that an astigmatic aberration is generated in the light L4R, L5R passing through the beam splitter 102. Also, as shown in FIG. 41, the transmission type of hologram 103 is arranged at a center portion of the beam splitter 102, and a light transmitting region 102a is arranged at a peripheral portion of the beam splitter 102 to surround the hologram 103. The transmitted light L4R incident on the light transmitting region 102a transmits without any diffraction. The hologram 102 is partitioned into diffracted light generating regions 103a, 103b alternately arranged to detect a focus error signal according to the spot size detection method described in the sixth embodiment. That is, a grating pattern P10 is drawn in each of the diffracted light generating regions 103a, and a converging spot is formed by the transmitted light L4R diffracted in the regions 103a. Also, a grating pattern P11 is drawn in each of the diffracted light generating regions 103b, and another converging spot is formed by the transmitted light L4R diffracted in the regions 103b.

The photo detector 104 comprises the sextant photodetector 59 in which the detecting sections SE1, SE2, SE3, SE4, SE5 and SE6 are provided in the same manner as the photo detector 57.

In the above configuration, the transmitted light L4 and the diffracted light L5 are converged by the converging lens 27 in the same manner as in the sixth embodiment. Thereafter, in cases where a piece of information is recorded or reproduced on or from the first information medium 23, as shown in FIG. 40A, the transmitted light L4 is converged on the first information medium 23 to form the first converging spot S1. Thereafter, a beam of transmitted light L4R reflected by the first information medium 23 passes through the same optical path in the reverse direction. That is, the transmitted light L4R again transmits through the compound objective lens without any diffraction and is reflected by the beam splitter 54. Thereafter, the transmitted light L4R is converged by the converging lens 55, and a major part of the transmitted light L4R transmits through the beam splitter 103. In this case, an astigmatic aberration is generated in the transmitted light L4R. Thereafter, the transmitted light L4R is converged on the photo detector 104 to form a converging spot S14 of which the shape is the same as the converging spot S10 shown in FIGS. 29A to 29C, and the intensity of the transmitted light L4R is detected in the photo detector 104. Therefore, an information signal and servo signals such as a focus error signal and a tracking error signal are obtained in the same manner as in the seventh embodiment. In this case, because the position of the photo detector 104 detecting the transmitted light L4R relates to a radiation point of the light source 52 in a mirror image, the transmitted light L4R is converged on the photo detector 104 just in focus.

In contrast, in cases where a piece of information is recorded or reproduced on or from the second information medium 25, as shown in FIG. 40B, the diffracted light L5 is converged on the second information medium 25 to form the second converging spot S2. Thereafter, a beam of diffracted light L5R reflected by the second information medium 25 passes through the same optical path in the reverse direction and transmits through the hologram lens 26 without any diffraction. Therefore, the diffracted light L5R transmits on the incoming optical path differing from the outgoing optical path in the same manner as in the ninth embodiment. Thereafter, the diffracted light L5R is reflected by the beam splitter 54 and is converged by the converging lens 55. Thereafter, a major part of the diffracted light L5R transmits through the beam splitter 102, and the diffracted light L5R is converged on the photo detector 57. In this case, an astigmatic aberration is generated in the diffracted light L5R. Also, because the diffracted light L5R is not diffracted by the hologram lens 26 on the incoming optical path, the position of the photo detector 104 detecting the diffracted light L5R does not relate to the radiation point of the light source 52 in the mirror image. Therefore, the diffracted light L5R is converged on the photo detector 104 in defocus. However, because the entire intensity of the diffracted light L5R converged in defocus is detected in the photo detector 104, an information signal is obtained in the same manner as in the seventh embodiment.

Figure 42A:
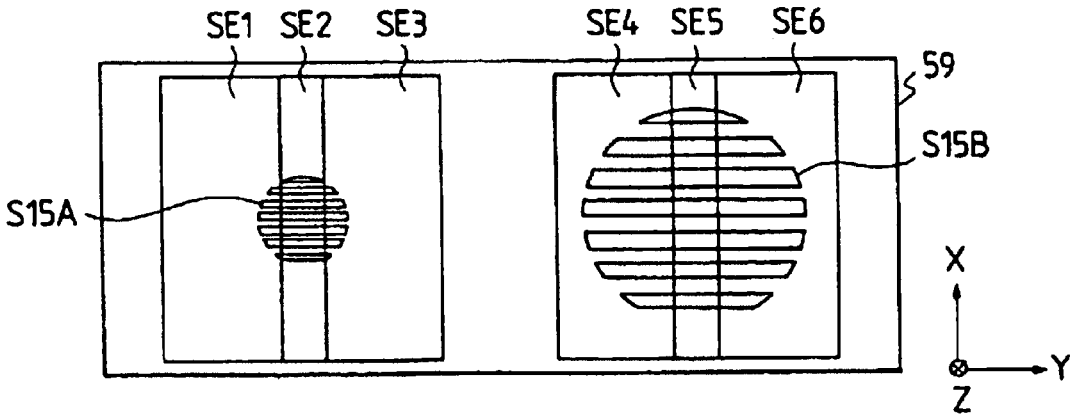
FIG. 42A and 42C respectively show a converging spot of first-order diffracted light radiated to detecting sections SE1, SE2 and SE3 of a sextant photo-detector shown in FIG. 24 and another converging spot of minus first-order diffracted light radiated to detecting sections SE4, SE5 and SE6 of the sextant photo-detector on condition that diffracted light is converged in defocus on a second information medium.
Figure 42B:
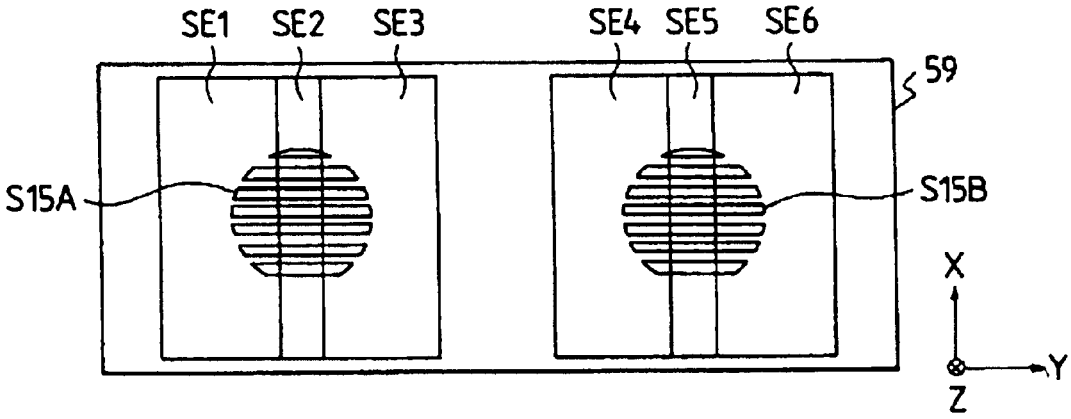
FIG. 42B shows a converging spot of first-order diffracted light radiated to the detecting sections SE1, SE2 and SE3 of a sextant photo-detector shown in FIG. 24 and another converging spot of minus first-order diffracted light radiated to the detecting sections SE4, SE5 and SE6 of the sextant photo-detector on condition that diffracted light is converged in focus on a second information medium.
Figure 42C:
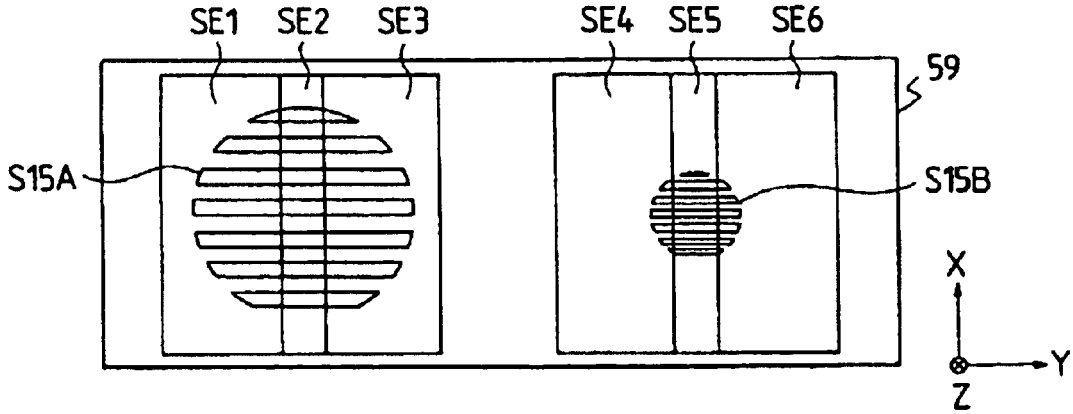

Also, the transmitted light L4 is converged on the second information medium 25 in defocus as shown in FIG. 40B. That is, the transmitted light L4 incident on the rear surface of the second information medium 25 is converged at the front surface of the second information medium 25. Thereafter, a beam of transmitted light L4R reflected at the front surface of the second information medium 25 again transmits through the compound objective lens without any diffraction and is reflected by the beam splitter 54. Thereafter, the transmitted light L4R is converged by the converging lens 55 on the beam splitter 102 to form a converging spot on the of hologram 103 of the beam splitter 102. Therefore, all of the transmitted light L4R is diffracted by the hologram 103 and is converged on the photo detector 104. That is, the transmitted light L4R diffracted in the diffracted light generating regions 103a of the hologram 103 is changed to a first spherical wave SW1 of which a focal point is placed at the front of the photo detector 104, and the transmitted light L4R diffracted in the diffracted light generating regions 103b of the hologram 103 is changed to a second spherical wave SW2 of which a focal point is placed at the rear of the photo detector 104. Thereafter, as shown in FIGS. 42A to 42C, the first spherical wave SW1 is converged on the detecting sections SE1 to SE3 of the sextant photo-detector 59 in the photo detector 104 to form a converging spot S15A, and the second spherical wave SW2 is converged on the detecting sections SE4 to SE6 of the sextant photo-detector 59 to form a converging spot S15B. Because the regions 103a, 103b are divided into many pieces, the converging spots S15A, S15B are respectively divided into many pieces.

In cases where the diffracted light L5 is converged on the information medium 25 in defocus, the converging spots S15A, S15B of the transmitted light L4R shown in FIGS. 42A, 42C are formed on the sextant photo-detector 59. In contrast, in cases where the diffracted light L5 is converged on the information medium 25 in focus, the converging spots S15A, S15B of the transmitted light L4R shown in FIG. 42B are formed on the sextant photo-detector 59. The intensity of the transmitted light L4R is detected in each of the detecting sections SE1 to SE6 of the sextant photo-detector 59 and is changed to electric current signals SC15 to SC20. Thereafter, a focus error signal $S_{f\theta}$ is obtained according to the spot size detection method by calculating an equation (11).

$$S_{f\theta}=(SC15+SC17-SC16)-(SC18+SC20-SC19) \quad (11)$$

Thereafter, the position of the compound objective lens is moved in a direction along an optical axis at high speed so as to minimize the absolute value of the focus error signal $S_{f\theta}$. Therefore, the focus error signal is obtained in the same manner as in the sixth embodiment.

Accordingly, because the compound objective lens having two focal points is utilized in the optical head apparatus 101, pieces of information can be reliably recorded or reproduced on or from an information medium regardless of whether the information medium is thick or thin.

Also, because all of the transmitted light L4R reflected by the second information medium 25 is completely diffracted by the hologram 103 of the beam splitter 102 to detect the focus error signal, the transmitted light L4R can be utilized at high efficiency. Therefore, a signal-noise ratio of the focus error signal obtained in the photo detector 104 can be enhanced.

Also, the information signal and the servo signals can be obtained in the photo detector 104 regardless of whether the information medium 23 or 25 is thin or thick. Therefore, the number of parts required to manufacture the optical head apparatus 101 can be reduced, and a small sized optical head apparatus can be manufactured at a low cost and in light weight even though pieces of information are recorded or reproduced on or from an information medium by utilizing the optical head apparatus 101 regardless of whether the information medium is thick or thin.

An example of the utilization of the optical head apparatus 101 for various types of optical disks is described.

In cases where the optical head apparatus 101 is utilized for an optical disk device in which pieces of information recorded in a thin type of high density optical disk 23 are recorded or reproduced and pieces of information recorded in a thick type of optical disk 25 are exclusively reproduced, the diffraction efficiency of the hologram lens 26, 32 or 33 in the compound objective lens 29, 34, 45, 46 or 47 is set to a value equal to or lower than 30%. Therefore, in cases where a piece of information recorded on the thick type of optical disk 25 is reproduced in the photo detector 104, a signal-noise ratio of each of the servo signals and the information signal obtained in the photo detector 104 can be enhanced because the diffracted light L5R transmitting through the hologram lens 26, 32 or 33 at a high transmission efficiency is utilized to obtain the information signal. In other words, a utilization efficiency of the incident light L3 can be enhanced when a piece of information recorded on the thick type of optical disk 25 is reproduced, so that the output power of the incident light L3 can be minimized. Also, even though a high intensity of the transmitted light L4 is required to record a piece of information on the high density optical disk 23, the recording of the information can be reliably performed without increasing the intensity of the incident light L3 because a transmission efficiency of the hologram lens 26, 32 or 33 for the incident light L3 is high. Also, in cases where a piece of information recorded on the high density optical disk 23 is reproduced in the photo detector 63, a signal-noise ratio of each signal obtained in the photo detector 63 can be enhanced because the transmission efficiency of the hologram lens 26, 32 or 33 for the light L3, L4R is high.

(Twelfth Embodiment)

An optical head apparatus with the compound objective lens 29M, 43, 45, 46 or 47 in which the incident light L3 is efficiently utilized to obtain an information signal and servo signals is described with reference to FIG. 43 according to a twelfth embodiment of the present invention.

Figure 43:
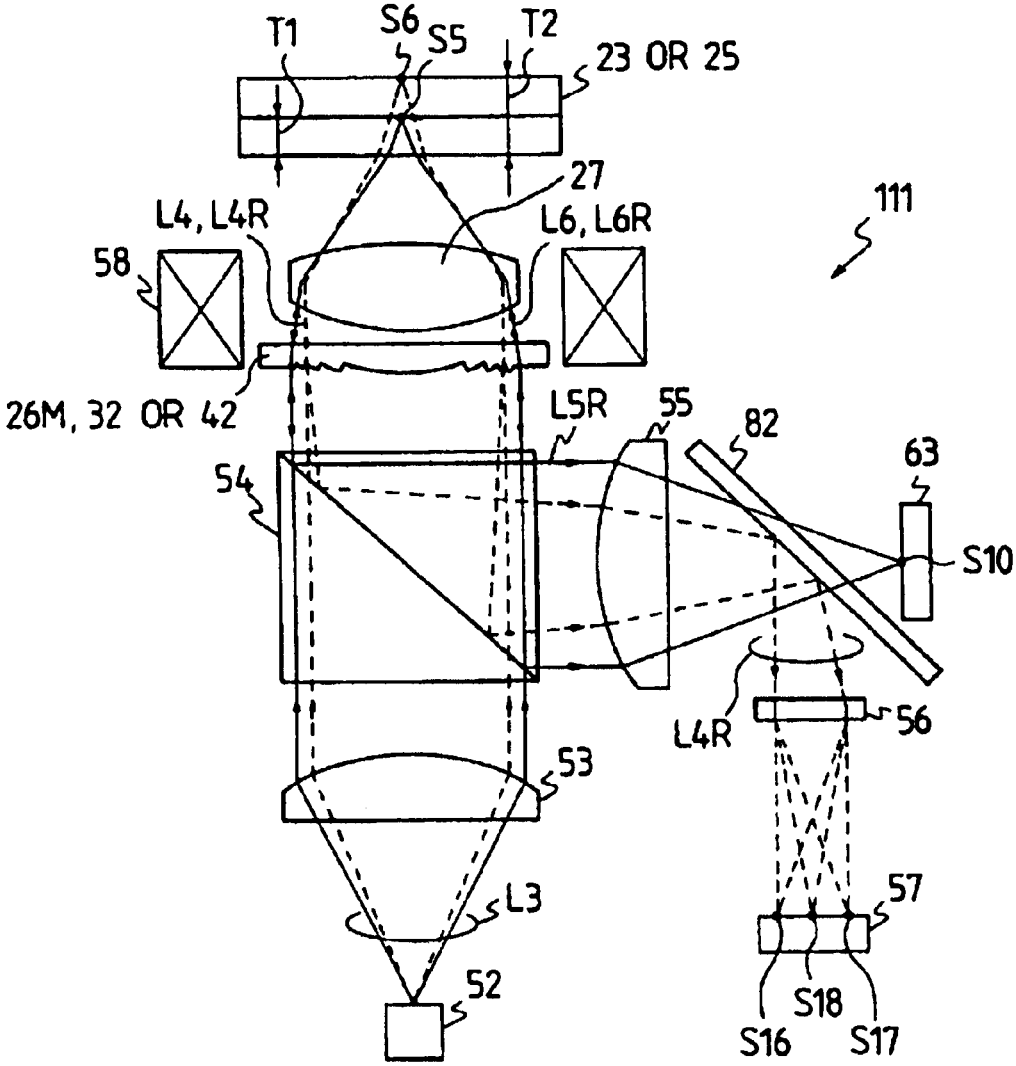
FIG. 43 is a constitutional view of an optical head apparatus according to a twelfth embodiment.

FIG. 43 is a constitutional view of an optical head apparatus according to a twelfth embodiment.

As shown in FIG. 43, an optical head apparatus 111 for recording or reproducing pieces of information on or from the information medium 23 or 25, comprises the light source 52, the collimator lens 53, the beam splitter 54, the compound objective lens 29M (or 43, 45, 46 or 47) composed of the hologram lens 42 (or 26M or 32) and the objective lens 27, the actuating unit 58, the converging lens 55, the beam splitter 82, the photo detector 63, the wavefront changing device 56, and the photo detector 57.

In the above configuration, a beam of incident light L3 radiated from the light source 52 is collimated in the collimator lens 53 and transmits through the beam splitter 54. Thereafter, a part of the incident light L3 transmits through the compound objective lens 29 without any diffraction, and a remaining part of the incident light L3 is diffracted.

Thereafter, in cases where a piece of information is recorded or reproduced on or from the first information medium 23, the diffracted light L6 is converged on the first information medium 23 to form the converging spot S5. That is, the diffracted light L6 is incident on the rear surface of the first information medium 23, and the converging spot S5 is formed on the front surface of the first information medium 23. Thereafter, a beam of diffracted light L6R reflected at the front surface of the first information medium 23 passes through the same optical path in the reverse direction, and a great part of the diffracted light L6R is again diffracted by the hologram lens 42. Therefore, the diffracted light L6R transmits on the incoming optical path agreeing with the outgoing optical path. Thereafter, the diffracted light L6R is reflected by the beam splitter 54 and is converged by the converging lens 55. Thereafter, a part of the diffracted light L6R transmits through the beam splitter 82. In this case, an astigmatic aberration is generated in the diffracted light L6R. Thereafter, the diffracted light L6R is converged on the photo detector 63 to form the converging spot S10 of which the shape is shown in FIGS. 29A to 29C, and the intensity of the diffracted light L6R is detected in the photo detector 63. Therefore, an information signal and servo signals such as a focus error signal and a tracking error signal are obtained in the same manner as in the seventh embodiment.

In contrast, in cases where a piece of information is recorded or reproduced on or from the second information medium 25, the transmitted light L4 is converged on the second information medium 25 to form the converging spot S6. That is, the transmitted light L4 is incident on the rear surface of the second information medium 25, and the converging spot S6 is formed on the front surface of the second information medium 25. Thereafter, a beam of transmitted light L4R reflected at the front surface of the second information medium 25 passes through the same optical path in the reverse direction. That is, the transmitted light L4R is collimated by the objective lens 27 on the incoming optical path. Thereafter, a great part of the transmitted light L4R is diffracted by the hologram lens 42. Therefore, the transmitted light L4R transmits on the incoming optical path differing from the outgoing optical path. Thereafter, the transmitted light L4R is reflected by the beam splitter 54 and is converged by the converging lens 55. Thereafter, a part of the transmitted light L4R is reflected by the beam splitter 82. Thereafter, the wavefront of a great part of the transmitted light L4R is changed by the wavefront changing unit 56, and the great part of the transmitted light L4R is converged on the photo detector 57 to form converging spots S16, S17. Therefore, an information signal and servo signals such as a focus error signal and a tracking error signal are obtained in the same manner as in the sixth embodiment. Also, a remaining part of the transmitted light L4R not changed its wavefront by the wavefront changing unit 56 is converged on the photo detector 57 to form the converging spot S18.

In the twelfth embodiment, because the transmitted light L4R is diffracted by the hologram lens 42 on the incoming optical path, the converging spot S18 formed on the photo detector 57 does not relate to a radiation point of the light source 52 in a mirror image, while the converging spot S10 formed on the photo detector 63 relates to the radiation point of the light source 52 in the mirror image. In other words, a focal point of the transmitted light L4R converged by the converging lens 55 differs from that of the diffracted light L6R converged by the converging lens 55. Therefore, the photo detector 57 for detecting the intensity of the transmitted light L4R and the photo detector 63 for detecting the intensity of the diffracted light L6R are required.

Accordingly, even though pieces of information are recorded or reproduced on or from an information medium, the information can be reliably recorded or reproduced on or from the information medium regardless of whether the information medium is thick or thin.

Also, because the diffracted light L6 formed in the hologram lens 42 converges before the diffracted light L6 is incident on the objective lens 27, the distance in an optical axis direction between the converging spots S5, S6 can be lengthened to about 1 mm. Therefore, even though the transmitted light L4 (or the diffracted light L6) is converged on the converging spot S6 (or S5) in focus to record or read a piece of information, the light L6 (or L4) is not converged on the converging spot S6 (or S5) in focus to reduce the intensity of the light L6 (or L4) at the converging spot S6 (or S5). Accordingly, no adverse influence is exerted on the recording or reproduction of the information Also, because the hologram lens 42 functions as a convex lens for the first-order diffracted light L6, the occurrence of a chromatic aberration can be prevented in the optical head apparatus 111.

An example of the utilization of the optical head apparatus 111 for various types of optical disks is described.

In cases where the optical head apparatus 111 is utilized for an optical disk device in which pieces of information recorded in a thin type of high density optical disk 23 are recorded or reproduced and pieces of information recorded in a thick type of optical disk 25 are exclusively reproduced, the diffraction efficiency of the hologram lens 26M or 42 in the compound objective lens 29M, 43, 45, 46 or 47 for changing a beam of light to a beam of first-order diffracted light is set to a value equal to or higher than 55%. Therefore. in cases where a piece of information recorded on the thick type of optical disk 25 is reproduced in the photo detector 57, a signal-noise ratio of each of the servo signals and the information signal obtained in the photo detector 57 can be enhanced because the transmitted light L4R diffracted by the hologram lens 26M or 42 at a high diffraction efficiency is utilized to obtain the servo signals and the information signal. In other words, a utilization efficiency of the incident light L3 can be enhanced when a piece of information recorded on the thick type of optical disk 25 is reproduced, so that the output power of the incident light L3 can be minimized. Also, even though a high intensity of the diffracted light L6 is required to record a piece of information on the high density optical disk 23, the recording of the information can be reliably performed without increasing the intensity of the incident light L3 because the diffraction efficiency of the hologram lens 26M or 42 for the incident light L3 and the diffracted light L6R is high. Also, in cases where a piece of information recorded on the high density optical disk 23 is reproduced in the photo detector 63, a signal-noise ratio of each signal obtained in the photo detector 63 can be enhanced because the diffraction efficiency of the hologram lens 26M or 42 for the light L3, L6R is high.

(Thirteenth Embodiment)

An optical head apparatus with the compound objective lens 29M, 43, 45, 46 or 47 in which the incident light L3 is efficiently utilized to obtain an information signal and servo signals is described with reference to FIG. 44 according to a thirteenth embodiment of the present invention.

Figure 44:
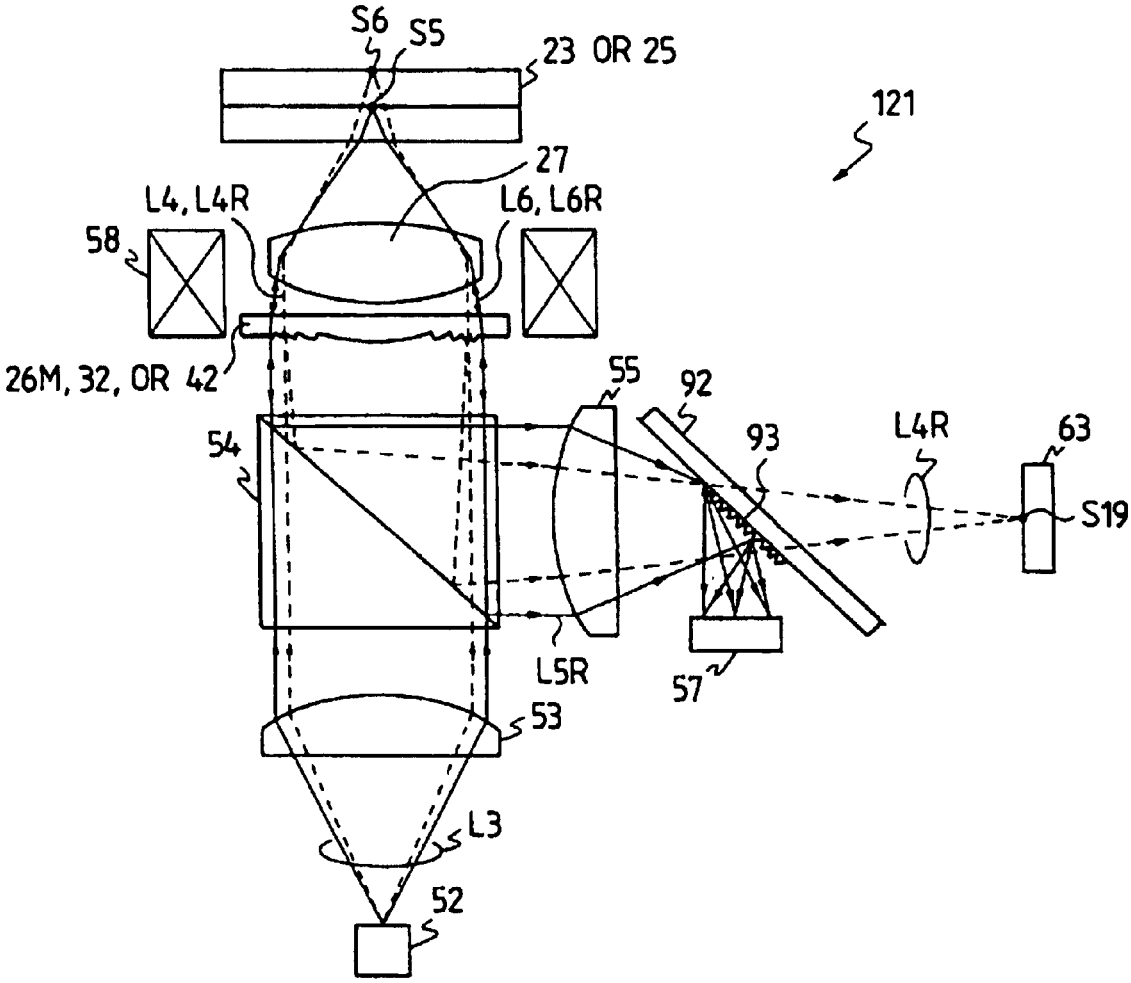
FIG. 44 is a constitutional view of an optical head apparatus according to a thirteenth embodiment.

FIG. 44 is a constitutional view of an optical head apparatus according to a thirteenth embodiment.

As shown in FIG. 44, an optical head apparatus 121 for recording or reproducing pieces of information on or from the information medium 23 or 25, comprises the light source 52, the collimator lens 53, the beam splitter 54, the compound objective lens 43 (or 29M, 45, 46 or 47) composed of the hologram lens 42 (or 26M or 32) and the objective lens 27, the actuating unit 58, the converging lens 55, the beam splitter 92 having the reflection type of hologram 93, the photo detector 63, and the photo detector 57.

In the above configuration, the transmitted light L4 and the diffracted light L6 are converged by the converging lens 27 in the same manner as in the twelfth embodiment. Thereafter, in cases where a piece of information is recorded or reproduced on or from the first information medium 23, the diffracted light L6 is converged on the first information medium 23 to form the converging spot S5. Thereafter, a beam of diffracted light L5R reflected by the first information medium 23 passes through the same optical path in the reverse direction, and a large part of the diffracted light L6R is diffracted by the hologram lens 42. Therefore, the diffracted light L6R transmits on the incoming optical path agreeing with the outgoing optical path in the same manner as in the twelfth embodiment. Thereafter, the diffracted light L6R is reflected by the beam splitter 54 and is converged by the converging lens 55 on the beam splitter 92 to form a converging spot on the reflection type of hologram 93 of the beam splitter 92. Therefore, all of the diffracted light L6R is diffracted and reflected by the hologram 93 to be converged on the photo detector 57 in the same manner as in the tenth embodiment. Therefore, an information signal and servo signals such as a focus error signal and a tracking error signal are obtained in the same manner as in the sixth embodiment.

In contrast, in cases where a piece of information is recorded or reproduced on or from the second information medium 25, the transmitted light L4 is converged on the second information medium 25 to form the converging spot S6. Thereafter, a beam of transmitted light L4R reflected by the second information medium 25 passes through the same optical path in the reverse direction. That is, a large part of the transmitted light L4R is collimated by the objective lens 27 on the incoming optical path. Thereafter, a great part of the transmitted light L4R is diffracted by the hologram Lens 42. Therefore, the transmitted light L4R transmits on the incoming optical path differing from the outgoing optical path in the same manner as in the twelfth embodiment. Thereafter, the transmitted light L4R is reflected by the beam splitter 54 and is converged by the converging lens 55. Thereafter, a large part of the transmitted light L4R transmits through the beam splitter 92. In this case, an astigmatic aberration is generated in the transmitted light L4R. Thereafter, the transmitted light L4R is converged on the photo detector 63 to form a converging spot S19 of which the shape is the same as the converging spot S10 shown in FIGS. 29A to 29C, and the intensity of the transmitted light L4R is detected in the photo detector 63. Therefore, an information signal and servo signals such as a focus error signal and a tracking error signal are obtained in the same manner as in the seventh embodiment.

In the thirteenth embodiment, because the transmitted light L4R is diffracted by the hologram lens 42, the converging spot S19 formed on the photo detector 63 does not relate to a radiation point of the light source 52 in a mirror image. Therefore, the photo detector 57 for detecting the intensity of the diffracted light L6R and the photo detector 63 for detecting the intensity of the transmitted light L4R are required.

Accordingly, because the compound objective lens having two focal points is utilized in the optical head apparatus 121, pieces of information can be reliably recorded or reproduced on or from an information medium regardless of whether the information medium is thick or thin.

Also, because the diffracted light L6 formed in the hologram lens 42 converges before the diffracted light L6 is incident on the objective lens 27, the distance in an optical axis direction between the converging spots S5, S6 can be lengthened to about 1 mm. Therefore, even though the transmitted light L4 (or the diffracted light L6) is converged on the converging spot S6 (or S5) in focus to record or read a piece of information, the light L6 (or L4) is not converged on the converging spot S6 (or S5) in focus to reduce the intensity of the light L6 (or L4) at the converging spot S6 (or S5). Accordingly, no adverse influence is exerted on the recording or reproduction of the information Also, because the hologram lens 42 functions as a convex lens for the first-order diffracted light L6, the occurrence of a chromatic aberration can be prevented in the optical head apparatus 121.

An example of the utilization of the optical head apparatus 121 for various types of optical disks is described.

In cases where the optical head apparatus 121 is utilized for an optical disk device in which pieces of information recorded in a thin type of high density optical disk,23 are recorded or reproduced and pieces of information recorded in a thick type of optical disk 25 are exclusively reproduced, the diffraction efficiency of the hologram lens 26M or 42 in the compound objective lens 29M, 43, 45, 46 or 47 for changing a beam of light to a beam of first-order diffracted light is set to a value equal to or higher than 70%. Therefore, in cases where a piece of information recorded on the thick type of optical disk 25 is reproduced in the photo detector 57, a signal-noise ratio of each of the servo signals and the information signal obtained in the photo detector 57 can be enhanced because the transmitted light L4R diffracted by the hologram lens 26M or 42 at a high diffraction efficiency is utilized to obtain the servo signals and the information signal. In other words, a utilization efficiency of the incident light L3 can be enhanced when a piece of information recorded on the thick type of optical disk 25 is reproduced, so that the output power of the incident light L3 can be minimized. Also, even though a high intensity of the diffracted light L6 is required to record a piece of information on the high density optical disk 23, the recording of the information can be reliably performed without increasing the intensity of the incident light L3 because the diffraction efficiency of the hologram lens 26M or 42 for the incident light L3 and the diffracted light L6R is high. Also, in cases where a piece of information recorded on the high density optical disk 23 is reproduced in the photo detector 63, a signal-noise ratio of each signal obtained in the photo detector 63 can be enhanced because the diffraction efficiency of the hologram lens 26M or 42 for the light L3, L6R is high.

(Fourteenth Embodiment)

An optical head apparatus in which noises included in an information signal are reduced is described with reference to FIGS. 45, 46 according to a fourteenth embodiment of the present invention.

Figure 45:
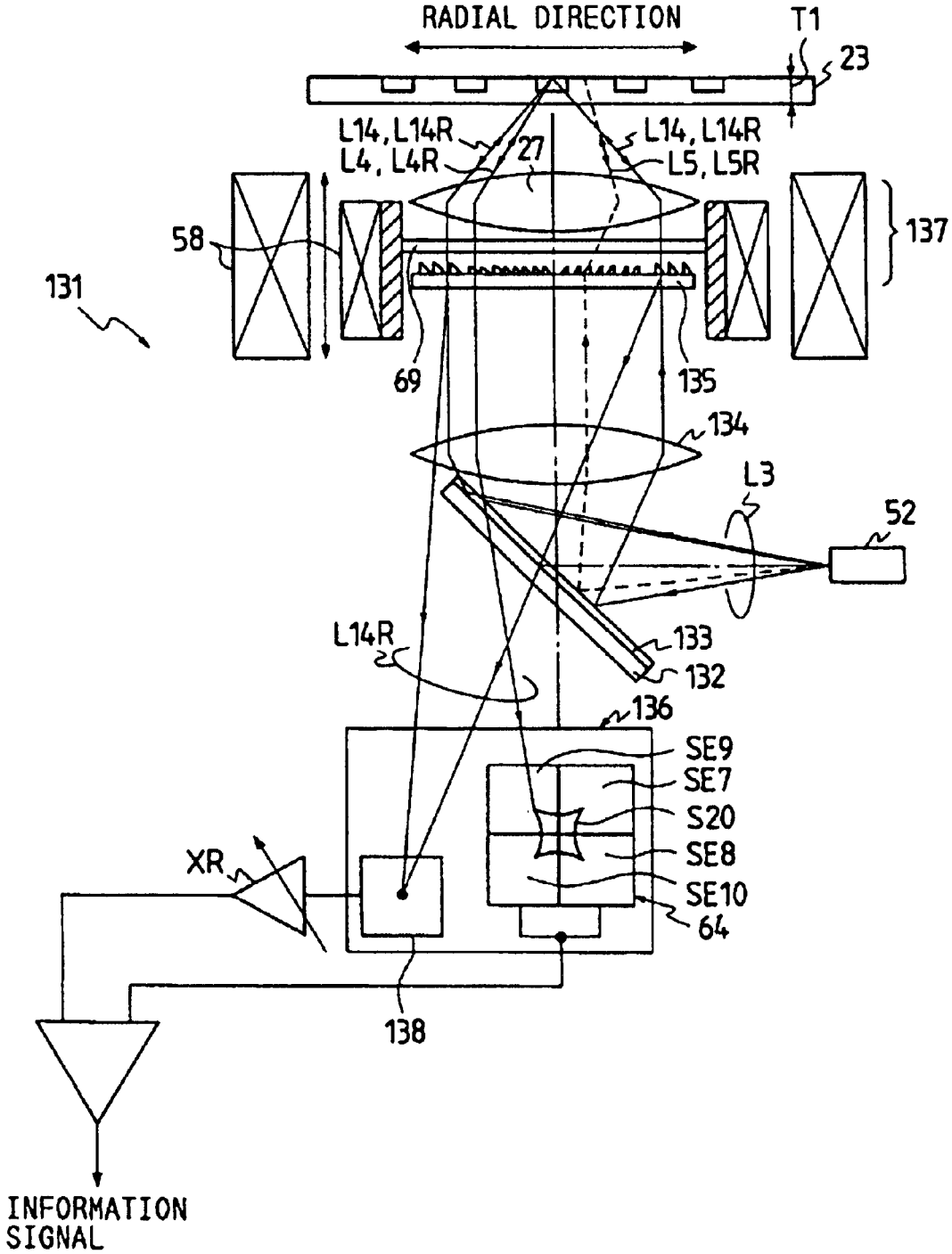
FIG. 45 is a constitutional view of an optical head apparatus according to a fourteenth embodiment.

FIG. 45 is a constitutional view of an optical head apparatus according to a fourteenth embodiment. FIG. 46 is a plan view of a hologram lens utilized in the optical head apparatus shown in FIG. 45.

As shown in FIG. 45, an optical head apparatus 131 for recording or reproducing pieces of information on or from the information medium 23 or 25, comprises the light source 52, a beam splitter 132 having a polarizing separation film 133 on its surface for reflecting the incident light L3 radiated from the light source 52 on an outgoing optical path and transmitting through the light L4R or L5R reflected on the information medium 23 or 25 on an incoming optical path, a collimator lens 134 for collimating the incident light L3 on the outgoing optical path and converging the light L4R or L5R on the incoming optical path, a hologram lens 135 for transmitting a part of the incident light L3 without any diffraction and diffracting a remaining part of the incident light L3, the ¼–λ plate 69, the objective lens 27, the actuating unit 58, and a photo detector 136 for detecting the light transmitting through or diffracted by the hologram lens 135 on the incoming optical path.

Figure 46:
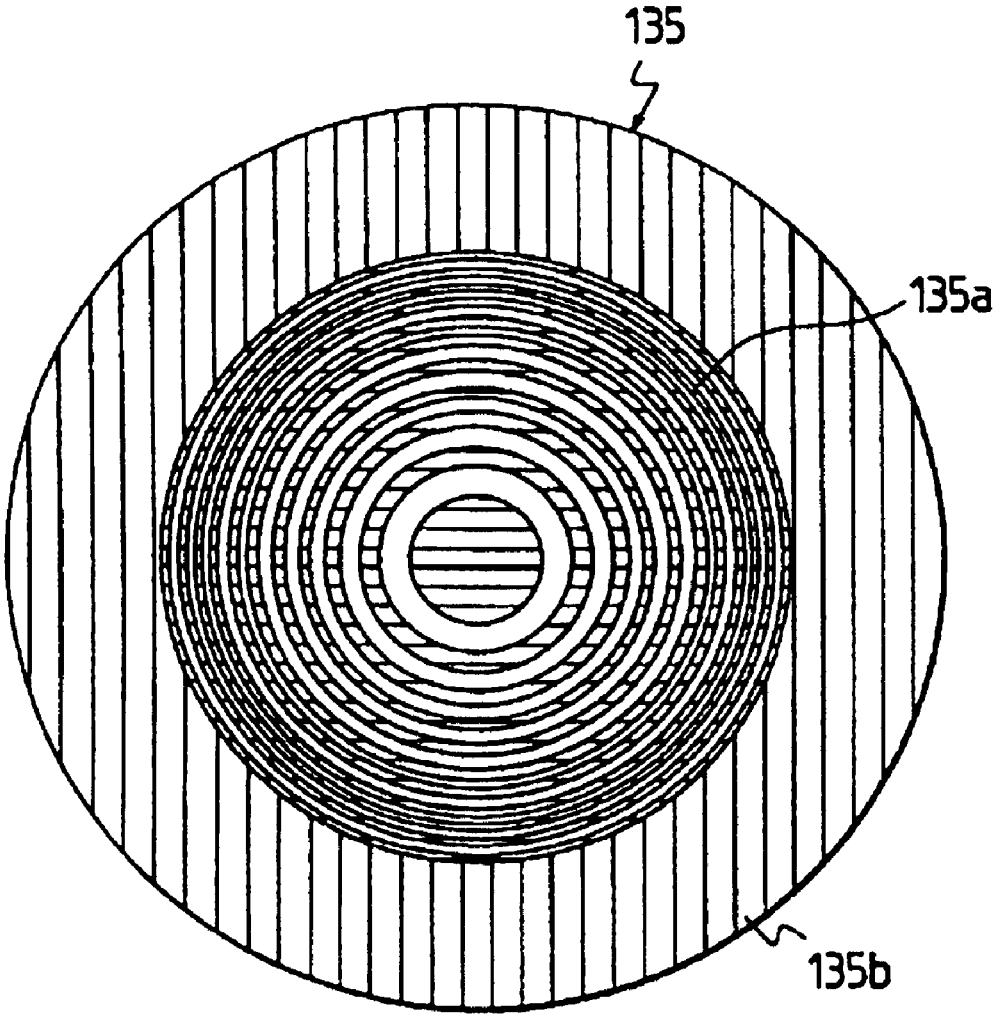
FIG. 46 is a plan view of a hologram lens utilized in the optical head apparatus shown in FIG. 45.

As shown in FIG. 46, the hologram lens 135 is formed by drawing the grating pattern P1 in a central region 135a of the transparent substrate 28 and a grating pattern P12 in a peripheral region 135b surrounding the central region 135a. The grating pattern P12 is drawn in a non-concentric shape. Because the grating pattern P1 are drawn in the hologram lens 135, a compound objective lens 137 having two focal points is composed of the hologram lens 135 and the objective lens 27. Light passing through the peripheral region 135b of the hologram lens 135 is detected by the photo detector 136 to cancel noises included in an information signal. An optical axis of the optical head apparatus 131 passes through a central point of the grating pattern P1 and a central axis of the objective lens 27.

The photo detector 136 comprises the quadrant photodetector 64 having the detecting sections SE7 to SE10 and a noise cancelling photo detector 138 for detecting the intensity of light passing through the peripheral region 135b of the hologram lens 135. Because the grating pattern P12 of the peripheral region 135b is drawn in the non-concentric shape, light diffracted in the peripheral region 135b is not converged on the detecting sections SE7 to SE10.

In the above configuration, the incident light L3 linearly polarized in a first direction is radiated from the light source 52 and is reflected by the beam splitter 132 because the polarizing separation film 133 functions as a mirror for the incident light L3 linearly polarized in the first direction. Therefore, the incident light L3 is directed in an upper direction and is collimated by the collimator lens 134. Thereafter, a part of the incident light L3 incident on the central region 135a of the hologram lens 135 transmits through the central region 135a without any diffraction to form the transmitted light L4, and a remaining part of the incident light L3 incident on the central region 135a of the hologram lens 135 is diffracted in the central region 135a to form the diffracted light L5. Also, a part of the incident light L3 incident on the peripheral region 135b of the hologram lens 135 transmits through the peripheral region 135b without any diffraction to form a beam of noise cancelling light L14. Thereafter, the light L4, L5 and L14 pass through the ¼–λ plates so that the light L4, L5 and L14 linearly polarized in the first direction is changed to the light L4, L5 and L14 circularly polarized. Thereafter, the light L4, L5 and L14 are converged by the converging lens 27.

Thereafter, in cases where a piece of information is recorded or reproduced on or from the first information medium 23 (or the second information medium 25), the transmitted light L4 (or the diffracted light L5) is converged on the information medium 23 (or 25) to form the converging spot S1 (or S2). Thereafter, a beam of transmitted light L4R (or a beam of diffracted light L5R) reflected by the information medium 23 (or 25) passes through the same optical path in the reverse direction. That is, the transmitted light L4R (or the diffracted light L5R) is circularly polarized in reverse and again passes through the converging lens 27 and the ¼–λ plate 69. Therefore, the light L4R (or L5R) is linearly polarized in a second direction perpendicular to the first direction. Thereafter, a part of the transmitted light L4R transmits through the central region 135a of the hologram lens 135 without any diffraction, or a part of the diffracted light L5R is again diffracted in the central region 135a. Thereafter, the transmitted light L4R (or the diffracted light L5R) is converged by the collimator lens 134 and passes through the beam splitter 132 without any reflection because the polarizing separation film 133 functions as a transparent plate for the light L4R (or L5R) linearly polarized in the second direction. In this case, an astigmatic aberration is generated in the transmitted light L4R (or the diffracted light L5R) in the same manner as in the seventh embodiment. Thereafter, the transmitted light L4R (or the diffracted light L5R) is incident on the detecting sections SE7 to SE10 of the photo detector 136 to form a converging spot S20 of which the shape is the same as the converging spot S10 shown in FIGS. 29A to 29C. The intensity of the transmitted light L4R (or the diffracted light L5R) is changed to electric current signals SC21 to SC24 in the detecting sections SE7 to SE10. Therefore, servo signals such as a focus error signal and a tracking error signal are obtained in the same manner as in the seventh embodiment, so that the position of the compound objective lens 137 is adjusted to converge the transmitted light L4 (or the diffracted light L5) on the information medium 23 (or 25) in focus. Also, an information signal expressing a piece of information recorded on the information medium 23 (or 25) is obtained according to an equation (12).

$$S_{in}=SC21+SC22+SC23+SC24 \quad (12)$$

Also, the noise cancelling light L14 is converged on the information medium 23 to form a converging spot surrounding the converging spot S1. Thereafter, a beam of noise cancelling light L14R reflected by the first information medium 23 passes through the same optical path in the reverse direction. That is, the noise cancelling light L14R again passes through the converging lens 27 and the ¼–λ plate 69, and a part of the noise cancelling light L14R is diffracted and converged in the peripheral region 135b of the hologram lens 135 and is incident on the noise cancelling photo detector 138. In the photo detector 138, an output signal SC25 is generated according to the intensity of the noise cancelling light L14R. Thereafter, a noise cancelled information signal $S_{nc}$ expressing a piece of information recorded on the first information medium 23 is obtained by adding all of the signals according to an equation (13):

$$S_{nc}=(SC21+SC22+SC23+SC24)+R\times SC25 \quad (13),$$

where the symbol R is a weighting factor.

In this case, because the term R×SC25 is added to obtain the information signal $S_{nc}$, inverse influence of noises included in the term (SC21+SC22+SC23+SC24) on the noise cancelled information signal $S_{nc}$ can be reduced. The reason is described.

As is well known (for example, Japanese Patent Gazette No. 22452 of 1990 laid open to public inspection on Jul. 23, 1985 under Provisional Publication No. 138748 of 1985 and Published Unexamined Patent Application No. 131245 of 1986), signals expressing pieces of information recorded on an optical disk shifts to a higher frequency as the density of the information recorded becomes high. Also, the amplitude of a signal having a high frequency becomes low as compared with that of a signal having a low frequency in cases where the signals are produced according to light passing through a central region of a hologram lens. In contrast, the amplitude of a signal having a high frequency is emphasized in cases where the signal is produced according to light passing through a peripheral region of the hologram lens. Therefore, in cases where the information signal $S_{nc}$ is obtained according to the equation (13), high frequency components included in the information signal $S_{nc}$ is emphasized, and low frequency noise components included in the term (SC21+SC22+SC23+SC24) are comparatively reduced. As a result, a signal-noise ratio in the information signal $S_{nc}$ can be enhanced.

Accordingly, because the compound objective lens having two focal points is utilized in the optical head apparatus 131, pieces of information can be reliably recorded or reproduced or or from an information medium regardless of whether the information medium is thick or thin.

Also, even though pieces of information are densely recorded in a thin type of high density optical disk represented by the first information medium 23, the information signal $S_{nc}$ can be reliably reproduced at a high signal-noise ratio.

Also, because the intensity of the light L4R or L5R incident on the detecting sections SE7 to SE10 of the photo detector 136 is reduced by converging the noise cancelling light L14R on the photo detector 138, a positioning accuracy of the photo detector 136 can be coarsely lowered to 1/100.

Also, in cases where the grating pattern P12 of the peripheral region 135b functions as a lens for the incident light L3 diffracted in the peripheral region 135b, unnecessary diffracted light generated in the peripheral region 135b on the outgoing optical path forms a comparatively large converging spot in defocus on the first information medium 23. Therefore, pieces of information recorded on the first information medium 23 are read by the unnecessary diffracted light, and the information are treated as a piece of averaged information in the photo detector 136 even though the unnecessary diffracted light is incident on the photo detector 136. Accordingly, the information read by the unnecessary diffracted light does not adversely influence on the information signal $S_{nc}$ as a noise.

Also, in cases where a transmission efficiency of the peripheral region 135b of the hologram lens 135 is set to agree with another transmission efficiency of the central region 135a, secondary maxima (or side lobes) occurring around the converging spot S1 can be lowered as compared with the first embodiment. Accordingly, a signal-noise ratio in the information signal $S_{nc}$ can be enhanced.

(Fifteenth Embodiment)

An optical head apparatus in which noises included in an information signal are reduced is described with reference to FIGS. 47 to 49 according to a fifteenth embodiment of the present invention.

Figure 47:
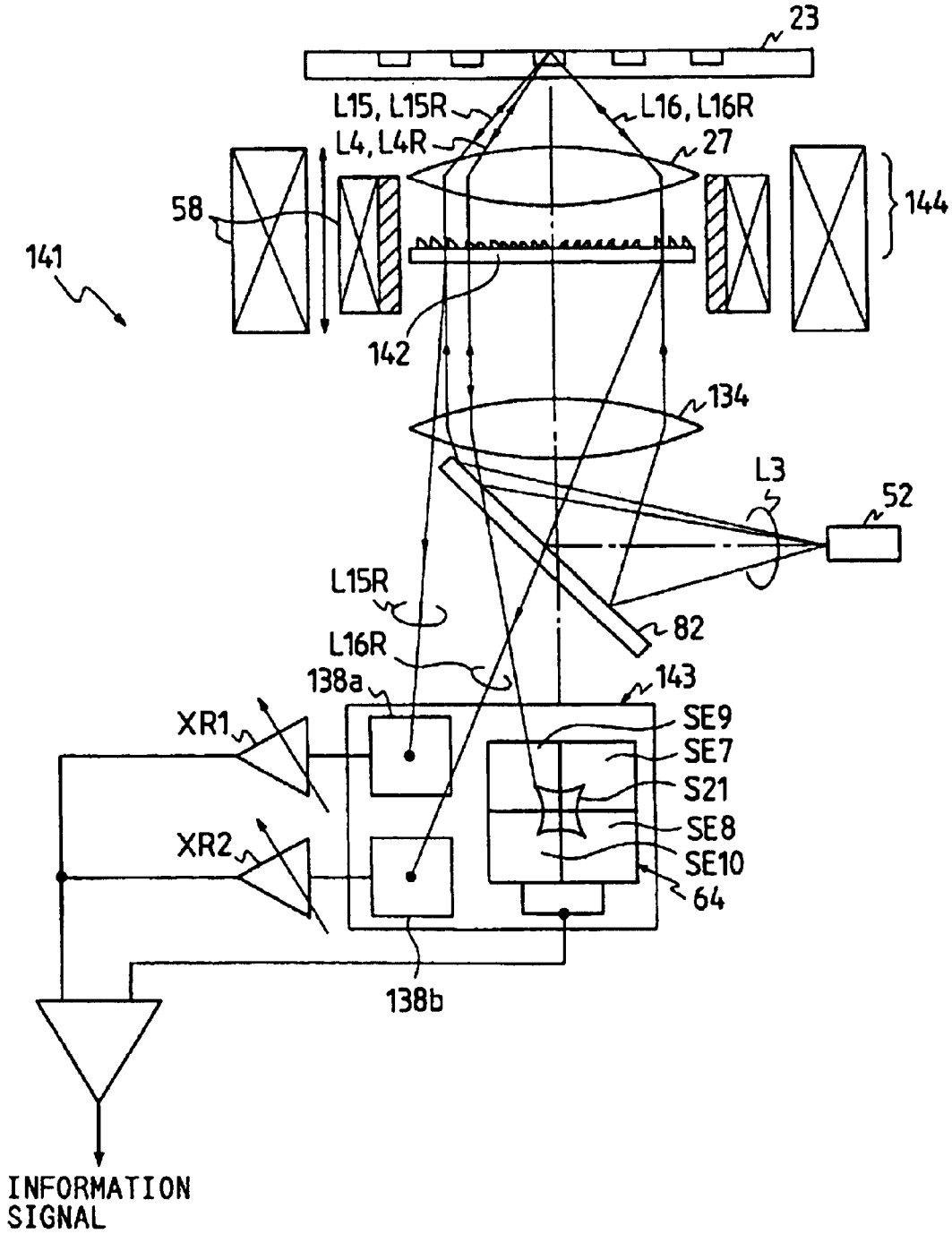
FIG. 47 is a constitutional view of an optical head apparatus according to a fifteenth embodiment.

FIG. 47 is a constitutional view of an optical head apparatus according to a fifteenth embodiment. FIG. 48 is a plan view of a hologram lens utilized in the optical head apparatus shown in FIG. 47.

As shown in FIG. 47, an optical head apparatus 141 for recording or reproducing pieces of information on or from the information medium 23 or 25, comprises the light source 52, the beam splitter 82, the collimator lens 134, a hologram lens 142 for transmitting a part of the incident light L3 without any diffraction and diffracting a remaining part of the incident light L3, the objective lens 27, the actuating unit 58, and a photo detector 143 for detecting the light transmitting through or diffracted by the hologram lens 142 on the incoming optical path.

Figure 48:
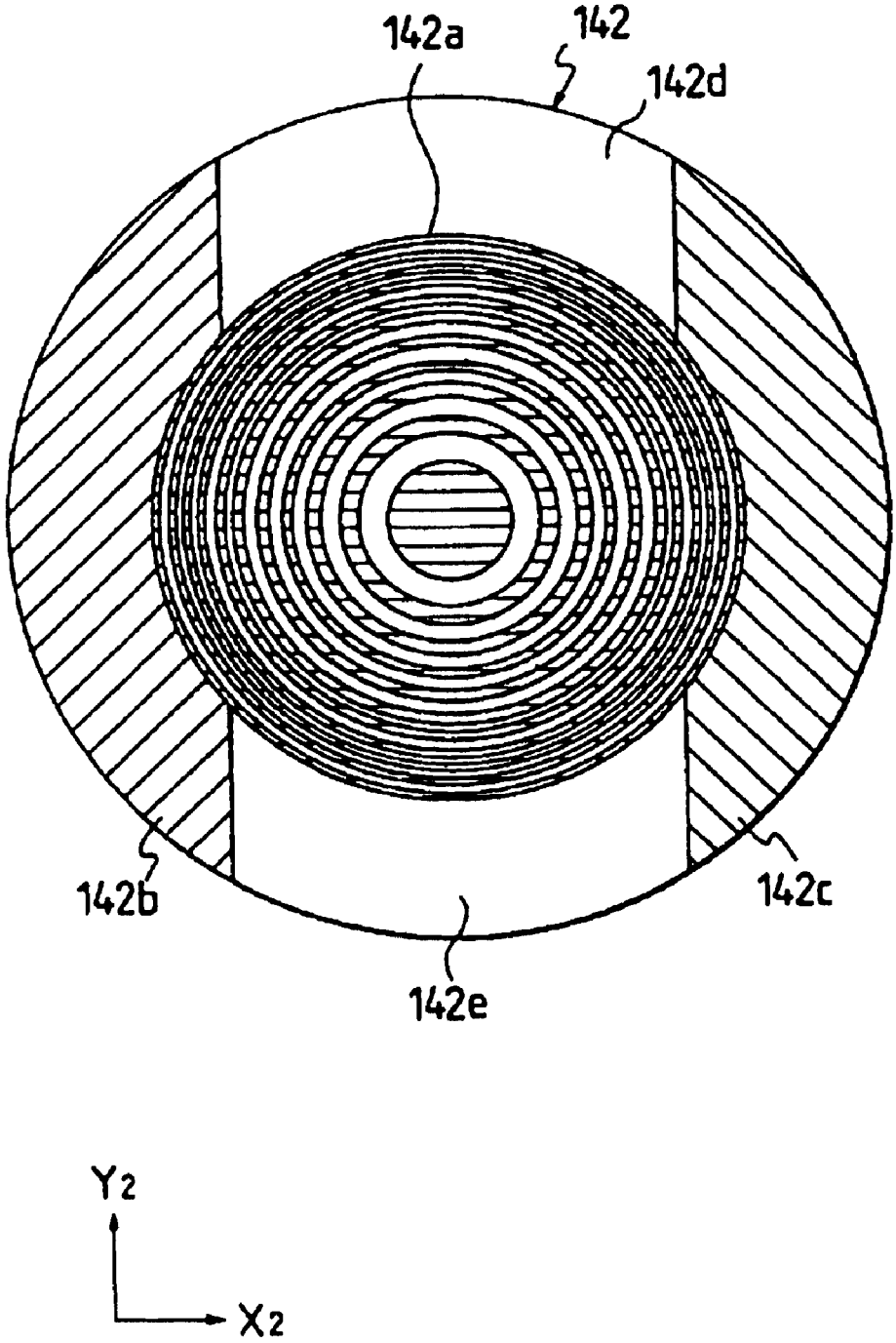
FIG. 48 is a plan view of a hologram lens utilized in the optical head apparatus shown in FIG. 47.

As shown in FIG. 48, the hologram lens 142 is partitioned into a central region 142a in which the grating pattern P1 is drawn, a pair of side peripheral regions 142b, 142c in which grating patterns P13, P14 are drawn to cancel noises included in an information signal, and a pair of no-designed regions 142d, 142e in which no grating pattern is drawn not to reduce the intensity of light. Because the grating pattern P1 are drawn in the hologram lens 135, a compound objective lens 144 having two focal points is composed of the hologram lens 142 and the objective lens 27. An optical axis of the optical head apparatus 141 passes through a central point of the grating pattern P1 and a central axis of the objective lens 27.

The photo detector 143 comprises the quadrant photodetector 64 having the detecting sections SE7 to SE10, a pair of noise cancelling photo detector 138a, 138b for detecting the intensity of light passing through the peripheral region 142b, 142c of the hologram lens 142.

In the above configuration, the transmitted light L4 (or the diffracted light L5) generated in the central region 142a of the hologram lens 142 is converged on the first information medium 23 (or the second information medium 25) in an outgoing optical path to form the converging spot S1 (or S2). Thereafter, the transmitted light L4R (or the diffracted light L5R) passes through the same optical path in the reverse direction. That is, the transmitted light L4R (or the diffracted light L5R) again passes through the converging lens 27, and a part of the transmitted light L4R transmits through the central region 142a of the hologram lens 142 without any diffraction or a part of the diffracted light L5R is again diffracted in the central region 142a. Thereafter, the transmitted light L4R (or the diffracted light L5R) is converged by the collimator lens 134 and passes through the beam splitter 82. In this case, an astigmatic aberration is generated in the transmitted light L4R (or the diffracted light L5R) in the same manner as in the seventh embodiment. Thereafter, the transmitted light L4R (or the diffracted light L5R) is incident on the detecting sections SE7 to SE10 of the photo detector 143 to form a converging spot S21 of which the shape is the same as the converging spot S10 shown in FIGS. 29A to 29C. The intensity of the transmitted light L4R (or the diffracted light L5R) is changed to electric current signals SC26 to SC29 in the detecting sections SE7 to SE10. Therefore, servo signals such as a focus error signal and a tracking error signal are obtained in the same manner as in the seventh embodiment, so that the position of the compound objective lens 144 is adjusted to converge the transmitted light L4 (or the diffracted light L5) on the information medium 23 (or 25) in focus. Also, an information signal recorded on the second information medium 25 is obtained according to an equation (14).

$$S_{in}=SC26+SC27+SC28+SC29 \quad (14)$$

Also, a part of the incident light L3 incident on the peripheral region 142b of the hologram lens 142 transmits through the peripheral region 142b without any diffraction to form a beam of noise cancelling light L15, and a part of the incident light L3 incident on the peripheral region 142c of the hologram lens 142 transmits through the peripheral region 142c without any diffraction to form a beam of noise cancelling light L16. Thereafter, the noise cancelling light L15, L16 are converged on the information medium 23 to form a converging spot surrounding the converging spot S1. Thereafter, beams of noise cancelling light L15R, L16R reflected by the first information medium 23 passes through the same optical path in the reverse direction. That is, the noise cancelling light L15R, L16R again passes through the converging lens 27. A part of the noise cancelling light L15R is diffracted and converged in the peripheral region 142b of the hologram lens 142 and is incident on the noise cancelling photo detector 138a, and a part of the noise cancelling light L16R is diffracted and converged in the peripheral region 142c of the hologram lens 142 and is incident on the noise cancelling photo detector 138b. In the photo detector 138a, an output signal SC30 is generated according to the intensity of the noise cancelling light L15R. Also, an output signal SC31 is generated according to the intensity of the noise cancelling light L16R in the photo detector 138b. Thereafter, a noise cancelled information signal $S_{nc}$ expressing the information recorded on the first information medium 23 is obtained by adding all of the signals according to an equation (15):

$$S_{nc}=(SC26+SC27+SC28+SC29)+R\times(SC30+SC31) \quad (15),$$

where the symbol R is a weighting factor.

Accordingly, because the compound objective lens having two focal points is utilized in the optical head apparatus 141, pieces of information can be reliably recorded or reproduced from an information medium regardless of whether the information medium is thick or thin.

Also, a signal-noise ratio in the information signal $S_{nc}$ can be enhanced in the same manner as in the fourteenth embodiment.

Also, even though pieces of information are densely recorded in a thin type of high density optical disk represented by the first information medium 23, the information signal $S_{nc}$ can be reliably reproduced at a high signal-noise ratio.

Also, because the intensity of the light L4R or L5R incident on the detecting sections SE7 to SE10 of the photo detector 143 is reduced by converging the noise cancelling light L15R, L16R on the photo detectors 138a, 138b, a positioning accuracy of the photo detector 143 can be coarsely lowered to 1/100.

Also, in cases where the grating patterns P13, P14 of the peripheral regions 142b, 142c functions as a lens for the incident light L3 diffracted in the peripheral region 142b, 142c, unnecessary diffracted light generated by diffracting the incident light L3 in the peripheral regions 142b, 142c on the outgoing optical path forms a comparatively large converging spot in defocus on the first information medium 23. Also, an numerical number of each of the peripheral regions 142b, 142c is lowered as compared with that of the region 135b in the fourteenth embodiment because the hologram lens 142 are partitioned into many fields. Therefore, the size of the converging spot of the unnecessary diffracted light formed in defocus on the first information medium 23 becomes larger than that in the fourteenth embodiment. As a result, more pieces of information recorded on the first information medium 23 are read by the unnecessary diffracted light, and the information are treated as a piece of averaged information in the photo detector 143 even though the unnecessary diffracted light is incident on the photo detector 143. Accordingly, the information read by the unnecessary diffracted light is moreover averaged, and the averaged information does not adversely influence on the information signal $S_{nc}$ as a noise.

Figure 49A:
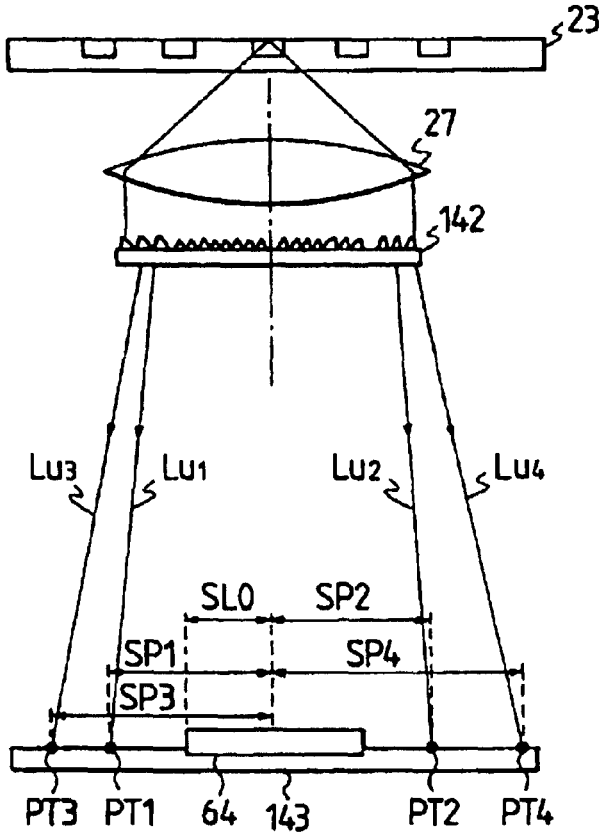
FIGS. 49A, 49B respectively show a positional relation between unnecessary light occurring in the hologram lens shown in FIG. 48 and a photo detector shown in FIG. 47.
Figure 49B:
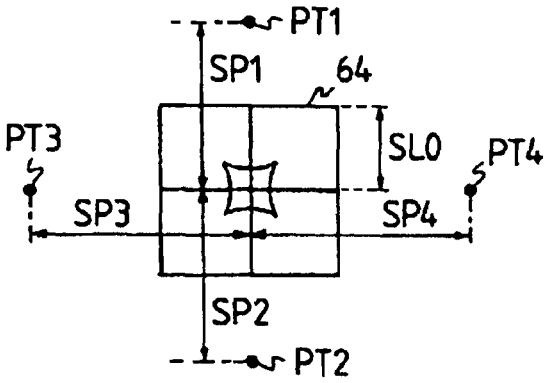

Also, as shown in FIGS. 49A, 49B, the unnecessary diffracted light can be prevented from being incident on the photo detector 64 in which each of the detecting sections SE7 to SE10 has SL0 square in size. In detail, in cases where light generated in the peripheral region 142c on the outgoing optical path is again diffracted in the peripheral region 142b to form a beam of unnecessary diffracted light $Lu_1$, the light $Lu_1$ is converged on a first position PT1 spaced SP1 (SP1>SL0) from the center of the photo detector 64. In cases where light generated in the peripheral region 142b on the outgoing optical path is again diffracted in the peripheral region 142c to form a beam of unnecessary diffracted light $Lu_2$, the light $Lu_2$ is converged on a second position PT2 spaced SP2 (SP2>SL0) from the center of the photo detector 64. In cases where light generated in the peripheral regions 142b, 142c on the outgoing optical path are again diffracted in the same peripheral regions 142b, 142c to form beams of unnecessary diffracted light $Lu_3$, $Lu_4$, the light $Lu_3$, $Lu_4$ are converged on third and fourth position PT3, PT4 spaced SP3 (SP3>SL0), SP4 (SP4>SL0) from the center of the photo detector 64. Accordingly, the adverse influence of the unnecessary diffracted light $Lu_1$ to $Lu_4$ can be prevented.

In cases where the light source 52 is formed of a semiconductor laser, a far field pattern of the incident light L3 incident on the hologram lens 142 is distributed in the Gaussian distribution as shown in FIG. 13A, and a cross-sectional beam profile of the incident light L3 distributed in the Gaussian distribution is in an elliptic shape. That is, a beam divergent angle (or a full angle at half maximum) of the incident light L3 in a perpendicular direction is larger than that in a horizontal direction. In this embodiment, the perpendicular direction of the incident light L3 is directed in an X2 direction shown in FIG. 48, and the horizontal direction of the incident light L3 is directed in a Y2 direction shown in FIG. 48. In this case, because a transmission efficiency of the regions 142b, 142c for the incident light L3 is smaller than that of the regions 142d, 142e, the intensity of the incident light L3 transmitting through the hologram lens 142 without any diffraction is largely reduced in the perpendicular direction as compared with that in the horizontal direction. Therefore, the cross-sectional beam profile of the incident light L3 is corrected to a circular shape in the hologram lens 142. That is, the converging spot S1 formed on the first information medium 23 is corrected to the circular shape. Accordingly, secondary maxima (or side lobes) occurring around the converging spot S1 can be lowered, and a signal-noise ratio of the information signal $S_{nc}$ can be enhanced.

In the fifteenth embodiment, the noise cancelled information signal $S_{nc}$ is obtained according to the equation (15). However, it is preferred that the noise cancelled information signal $S_{nc}$ be obtained according to the equation (16):

$$S_{nc}=(SC26+SC27+SC28+SC29)+(R1\times SC30+R2\times SC31) \quad (16),$$

where the symbols R1, R2 are weighting factors. In this case, the noises included in the information can be moreover reduced.

(Sixteenth Embodiment)

An optical head apparatus manufactured in a small size and stably operated is described with reference to FIGS. 50, 51 according to a sixteenth embodiment of the present invention.

Figure 50:
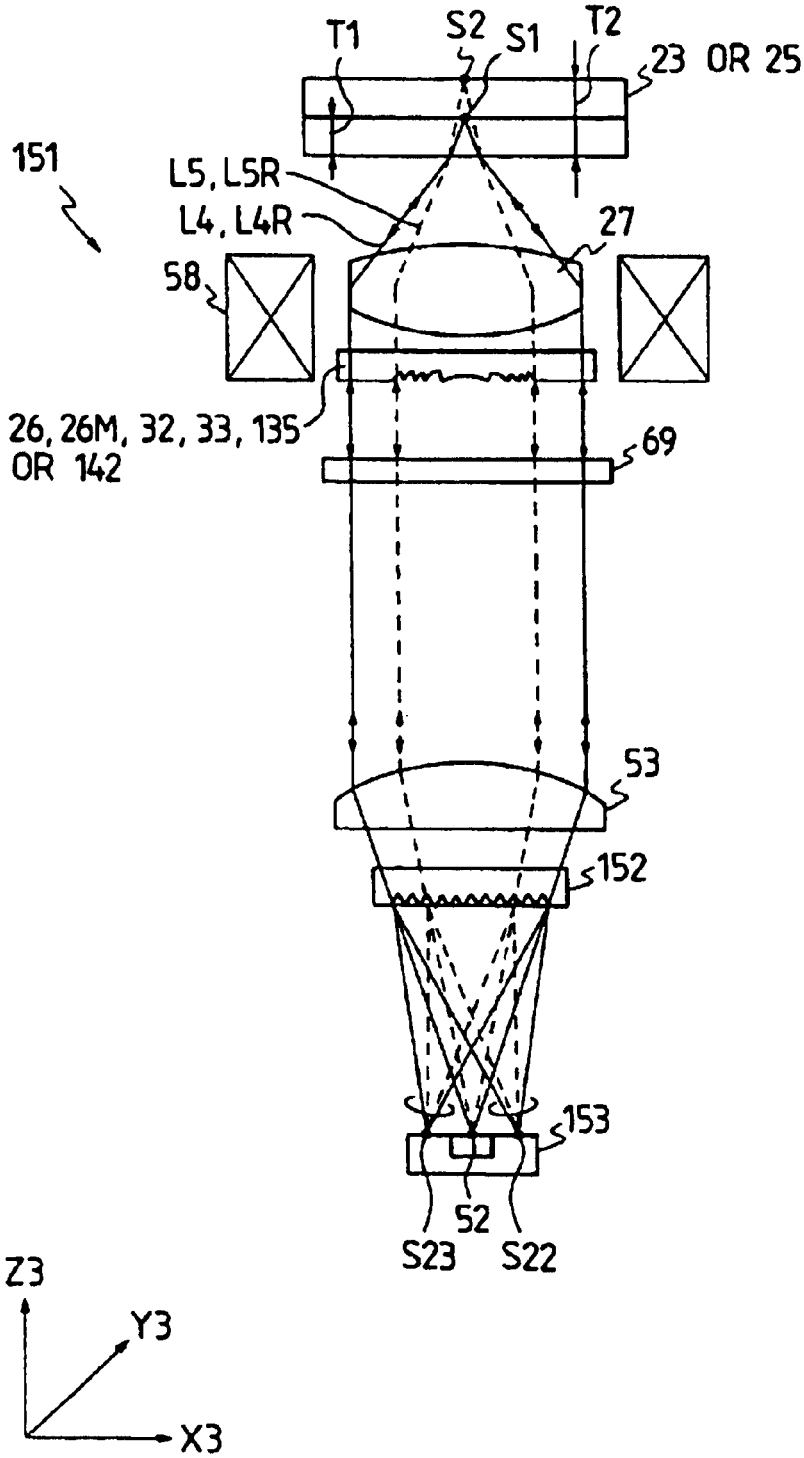
FIG. 50 is a constitutional view of an optical head apparatus according to a sixteenth embodiment.

FIG. 50 is a constitutional view of an optical head apparatus according to a sixteenth embodiment. FIG. 51 is a diagonal view of a light source and photo detectors utilized in the optical head apparatus shown in FIG. 50.

As shown in FIG. 50, an optical head apparatus 151 for recording or reproducing pieces of information on or from the information medium 23 or 25, comprises the light source 52 for radiating the incident light L3 linearly polarized in a non-diffracting direction parallel to an X3 axis, an holographic element 152 for transmitting through the incident light L3 without any diffraction on an outgoing optical path and diffracting the transmitted light L4R or the diffracted light L5R linearly polarized in a diffracting direction parallel to a Y3 axis on an incoming optical path, the collimator lens 53, the ¼–λ plate 69, the hologram lens 26 (or 26M, 32, 33, 42, 135 or 142), the objective lens 27, the actuating unit 58, and a photo detector 153 for detecting the intensity of the light L4R or L5R diffracted by the holographic element 152.

Figure 51:
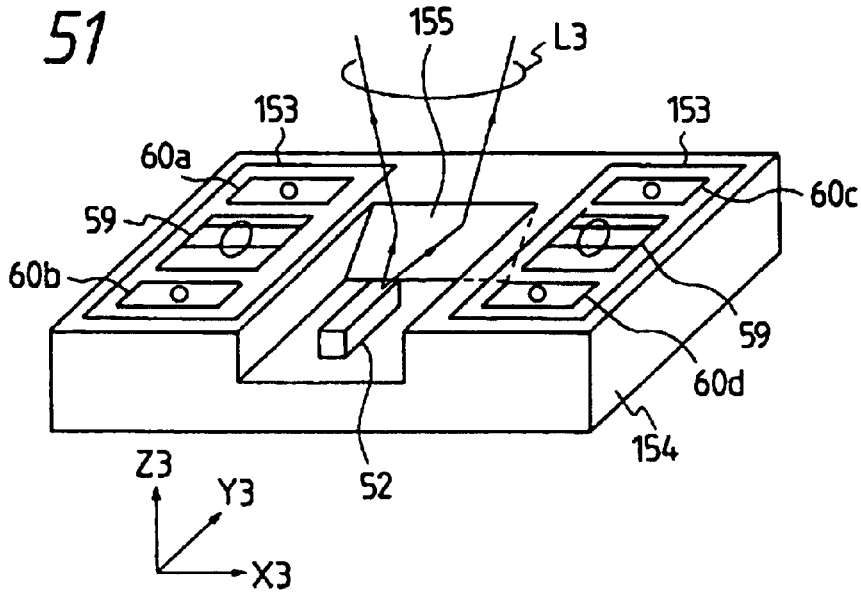
FIG. 51 is a diagonal view of a light source and photo detectors utilized in the optical head apparatus shown in FIG. 50.

As shown in FIG. 51, the light source 52 and the photo detector 153 are located on a substrate 154 to precisely fix a relative position between the light source 52 and the photo detector 153. The photo detector 153 comprises the sextant photo-detector 59 having the detecting sections SE1 to SE6 and the tracking photo-detectors 60a to 60d. Also, a mirror element 155 is located on the substrate 154 to direct the incident light L3 radiated from the light source 52 in a Z3 direction.

The holographic element 152 is produced by proton-exchange surface parts of a lithium niobate substrate or by utilizing a liquid crystal cell, as is described in Provisional Publication No. 189504/86 (S61-189504) and Provisional Publication No. 241735/88 (S63-241735). Therefore, light linearly polarized in a non-diffracting direction parallel to an X3 axis transmits through the holographic element 152 without any diffraction. In contrast, light linearly polarized in a diffracting direction parallel to a Y3 axis which is perpendicular to the X3 axis is diffracted by the holographic element 152.

In the above configuration, the incident light L3 linearly polarized in a non-diffracting direction parallel to an X3 axis is radiated from the light source 52 and transmits through the holographic element 152 without any diffraction. Thereafter, the incident light L3 is collimated by the collimator lens 53, and the incident light L3 linearly polarized is changed to the incident light L3 circularly polarized by the ¼–λ plate 69. Thereafter, a part of the incident light L3 transmits through the hologram lens 26 without any diffraction to form the transmitted light L4, and a remaining part of the incident light L3 is diffracted by the hologram lens 26 to form the diffracted light L5. Thereafter, the light L4, L5 are converged by the objective lens 27, and the converging spot S1 of the transmitted light L4 (or the converging spot S2 of the diffracted light L5) is formed on the first information medium 23 (or the second information medium 25). When the light L4 or L5 is reflected by the information medium 23 (or 25) and is changed to the light L4R (or L5R), a rotational direction of the circular polarization in the light L4 is reversed. Therefore, the light L4R (or L5R) having the reversed circular polarization passes through the same optical path in the opposite direction. That is, the transmitted light L4R (or the diffracted light L5R) again passes through the converging lens 27, and a part of the transmitted light L4R transmits through the hologram lens 142 without any diffraction or a part of the diffracted light L5R is again diffracted by the hologram lens 142. Thereafter, the transmitted light L4R (or the diffracted light L5R) circularly polarized in reverse is changed to the light L4R (or L5R) linearly polarized in a diffracting direction parallel to a Y3 axis by the ¼–λ plate 69. Thereafter, the light L4R (or L5R) is converged by the collimator lens 53 and is diffracted by the holographic element 152 to form a plurality of converging spots on the photo detectors 153. Therefore, an information signal expressing a piece of information recorded on the information medium 23 (or 25) and servo signals such as a focus error signal and a tracking error signal are obtained in the photo detector 153 in the same manner as in the sixth embodiment.

Accordingly, because the compound objective lens having two focal points is utilized in the optical head apparatus 151, pieces of information can be reliably recorded or reproduced or or from an information medium regardless of whether the information medium is thick or thin.

Also, because all of the incident light L3 transmits through the holographic element 152 on the outgoing optical path and because all of the light L4R or L5R is diffracted by the holographic element 152 on the incoming optical path, a utilization efficiency of the incident light L3 can be enhanced. Therefore, even though a radiation intensity of the incident light L3 in the light source 52 is low, the information signal and the servo signals having a high signal-noise ratio can be reliably obtained.

Also, because no beam splitter is utilized in the optical head apparatus 151, the optical head apparatus 151 can be manufactured at a small size, in a light weight, and at a low cost.

Also, because optical parts of the optical head apparatus 151 are located along its optical axis, the optical head apparatus 151 stably operated can be obtained even though a circumstance temperature largely varies and the apparatus is operated for a long time.

Also, because the light L4R or L5R transmitting through the holographic element 152 without any diffraction on the incoming optical path is not required, it is preferred that a diffraction efficiency of the holographic element 152 be heightened to set a transmission efficiency of the holographic element 152 to almost zero. In this case, a combination of the holographic element 152 and the ¼–λ plate 69 function functions as an isolator to prevent the light L4R or L5R from returning to the light source 52. Therefore, in cases where a semiconductor laser is utilized as the light source 52, any light does not return to an active layer of the semiconductor laser. Accordingly, noises induced by the light returning to the semiconductor laser can be prevented.

Also, because the light source 52 and the photo detector 153 are located on the same substrate 154, the light source 52 and the photo detector 153 can be closely arranged each other. Therefore, a relative position between the light source 52 and the photo detector 153 can be easily set at a high accuracy. For example, the relative position can be set at an accuracy within several μm. Accordingly, a manufacturing cost of the optical head apparatus 151 can be lowered, and the optical head apparatus 151 can be moreover manufactured at a small size, in a light weight, and at a low cost.

Also, the light source 52 is electrically connected with an external circuit through first wirings, and the photo detector 153 is electrically connected with another external circuit through second wirings. In this case, because the light source 52 and the photo detector 153 are located on the same substrate 154, the first and second wirings can pass on an X3–Y3 plane in common. Therefore, the light source 52 and the photo detector 153 can be easily and automatically connected with the external circuits. In addition, because reference lines required to connect the light source 52 and the photo detector 153 with the external circuits are only drawn on the X3–Y3 plane, the relative position between the light source 52 and the photo detector 153 can be easily set at a high accuracy.

In the sixteenth embodiment, the optical head apparatus 151 with the holographic element 152 is described. However, in cases where the intensity of the incident light L3 is sufficient, it is applicable that a hologram having a small grating pitch or a blazed hologram be utilized in place of the holographic element 152. In this case, pieces of information can be reliably recorded or reproduced on or from an information medium regardless of whether the information medium is thick or thin. Also, because no beam splitter is utilized in the optical head apparatus 151, the optical head apparatus 151 can be manufactured at a small size, in a light weight, and at a low cost. Also, because optical parts of the optical head apparatus 151 are located along its optical axis, the optical head apparatus 151 stably operated can be obtained even though a circumstance temperature largely varies and the apparatus is operated for a long time.

(Seventeenth Embodiment)

An optical head apparatus manufactured in a small size and stably operated is described with reference to FIG. 52 according to a seventeenth embodiment of the present invention.

Figure 52:
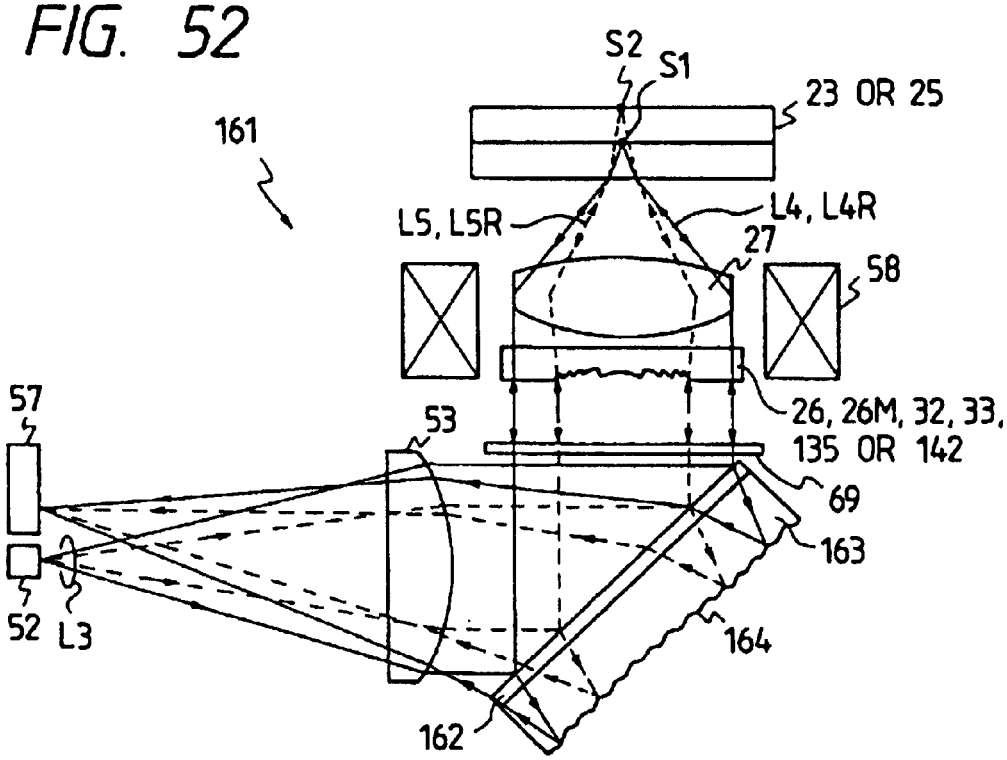
FIG. 52 is a constitutional view of an optical head apparatus according to a seventeenth embodiment.

FIG. 52 is a constitutional view of an optical head apparatus according to a seventeenth embodiment.

As shown in FIG. 52, an optical head apparatus 161 for recording or reproducing pieces of information on or from the information medium 23 or 25, comprises the light source 52 for radiating the incident light L3 linearly polarized in a first direction, the collimator lens 53, a polarizing separation film 162 formed on a front surface of a transparent substrate 162 for reflecting the incident light L3 linearly polarized in the first direction and transmitting light linearly polarized in a second direction perpendicular to the first direction, the ¼-λ plate 69, the hologram lens 26 (or 26M, 32, 33, 42, 135 or 142), the objective lens 27, the actuating unit 58, a reflection-type hologram 164 formed on a rear surface of the transparent substrate 162 for diffracting and reflecting the light L4R, L5R, and the photo detector 57.

In the above configuration, the incident light L3 linearly polarized in a first direction is radiated from the light source 52 and is collimated by the collimator lens 53. Thereafter, all of the incident light L3 is reflected by the polarizing separation film 162 because the incident light L3 is linearly polarized in the first direction. Therefore, the incident light L3 is directed in an upper direction. Thereafter, the linear polarization of the incident light L3 is changed to a circular polarization in the ¼-λ plate 69, and a part of the incident light L3 transmits through the hologram lens 26 to form the transmitted light L4. Also, a remaining part of the incident light L3 is diffracted by the hologram lens 26 to form the diffracted light L5. Thereafter, the light L4, L5 are converged by the objective lens 27, and the converging spot S1 of the transmitted light L4 (or the converging spot S2 of the diffracted light L5) is formed on the first information medium 23 (or the second information medium 25). Thereafter, the transmitted light L4R (or the diffracted light L5R) circularly polarized in reverse again passes through the converging lens 27 in the same manner as in the sixteenth embodiment, and a part of the transmitted light L4R transmits through the hologram lens 26 without any diffraction or a part of the diffracted light L5R is again diffracted by the hologram lens 26. Thereafter, the transmitted light L4R (or the diffracted light L5R) circularly Polarized in reverse is changed to the light L4R (or L5R) linearly polarized in a second direction perpendicular to the first direction by the ¼-λ plate 69. Thereafter, all of the light L4R (or L5R) is refracted by the polarizing separation film 162 and is diffracted and reflected by the hologram 164. Thereafter, the light L4R (or L5R) transmits through the polarizing separation film 162 and is converged by the collimator lens 53 to form a plurality of converging spots on the photo detector 57. Therefore, an information signal expressing a piece of information recorded on the information medium 23 (or 25) and servo signals such as a focus error signal and a tracking error signal are obtained in the photo detector 57 in the same manner as in the sixth embodiment.

Accordingly, because the compound objective lens having two focal points is utilized in the optical head apparatus 161, pieces of information can be reliably recorded or reproduced on or from an information medium regardless of whether the information medium is thick or thin.

Also, because the incident light L3 incident on the polarizing separation film 162 is collimated, a reflectivity for the incident light L3 is uniform over the entire film 162. Therefore, a diffraction-limited spot of the light L4 or L5 can be easily formed on the information medium 23 or 25. Also, because the light L4R, L5R incident on the polarizing separation film 162 are collimated, a transmissivity for the light L4R, L5R is uniform over the entire film 162. Therefore, an offset occurring in the servo signals can be prevented.

Also, because all of the incident light L3 transmits through the hologram 164 on the outgoing optical path and because all of the light L4R or L5R is diffracted by the hologram 164 on the incoming optical path, a utilization efficiency of the incident light L3 can be enhanced. Therefore, even though a radiation intensity of the incident light L3 in the light source 52 is low, the information signal and the servo signals having a high signal-noise ratio can be reliably obtained.

Also, because a hybrid element composed of the film 162, the substrate 163 and the hologram 164 functions as a beam splitter and a rising mirror, the optical head apparatus 161 can be manufactured at a small size, in a light weight, and at a low cost.

Also, because optical parts of the optical head apparatus 161 are located along its optical axis, the optical head apparatus 161 stably operated can be obtained even though a circumstance temperature largely varies and the apparatus is operated for a long time.

Also, a combination of the film 162 and the ¼-λ plate 69 function functions as an isolator to prevent the light L4R or L5R from returning to the light source 52. Therefore, in cases where a semiconductor laser is utilized as the light source 52, any light does not return to an active layer of the semiconductor laser. Accordingly, noises induced by the light returning to the semiconductor laser can be prevented.

Also, it is preferred that the hologram 164 be blazed. In this case, because the generation of unnecessary diffracted light such as minus first-order diffracted light in the hologram 164 is prevented, a diffraction efficiency of the hologram 164 for changing light to first-order diffracted light can be set to almost 100%. Therefore, the incident light L3 can be efficiently utilized to obtain the signals.

Also, because light incident on the hologram 164 is diffracted to first-order diffracted light, a chromatic aberration occurring in the light L4R, L5R can be compensated in the hologram 164. Therefore, the servo signals can be stably obtained.

In the seventeenth embodiment, the collimator lens 53 is located between the light source 52 and the film 162. However, the collimator lens 53 is not necessary in the optical head apparatus 161.

Also, the optical head apparatus 161 with the film 162 and the ¼-λ plate 69 is described. However, in cases where the intensity of the incident light L3 is sufficient, it is applicable that a reflection film having a reflectivity of almost ⅓ be utilized in place of the film 162 and the ¼-λ plate 69 be omitted. In this case, pieces of information can be reliably recorded or reproduced on or from an information medium regardless of whether the information medium is thick or thin. Also, because a hybrid element composed of the film 162, the substrate 163 and the hologram 164 functions as a beam splitter and a rising mirror, the optical head apparatus 161 can be manufactured at a small size, in a light weight, and at a low cost. Also, because optical parts of the optical head apparatus 161 are located along its optical axis, the optical head apparatus 161 stably operated can be obtained even though a circumstance temperature largely varies and the apparatus is operated for a long time.

In the sixth to seventeenth embodiments, pieces of information can be reliably recorded or reproduced on or from an information medium regardless of whether the information medium represents a conventional optical disk such as a compact disk having a thickness T2 of about 1.2 mm or a prospective high density optical disk having a thickness T1 ranging from 0.4 mm to 0.8 mm. However, when the information recorded or reproduced on or from the information medium, it is required to examine the thickness of the information medium in advance. Therefore, in cases where a piece of distinguishing information is recorded on the information medium in advance to distinguish the thickness of the information medium, it is convenient for a user. Because no distinguishing information is recorded on the conventional optical disk, it is preferred that the distinguishing information be recorded on the prospective high density optical disk appearing on the market in. the future. Therefore, a high density optical disk with the distinguishing information is described according to eighteenth and nineteenth embodiments.

(Eighteenth Embodiment)

Figure 53:
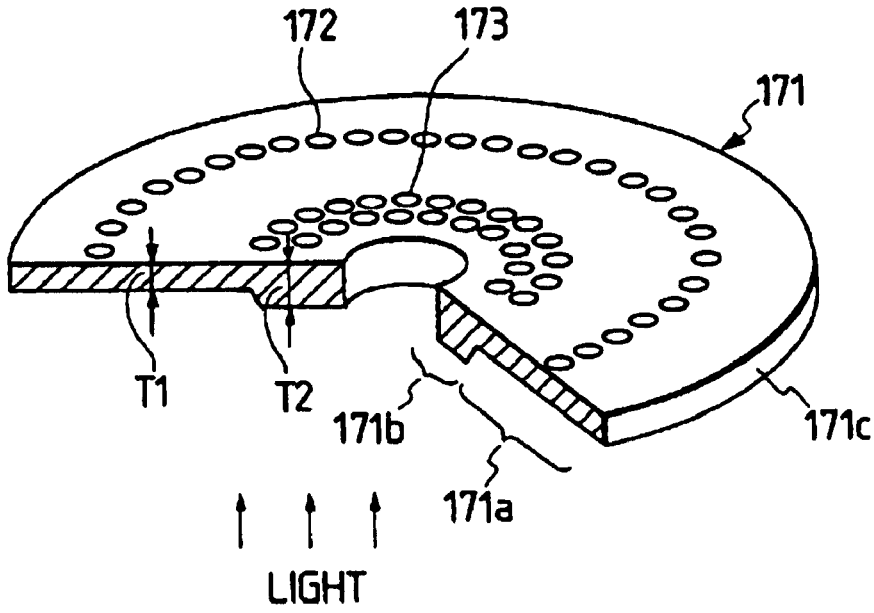
FIG. 53 is a diagonal view of a high density optical disk according to an eighteenth embodiment, a cross sectional view of the disk being partially shown.

FIG. 53 is a diagonal view of a high density optical disk according to an eighteenth embodiment, a cross sectional view of the disk being partially shown.

As shown in FIG. 53, a high density optical disk 171 is partitioned into an outer region 171a and an inner region 171b. The outer region 171a occupies a large part of the optical disk 171, and an information recording substrate 171c of the outer region 171a has the thickness T1, and the information recording substrate 171c of the inner region 171b has the thickness T2. A plurality of first recording pits 172 are formed on the information recording substrate 171c of the outer region 171a at narrow intervals in series to record pieces of information at a high density. Also, a plurality of second recording pits 173 are formed on the information recording substrate 171c of the inner region 171b at ordinary intervals in series to record pieces of distinguishing information at an ordinary density of a compact disk. The distinguishing information inform that the optical disk 171 has the thickness T1. The thickness T1 of the outer region 171a, for example, ranges from 0.4 mm to 0.8 mm, and the thickness T2 of the inner region is, for example, about 1.2 mm.

In the above configuration, the diffracted light L5 according to the first or second embodiment (or the transmitted light L4 according to the third embodiment) is initially converged on an inner region of the information medium 23, 25 while performing a focus control corresponding to the second information medium 25 having the thickness T2. In cases where the information medium 23 or 25 is the optical disk 171, a piece of distinguishing information informing that the optical disk 171 having the thickness T1 is converged by the light L5 (or L4) is detected. Thereafter, the transmitted light L4 (or the diffracted light L6) is automatically converged on the outer region 171a of the optical disk 171 while performing a focus control corresponding to the first information medium 23 having the thickness T1.

In contrast, in cases where the information medium 23 or 25 is a thick type of conventional optical disk having a thickness T2, no distinguishing information is detected when the light L5 (or L4) is converged on the inner region 171b of the conventional optical disk. In this case, the focus control corresponding to the second information medium 25 is continued to detect an information signal expressing a piece of information recorded on the conventional optical disk.

Accordingly, in cases where one of the optical head apparatuses shown in FIGS. 21, 27, 30, 31, 32, 33, 37, 38, 40A, 43, 44, 50 and 52 is utilized, pieces of information can be automatically recorded or reproduced on or from an information medium regardless of whether the information medium is thin or thick.

Also, because only the distinguishing information is recorded in the inner region, the inner region can be small. Therefore, a memory capacity of the optical disk 171 is not lowered by the addition of the second recording pit 173.

(Nineteenth Embodiment)

Figure 54:
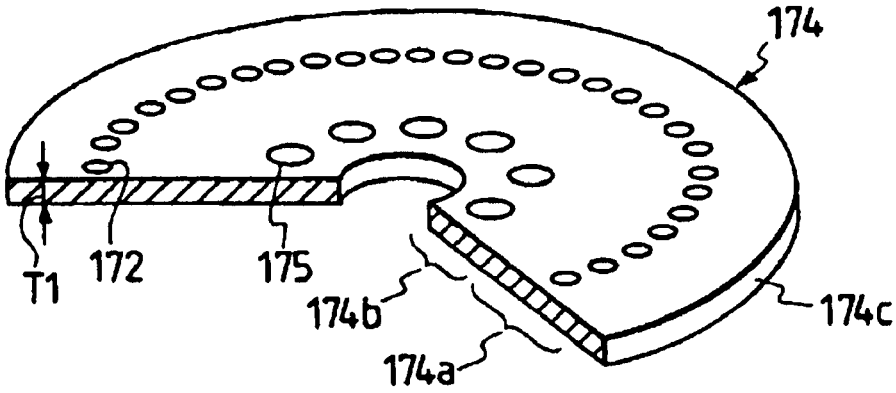
FIG. 54 is a diagonal view of a high density optical disk according to a nineteenth embodiment, a cross sectional view of the disk being partially shown.

FIG. 54 is a diagonal view of a high density optical disk according to a nineteenth embodiment, a cross sectional view of the disk being partially shown.

As shown in FIG. 54, a high density optical disk 174 is partitioned into an outer region 174a and an inner region 174b. The outer region 174a occupies a large part of the optical disk 174. The optical disk 174 has a uniform thickness of T1. The first recording pits 172 are formed on an information recording substrate 174c of the outer region 174a to record pieces of information at a high density. Also, a plurality of second recording pits 175 having a large size are formed on the information recording substrate 174c of the inner region 174b at wide intervals to record pieces of distinguishing information at a lower density than the ordinary density. The distinguishing information inform that the entire optical disk 174 has the thickness T1. The thickness T1 of the optical disk 174, for example, ranges from 0.4 mm to 0.8 mm.

In the above configuration, the diffracted light L5 according to the first or second embodiment (or the transmitted light L4 according to the third embodiment) is initially converged on an inner region of the information medium 23 or 25 while performing a focus control corresponding to the second information medium 25 having the thickness T2. In cases where the information medium 23 or 25 is the optical disk 174, the light L5 (or L4) is converged on each of the second recording pits 175 in defocus. However, because each of the second recording pits 175 is large in size, a converging spot of the light L5 (or L4) is reliably formed in one of the second recording pits 175. Therefore, a piece of distinguishing information, which informs that the optical disk 174 having the thickness T1 is converged by the light L5 (or L4), is detected. Thereafter, the transmitted light L4 (or the diffracted light L6) is automatically converged on the outer region 174a of the optical disk 174 while performing a focus control corresponding to the first information medium 23 having the thickness T1.

In contrast, in cases where the information medium 23 or 25 is a thick type of conventional optical disk having a thickness T2, no distinguishing information is detected when the light L5 (or L4) is converged on the inner region 174b of the conventional optical disk. In this case, the focus control corresponding to the second information medium 25 is continued to detect an information signal expressing a piece of information recorded on the conventional optical disk.

Accordingly, in cases where one of the optical head apparatuses shown in FIGS. 21, 27, 30, 31, 32, 33, 37, 38, 40A, 43, 44, 50 and 52 is utilized, pieces of information can be automatically recorded or reproduced on or from an information medium regardless of whether the information medium is thin or thick.

Also, because only the distinguishing information is recorded in the inner region of the optical disk 174, the inner region can be small. Therefore, a memory capacity of the optical disk 174 is not lowered by the addition of the second recording pit 173.

Also, because the thickness of the optical disk 174 is uniform, the optical disk 174 can be easily manufactured at a low cost. Also, the optical disk 174 can be thinned.

(Twentieth Embodiment)

An optical disk apparatus with one of the optical head apparatuses in which it is automatically judged whether a high density optical disk having the thickness T1 or a conventional optical disk having the thickness T2 is utilized is described.

Figure 55:
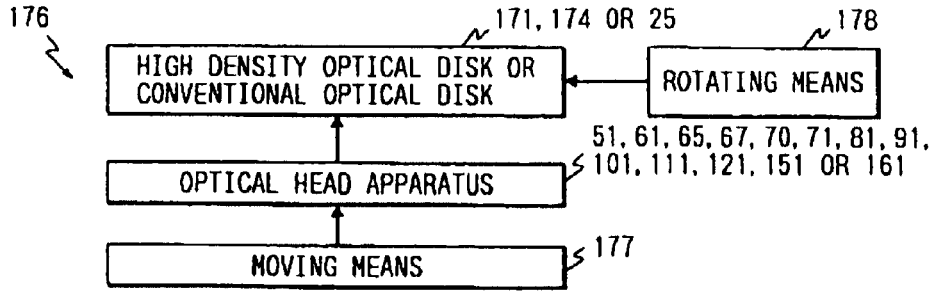
FIG. 55 is a block diagram of an optical disk apparatus with one of the optical head apparatuses shown in FIGS. 21, 27, 30, 31, 32, 33, 37, 38, 40A, 43, 44, 50 and 52 according to a twentieth embodiment.
Figure 56:
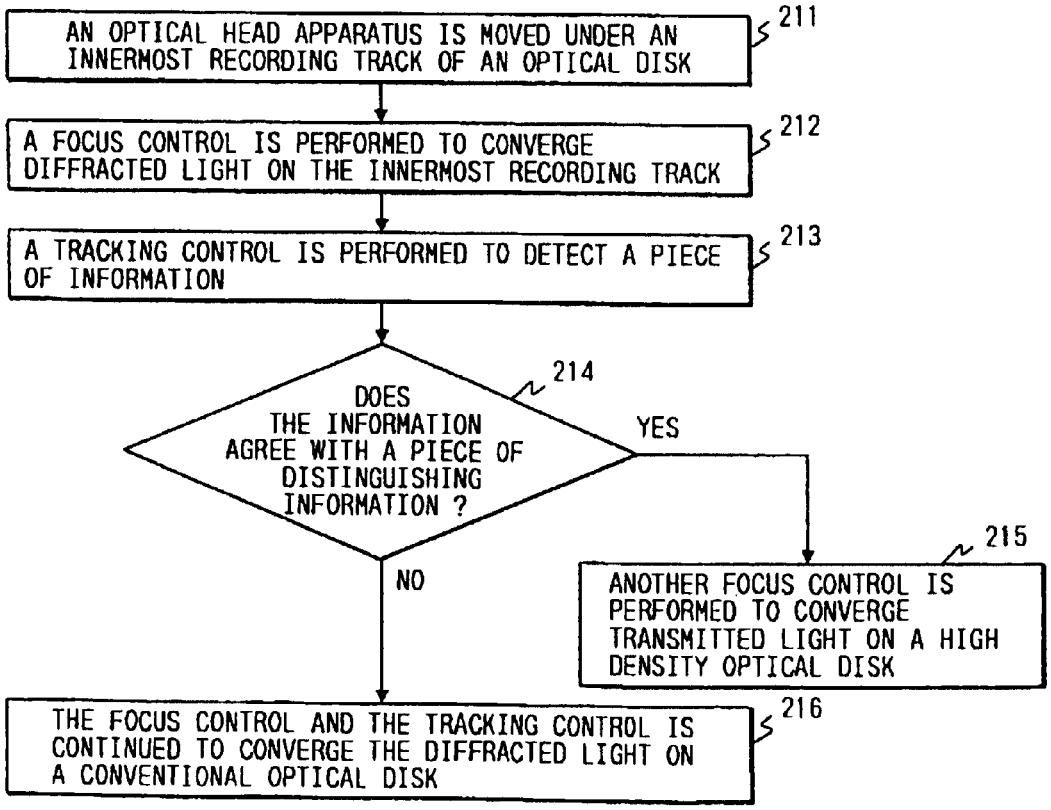
FIG. 56 is a flow chart showing the operation of the optical disk apparatus shown in FIG. 55.
Figure 63:
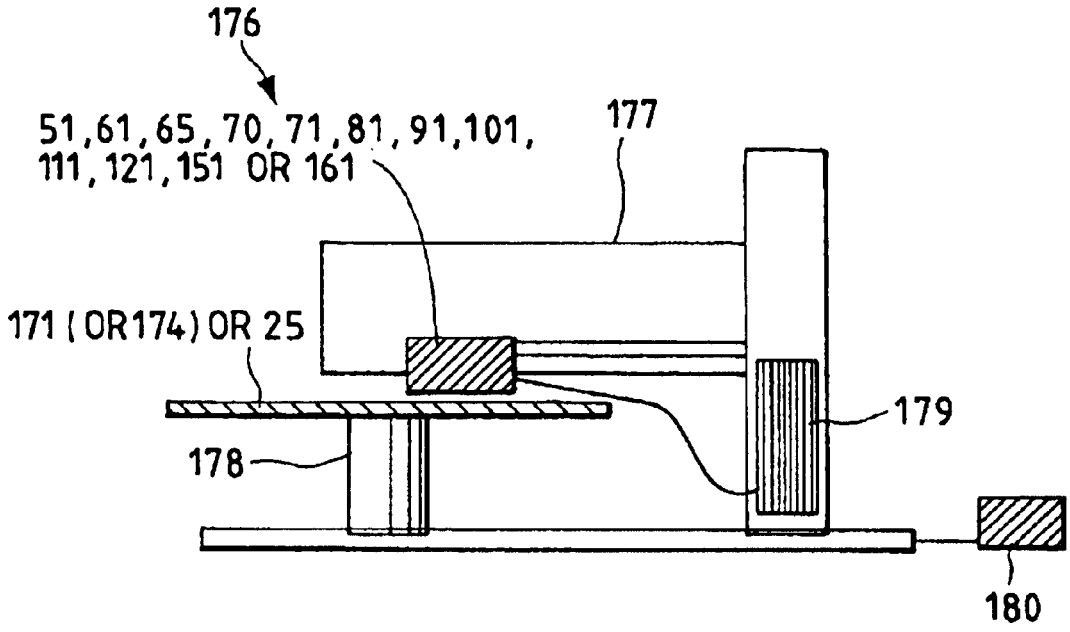
Fig. 63 is a constitutional view of the optical disk apparatus of which the block diagram is shown in FIG. 55.

FIG. 55 is a block diagram of an optical disk apparatus with one of the optical head apparatuses shown in FIGS. 21, 27, 30, 31, 32, 33, 37, 38, 40A, 43, 44, 50 and 52 according to a twentieth embodiment. FIG. 56 is a flow chart showing the operation of the optical disk apparatus shown in FIG. 55. FIG. 63 is a constitutional view of the optical disk apparatus of which the block diagram is shown in FIG. 55.

As shown in FIG. 63, an optical disk apparatus 176 for recording or reproducing pieces of information on or from the high density optical disk 171 (or 174) or the conventional optical disk 25, comprises the optical head apparatus 51 (or 61, 65, 67, 70, 71, 81, 91, 101, 111, 121, 151 or 161), a moving means 177 such as a feed mechanism for moving the optical head apparatus 51 to a prescribed position, a rotating means 178 such as a spindle motor for rotating the high density optical disk 171 (or 174) or the conventional optical disk 25, an actuating means representing the actuating unit 58 (not shown in FIG. 63), an electric circuit 179 representing a focus control means and a tracking control means for controlling the actuating means to perform a first focus control of the optical head apparatus 51 corresponding to the first thickness T1 of the optical disk 171 (or 174) and a second focus control of the optical head apparatus 51 corresponding to the second thickness T2 of the optical disk 171 (or 174) or 25 according to a focus error signal read by the optical head apparatus 51 and controlling the actuating means to perform a first tracking error control of the optical head apparatus 51 corresponding to the first thickness T1 and a second tracking error control of the optical head apparatus 51 corresponding to the second thickness T2 according to a tracking error signal read by the optical head apparatus 51, and a connecting means 180 for electrically connecting the rotating means 178, the moving means 177 and the electric circuit 179 with an electric source (not shown) to supply an electric power to the rotating means 178, the moving means 177 and the electric circuit 179.

In the above configuration, the high density optical disk 171 or the conventional optical disk 25 is set to a prescribed position of the optical disk apparatus 176, and the optical disk 171 or 25 is rotated by the rotating means 178. Thereafter, the optical head apparatus 51 is moved to a position just under an innermost recording track of the optical disk 171 or 25 by the moving means 177 in a step 211, and the diffracted light L5 is converged on the innermost recording track of the optical disk 171 or 25 while performing a focus control corresponding to the conventional optical disk 25 of the thickness T2 in a step 212. Thereafter, a tracking control is performed, and a piece of information recorded on the innermost recording track of the optical disk 171 or 25 is detected in a step 213. In detail, a focus error signal and a tracking error signal corresponding to a positional relationship between the optical head apparatus 51 and the optical disk 171 or 25 are sent to the electric circuit 179. In the electric circuit 179, an actuating signal is generated according to the focus error signal and the tracking error signal and is sent to the actuating unit 58 to precisely move the compound objective lens 29 (or 29M, 34, 43, 45, 46 or 47) of the optical head apparatus 51. That is, the second focus and tracking controls of the optical head apparatus 51 corresponding to the second thickness T2 are performed to read the information. Thereafter, it is judged in a step 214 whether the information agrees with a piece of distinguishing information informing that the optical disk 171 having the thickness T1 is set to the optical disk apparatus 176.

In cases where the high density optical disk 171 is set to the optical disk apparatus 176, the distinguishing information is detected. Thereafter, the transmitted light L4 is automatically converged on the optical disk 171 while performing a focus control corresponding to the optical disk 171 of the thickness T1 in a step 215. In detail, a focus error signal and a tracking error signal corresponding to a positional relationship between the optical head apparatus 51 and the optical disk 171 are sent to the electric circuit 179. In the electric circuit 179, an actuating signal is generated according to the focus error signal and the tracking error signal and is sent to the actuating unit 58 to precisely move the compound objective lens 29 (or 29M, 34, 43, 45, 46 or 47) of the optical head apparatus 51. That is, the first focus and tracking controls of the optical head apparatus 51 corresponding to the first thickness T1 are performed. Therefore, pieces of information are recorded or reproduced on or from the optical disk 171.

In contrast, in cases where the conventional optical head 25 is set to the optical disk apparatus 176, the distinguishing information is not detected. In this case, the convergence of the diffracted light L5 on the conventional optical disk 25 is continued while performing the focus control and the tracking control corresponding to the conventional optical disk 25 in a step 216. Therefore, pieces of information are recorded or reproduced on or from the conventional optical disk 25.

Accordingly, the thickness of the optical disk set in the optical disk apparatus 176 can be rapidly judged at a high accuracy. Also, pieces of information can be stably recorded or reproduced on or from an optical disk regardless of whether the optical disk is the high density optical disk 171 (or 174) or the conventional optical disk 25.

(Twenty-first Embodiment)

An optical disk apparatus with one of the optical head apparatuses in which it is automatically judged whether a high density optical disk having the thickness T1 or a conventional optical disk having the thickness T2 is utilized is described.

Figure 57:
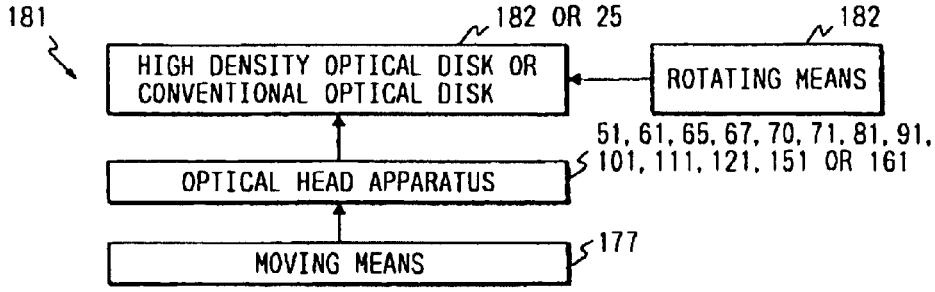
FIG. 57 is a block diagram of an optical disk apparatus with one of the optical head apparatuses shown in FIGS. 21, 27, 30, 31, 32, 33, 37, 38, 40A, 43, 44, 50 and 52 according to a twenty-first embodiment.
Figure 58:
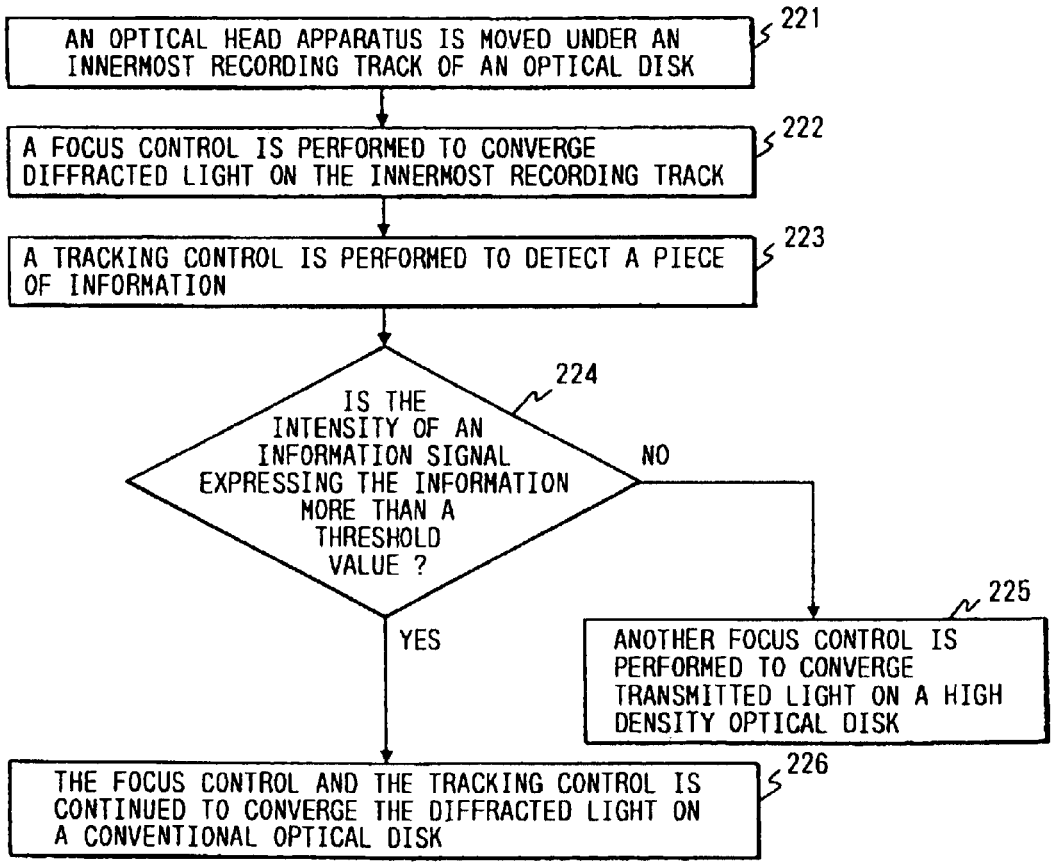
FIG. 58 is a flow chart showing the operation of the optical disk apparatus shown in FIG. 57.

FIG. 57 is a block diagram of an optical disk apparatus with one of the optical head apparatuses shown in FIGS. 21, 27, 30, 31, 32, 33, 37, 38, 40A, 43, 44, 50 and 52 according 25 to a twenty-first embodiment. FIG. 58 is a flow chart showing the operation of the optical disk apparatus shown in FIG. 57.

As shown in FIG. 57, an optical disk apparatus 176 for recording or reproducing pieces of information on or from a high density optical disk 182 or the conventional optical disk 25, comprises the optical head apparatus 51 (or 61, 65, 67, 70, 71, 81, 91, 101, 111, 121, 151 or 161), the moving means 177, and a rotating means 182 such as a spindle motor for rotating the high density optical disk 182 or the conventional optical disk 25. The high density optical disk 182 has no distinguishing information and has the thickness T1.

In the above configuration, the high density optical disk 182 or the conventional optical disk 25 is set to a prescribed position of the optical disk apparatus 181, and the optical disk 182 or 25 is rotated by the rotating means 182. Thereafter, the optical head apparatus 51 is moved to a position just under an innermost recording track of the optical disk 182 or 25 in a step 221 because a piece of information is reliably recorded on the innermost recording track, and the diffracted light L5 is converged on the innermost recording track of the optical disk 182 or 25 while performing a focus control corresponding to the conventional optical disk 25 of the thickness T2 in a step 222. Thereafter, a tracking control is performed, and a piece of information recorded on the innermost recording track of the optical disk 182 or 25 is detected in a step 223. Thereafter, it is judged in a step 224 whether the intensity of an information signal expressing the information detected is more than a threshold value. That is, the intensity of the information signal more than the threshold value denotes that the diffracted light L5 is converged in focus on the optical disk 182 or 25, and the intensity of the information signal not more than the threshold value denotes that the diffracted light L5 is converged in defocus on the optical disk 182 or 25.

In cases where the high density optical disk 182 is set to the optical disk apparatus 181, the intensity of the information signal not more than the threshold value is detected. In this case, the transmitted light L4 is automatically converged on the optical disk 182 while performing a focus control corresponding to the high density optical disk 182 of the thickness T1 in a step 225. Therefore, pieces of information are recorded or reproduced on or from the optical disk 182.

In contrast, in cases where the conventional optical head 25 is set to the optical disk apparatus 181, the intensity of the information signal more than the threshold value is detected. In this case, the convergence of the diffracted light L5 on the conventional optical disk 25 is continued while performing the focus control and the tracking control corresponding to the conventional optical disk 25 in a step 226. Therefore, pieces of information are recorded or reproduced on or from the conventional optical disk 25.

Accordingly, the thickness of the optical disk set in the optical disk apparatus 181 can be judged even though the optical disk 171 or 174 is not utilized. Also, pieces of information can be stably recorded or reproduced on or from an optical disk regardless of whether the optical disk is the high density optical disk 182 or the conventional optical disk 25.

(Twenty-second Embodiment)

A binary focus microscope having two focal points in which two images formed on different planes are simultaneously observed is described according to a twenty-second embodiment.

Figure 59:
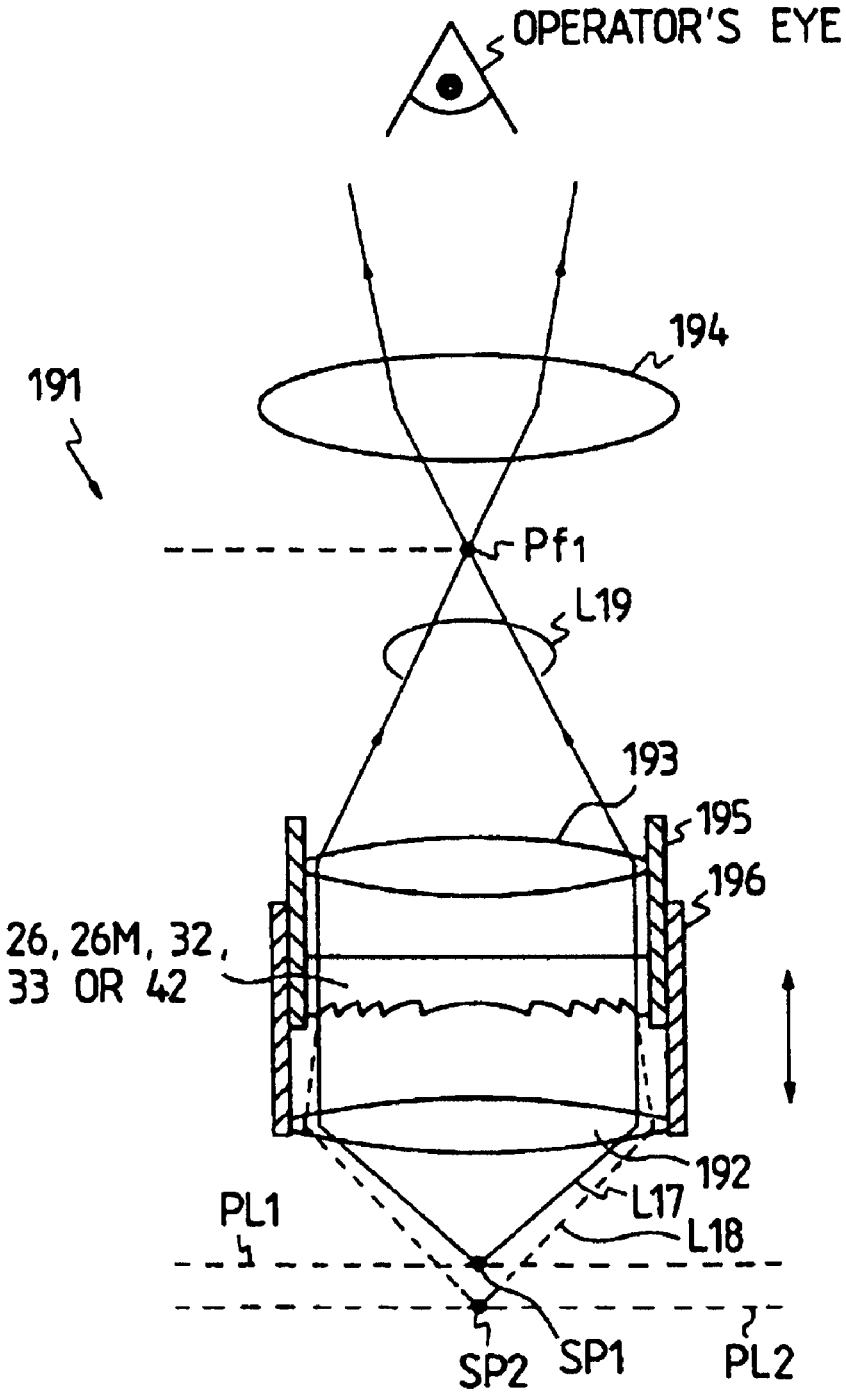
FIG. 59 is a constitutional view of a binary focus microscope according to a twenty-second embodiment.

FIG. 59 is a constitutional view of a binary focus microscope according to a twenty-second embodiment.

As shown in FIG. 59, a binary focus microscope 191 for simultaneously observing a first image of a first sample SP1 put on a first sample plane PL1 and a second image of a second sample SP2 put on a second sample plane PL2, comprises an objective lens 192 having a first focal length F1 for refracting a beam of first light L17 diverging from the first image and refracting a beam of second light L18 diverging from the second image, the hologram lens 26 (or 26M, 32, 33 or 42) for transmitting through a part of the first light L17 without any diffraction and diffracting a part of the second light L18 to pass the second light L18 through the same optical path as the first light L17 passes through, an inner lens 193 for converging a beam of superposed light L19 formed of the first and second light L17, L18 at an inner focal point Pf1, an ocular lens 194 for simultaneously forming the first and second images by converging the superposed light L19 diverging from the inner focal point Pf1, an inner lens-barrel 195 for moving a combination element of the inner lens 193 and the hologram lens 26 along an optical axis to adjust a distance between the combination element and the ocular lens 194, and an outer lens-barrel 196 for moving the objective lens 192 along the optical axis to set the distance between the first sample plane PL1 and the objective lens 192 to the focal length F1 of the objective lens 192.

The optical axis passes through the centers of the objective lens 192, the hologram lens 26, the inner lens 195 and the ocular lens 194. The position of the first sample plane PL1 differs from that of the second sample plane PL2 along the optical axis.

In the above configuration, the position of the objective lens 192 is adjusted to set the distance between the first sample plane PL1 and the objective lens 192 to the first focal length F1 of the objective lens 192. In this case, the distance between the second sample plane PL2 and the objective lens 192 is set to a second focal length F2. Also, the position of the combination element is adjusted to clearly view the first and second images. That is, a beam of first light L17 diverging from the first image on the first sample plane PL1 is collimated in the objective lens 192, and a part of the first light L17 transmits through the hologram lens 26. Also, a beam of second light L18 diverging from the second image on the second sample plane PL2 is refracted in the objective lens 192, and a part of the second light L18 is diffracted in the hologram lens 26 to pass the second light L18 through the same optical path as the first light L17 passes through. Therefore, a beam of superposed light L19 is formed of the first and second light L17, L18. Thereafter, the superposed light L19 is converged by the inner lens 193 at an inner focal point Pf1 to simultaneously form the first and second images enlarged on an image plane PL3, and the superposed light L19 diverging from the point Pf1 is converged by the ocular lens 194 to simultaneously form the first and second images moreover enlarged on an operator's eye.

Accordingly, because the hologram lens 26, 26M, 32, 33 or 42 is utilized to form the superposed light L19, the first image of the first sample SP1 put on the first sample plane PL1 and the second image of the second sample SP2 put on the second sample plane PL2 can be simultaneously observed by simultaneously focusing the binary focus microscope 191 on the first and second samples SP1, SP2.

Also, even though the intensities of the first and second light L17, L18 are reduced when the light L17, L18 pass through the hologram lens 26, the intensity of the superposed light L19 is sufficient to observe the first and second images because the intensity of the superposed light L19 is determined by adding the intensities of the first and second light L17, L18.

Also, because the hologram lens 26 is blazed as shown in FIG. 6, the generation of unnecessary diffracted light such as minus first-order diffracted light is reduced when the second light L18 is diffracted in the hologram lens 26. Therefore, the intensity of the superposed light L19 can be increased, so that first and second images observed can be moreover brightened.

Figure 60:
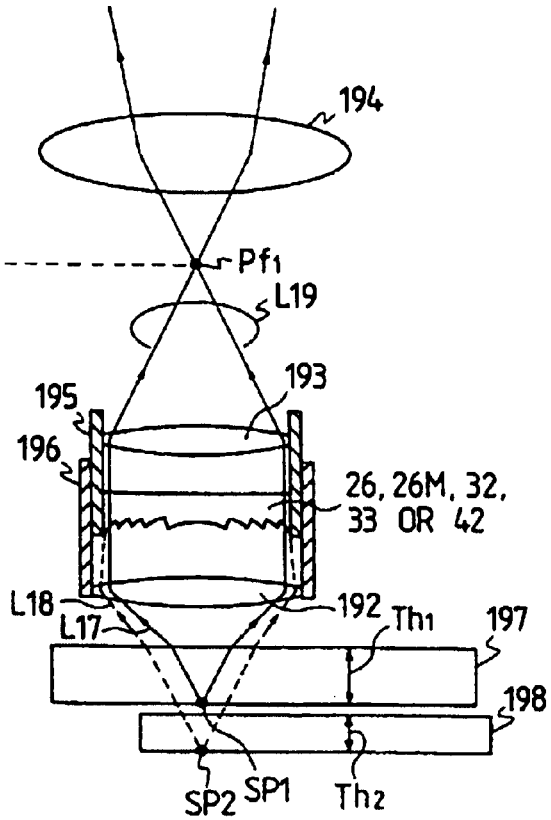
FIG. 60 is a partial view of the binary focus microscope shown in FIG. 59 in cases where first and second samples are located at bottoms of sample holders.

Also, as shown in FIG. 60, in cases where the first sample SP1 is placed at a bottom of a first sample holder 197 and in cases where the second sample SP2 is placed at a bottom of a second sample holder 198 located under the first sample holder 197, aberration such as a chromatic aberration is generated in the first and second light L17, L18 incident on the objective lens 192 because an optical path length in the first sample holder 197 for the first light L17 differs from that in the first and second sample holders 197, 198 for the second light L18. However, the aberration can disappear in the hologram lens 26 by excessively correcting the chromatic aberration in the hologram lens 26 as is described in the first embodiment.

Also, the difference between the first and second focal lengths can be changed by moving the inner and outer lens-barrels 195, 196 because the distance between the hologram lens 26 and the objective lens 192 is changed. Therefore, even though the thickness of the second sample holder 198 is changed, the first and second images can be reliably observed.

Figure 61:
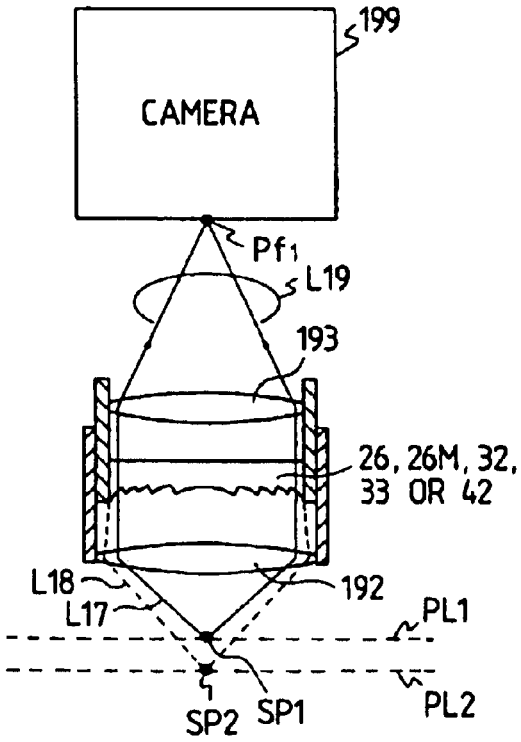
FIG. 61 is a constitutional view of a binary focus microscope according to a modification of the twenty-second embodiment.

In the twenty-second embodiment, the ocular lens 194 is utilized in the binary focus microscope 191. However, the ocular lens 194 is not necessarily required. Also, as shown in FIG. 61, it is applicable that a camera 199 such as a charge-coupled device (CCD) camera be placed on the image plane PL3 in place of the ocular lens 194. In this case, a superposed image formed of the first and second images enlarged can be photographed with the CCD camera 199, so that the first and second images can be simultaneously recorded.

(Twenty-third Embodiment)

In cases where a minute circuit is formed on a semiconductor wafer, a photosensitive material is coated on the semiconductor wafer, and the photosensitive material covering the semiconductor wafer is exposed to ultraviolet light through a photomask having a mask pattern in an exposure process. Therefore, the mask pattern of the photomask is transferred to the photosensitive material. In this case, the semiconductor wafer is required to be aligned with the photomask at a high accuracy in an alignment process performed prior to the exposure process. Therefore, a reference image drawn on the semiconductor wafer and the mask pattern drawn on the photomask are simultaneously observed with a conventional microscope having a deep focal depth. However, because the magnification of the conventional microscope having a deep focal depth is low, it is impossible to align the reference image and the mask pattern at an accuracy within 5 μm.

To solve the above drawback in the present invention, an alignment apparatus utilized in the alignment process in which the semiconductor wafer is aligned with the photomask at a high accuracy while simultaneously observing a reference image drawn on the semiconductor wafer and the mask pattern drawn on the photomask is described according to a twenty-third embodiment.

Figure 62:
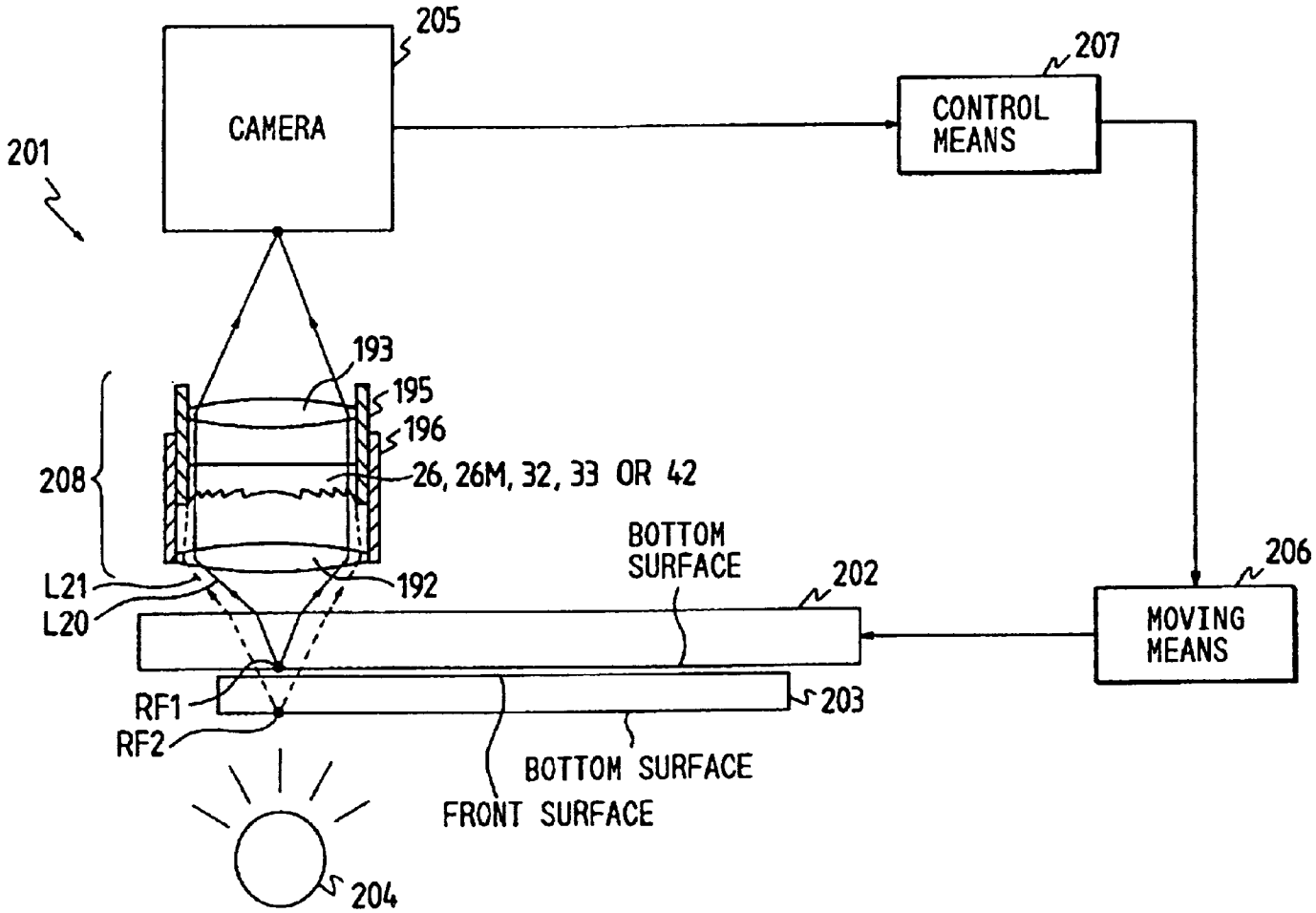
FIG. 62 is a constitutional view of an alignment apparatus according to a twenty-third embodiment.

FIG. 62 is a constitutional view of an alignment apparatus according to a twenty-third embodiment.

As shown in FIG. 62, an alignment apparatus 201 for aligning a first reference image RF1 of a mask pattern drawn on a bottom surface of a photomask 202 with a second reference image RF2 drawn on a bottom surface of a sample such as a semiconductor substrate 203, comprises a light source 204 for radiating beams of alignment light having a particular wavelength to illuminate the first and second reference images RF1, RF2, the objective lens 192 for receiving a beam of first alignment light L20 diverging from the first reference image RF1 illuminated with the alignment light and receiving a beam of second alignment light L21 diverging from the second reference image RF2 illuminated with the alignment light, the hologram lens 26 (or 26M, 32, 33 or 42) for transmitting through a part of the first alignment light L20 without any diffraction and diffracting a part of the second alignment light L21 to pass the second alignment light L21 through the same optical path as the first alignment light L20 passes through, the inner lens 193 for converging a beam of superposed alignment light L22 formed of the first and second alignment light L20, L21 at an inner focal point Pf2, a camera 205 such as a charge-coupled device (CCD) camera placed at the inner focal point Pf2 for simultaneously photographing and recording the first and second reference images RF1, RF2, the inner lens-barrel 195, the outer lens-barrel 196, a moving means 206 for moving the photomask 202 in a horizontal direction perpendicular to an optical axis to align the first reference image RF1 with the second reference image RF2 along the optical axis, and a control means 207 for controlling the movement of the photomask 202 according to the first and second reference images RF1, RF2 recorded in the camera 205.

The particular wavelength of the alignment light is determined on condition that a transmissivity of the semiconductor substrate 203 for the alignment light is sufficiently high. The optical axis passes through the centers of the objective lens 192, the hologram lens 26 and the inner lens 193.

A binary microscope 208 is composed of the objective lens 192, the hologram lens 26 (or 26M, 32, 33 or 42), the inner lens 193, the inner lens-barrel 195 and the outer lens-barrel 196 in the same manner as in the twenty-second embodiment.

Figure 64:
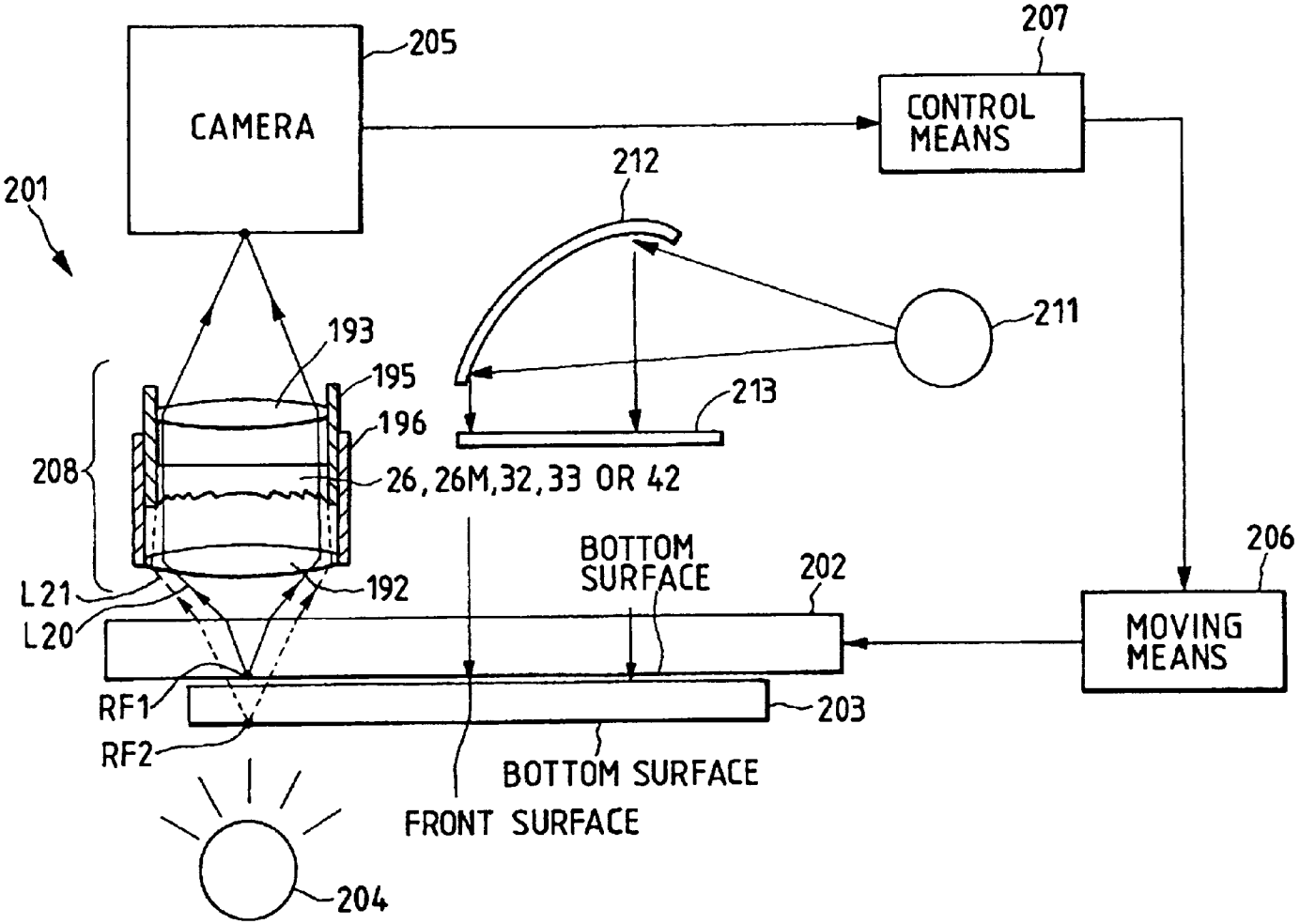
FIG. 64 is a constitutional view of an exposure apparatus in which the alignment apparatus is included.

In the above configuration, a beam of first alignment light L20 diverging from the first reference image RF1 is collimated in the objective lens 192, and a part of the first alignment light L20 transmits through the hologram lens 26. Also, a beam of second alignment light L21 diverging from the second reference image RF2 is refracted in the objective lens 192, and a part of the second alignment light L21 is diffracted by the hologram lens 26 to pass the second alignment light L21 through the same optical path as the first alignment light L20 passes through. Therefore, a beam of superposed alignment light L22 is formed of the first and second alignment light L20, L21. Thereafter, the superposed alignment light L22 is converged at an inner focal point Pf2 to simultaneously form the first and second reference images RF1, RF2 enlarged. Thereafter, the first and second reference images RF1, RF2 enlarged are photographed and recorded by the camera 205. Thereafter, a relative position between the first and second reference images RF1, RF2 is examined in the control means 207, and the photomask 202 is moved in a horizontal direction by the moving means 206 under control of the control means 207 to align the first reference image RF1 with the second reference image RF2. Thereafter, as shown in FIG. 64, a photo sensitive material coated on the semiconductor substrate 203 is exposed to exposure light radiated from an exposure light source 211 through a reflecting mirror 212 and a shutter 213.

Accordingly, because the hologram lens 26, 26M, 32, 33 or 42 is utilized to form the binary microscope 208 having two focal points, the first reference image RF1 and the second reference image RF2 can be simultaneously observed even though a focal depth of the binary microscope 208 is low. Also, because the focal depth of the binary microscope 208 can be lowered, the magnification of the binary microscope 208 can be heightened. Therefore, the first reference image RF1 of the photomask 202 can be aligned with the second reference image RF2 of the semiconductor substrate 203 at a high accuracy.

(Twenty-fourth Embodiment)

Figure 65:
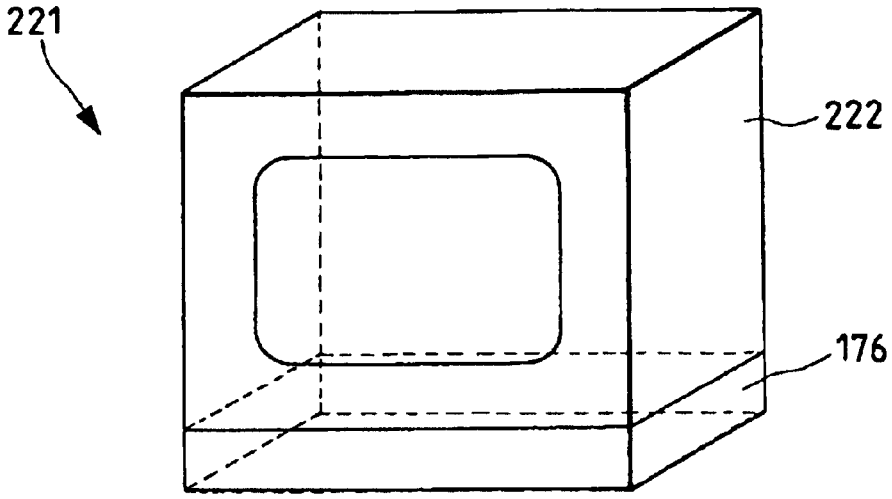
FIG. 65 is a diagonal view of an image reproducing apparatus for which the optical disk apparatus 176 is provided.

FIG. 65 is a diagonal view of an image reproducing apparatus for which the optical disk apparatus 176 is provided.

As shown in FIG. 65, an image reproducing apparatus 221 comprises the optical disk apparatus 176 and a displaying unit 222 such as a cathode ray tube or a liquid crystal display for displaying pieces of image information recorded in the optical disk 171, 174 or 25 of the optical disk apparatus 176 as an image.

In the above configuration, pieces of image information are recorded in the outer region 171a of the optical disk 171 or in the optical disk 174 at a high recording density, and the thickness T1 is, for example, 0.6 mm. Also, pieces of image information are recorded in the conventional optical disk 25 having the thickness T2 at an ordinary recording density. The conventional optical disk 25 represents a video compact disk having a thickness of 1.2 mm. Because the optical disk apparatus 176 is provided for the image reproducing apparatus 221, regardless of whether pieces of particular image information are recorded in the optical disk 171 (or 174) or the conventional optical disk 25, the particular image information are read from the optical disk 171, 174 or 25, and a particular image can be displayed in the displaying unit 222. Therefore, a user is not required to prepare both a conventional image reproducing apparatus for reproducing the image information recorded in the conventional optical disk 25 and an updated image reproducing apparatus for reproducing the image information recorded in an updated optical disk having a thickness of 0.6 mm.

Figure 66:
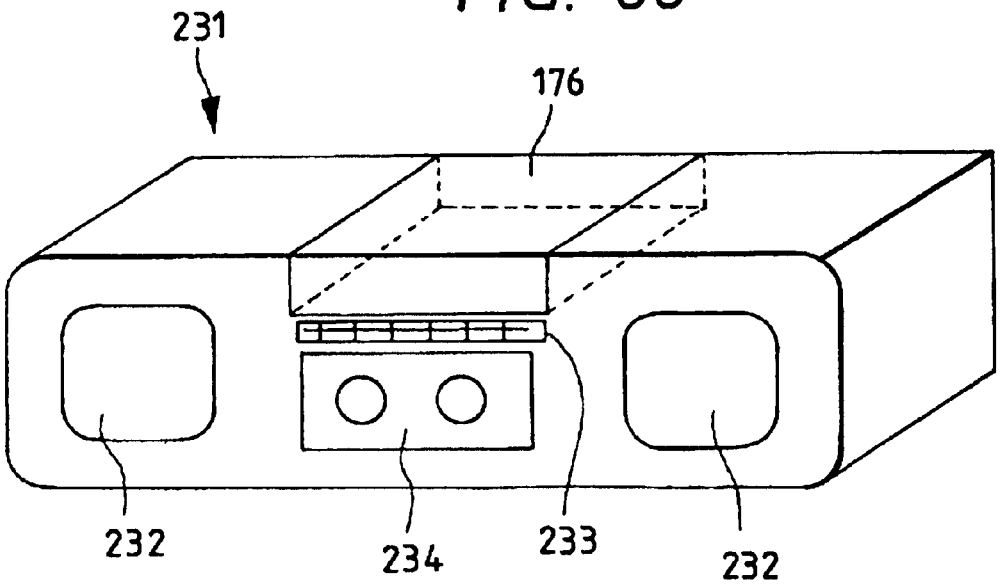
FIG. 66 is a diagonal view of a voice reproducing apparatus for which the optical disk apparatus 176 is provided.

FIG. 66 is a diagonal view of a voice reproducing apparatus for which the optical disk apparatus 176 is provided.

As shown in FIG. 66, a voice reproducing apparatus 231 comprises the optical disk apparatus 176 and a voice reproducing unit 232 such as a speaker for reproducing pieces of voice information recorded in the optical disk 171, 174 or 25 of the optical disk apparatus 176 as voices. The voice reproducing apparatus 231 additionally comprises a radio 233 and a cassette tape recorder 234.

In the above configuration, pieces of voice information are recorded in the outer region 171a of the optical disk 171 or in the optical disk 174 at a high recording density, and the thickness T1 is, for example, 0.6 mm. Also, pieces of voice information are recorded in the conventional optical disk 25 having the thickness T2 at an ordinary recording density. The conventional optical disk 25 represents an audio compact disk having a thickness of 1.2 mm. Because the optical disk apparatus 176 is provided for the voice reproducing apparatus 231, regardless of whether pieces of particular voice information are recorded in the optical disk 171 (or 174) or the conventional optical disk 25, the particular voice information are read from the optical disk 171, 174 or 25, and particular voices can be reproduced by the voice reproducing unit 232. Therefore, a user is not required to prepare both a conventional voice reproducing apparatus for reproducing the voice information recorded in the conventional optical disk 25 and an updated voice reproducing apparatus for reproducing the voice information recorded in an updated optical disk having a thickness of 0.6 mm.

Figure 67:
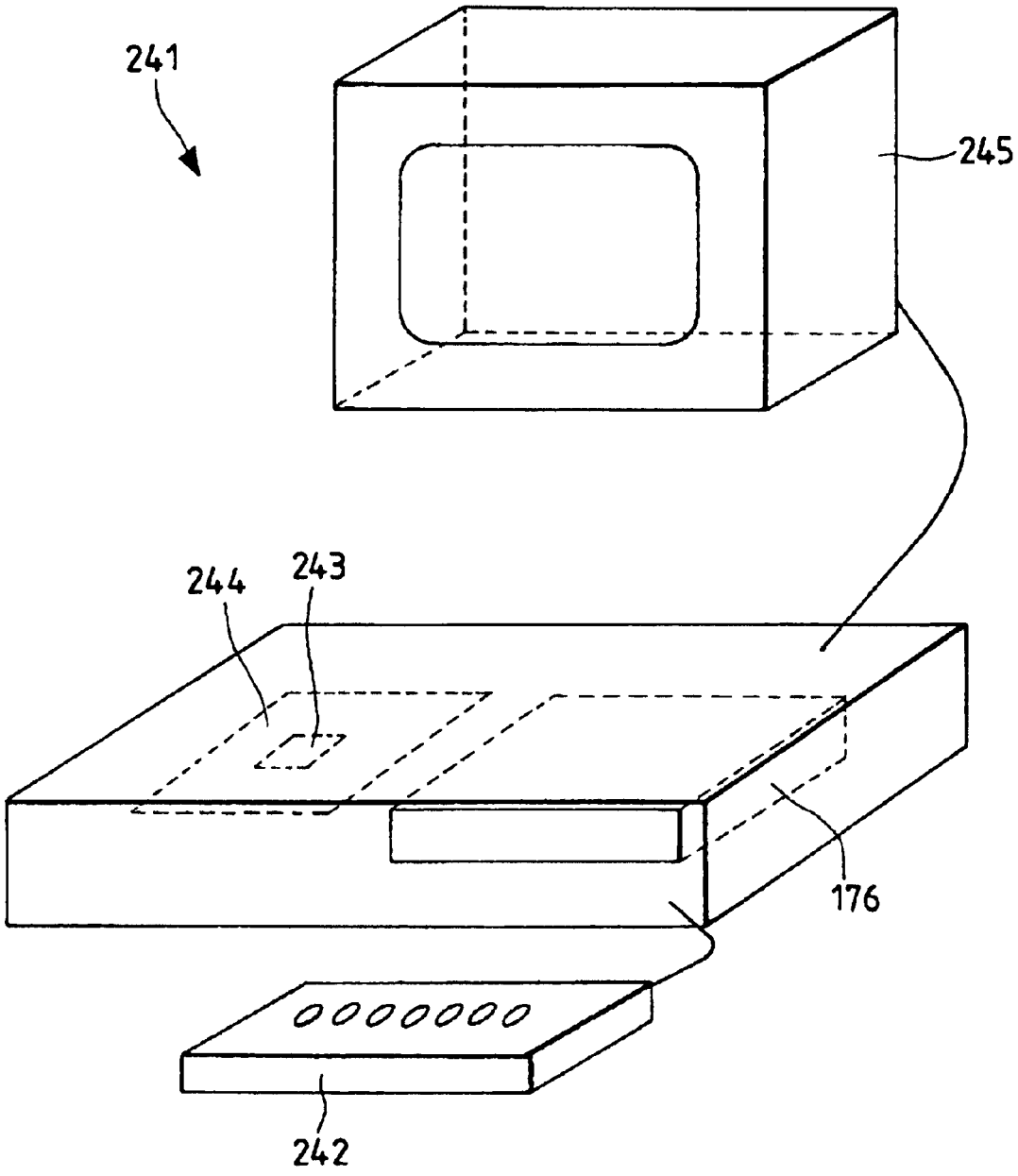
FIG. 67 is a diagonal view of an information processing apparatus for which the optical disk apparatus 176 is provided.

FIG. 67 is a diagonal view of an information processing apparatus for which the optical disk apparatus 176 is provided.

As shown in FIG. 67, an information processing apparatus 241 comprises the optical disk apparatus 176, an input apparatus 242 for inputting pieces of input information, a central processing unit 243 placed on a circuit substrate 244 for processing pieces of recorded information recorded in the optical disk 171, 174 or 25 of the optical disk apparatus 176 or processing the input information to record the input information in the optical disk 171, 174, and a displaying unit 245 for displaying the recorded information processed in the central processing unit 243.

In the above configuration, pieces of recorded information are recorded in the outer region 171a of the optical disk 171 or in the optical disk 174 at a high recording density, and the thickness T1 is, for example, 0.6 mm. Also, pieces of recorded information are recorded in the conventional optical disk 25 having the thickness T2 at an ordinary recording density. The conventional optical disk 25 represents a CD-ROM having a thickness of 1.2 mm. Because the optical disk apparatus 176 is provided for the voice reproducing apparatus 231, regardless of whether pieces of particular recorded information are recorded in the optical disk 171 (or 174) or the conventional optical disk 25, the particular recorded information are read from the optical disk 171, 174 or 25, and a particular image can be displayed in the displaying unit 245 according to the recorded information. Also, when a user inputs pieces of input information to the inputting apparatus 242, even though any of the optical disks 171, 174 and 25 is set in the optical disk apparatus 176, the input information are recorded in the optical disk 171, 174 or 25. Therefore, the user is not required to prepare both a conventional image reproducing apparatus for reproducing the image information recorded in the conventional optical disk 25 and an updated image reproducing apparatus for reproducing the image information recorded in an updated optical disk having a thickness of 0.6 mm.

In cases where a game program is recorded in the optical disk 171, 174 or 25, the user can play a game while observing a game image displayed in the displaying unit 245 and inputting pieces of operating data to the inputting apparatus 242 regardless of whether the game program is recorded in any of the optical disks 171, 174 or 25.

Also, in cases where the information processing apparatus 241 is utilized in a home, the information processing apparatus 241 can be utilized as an information terminal for a domestic use.

Figure 68:
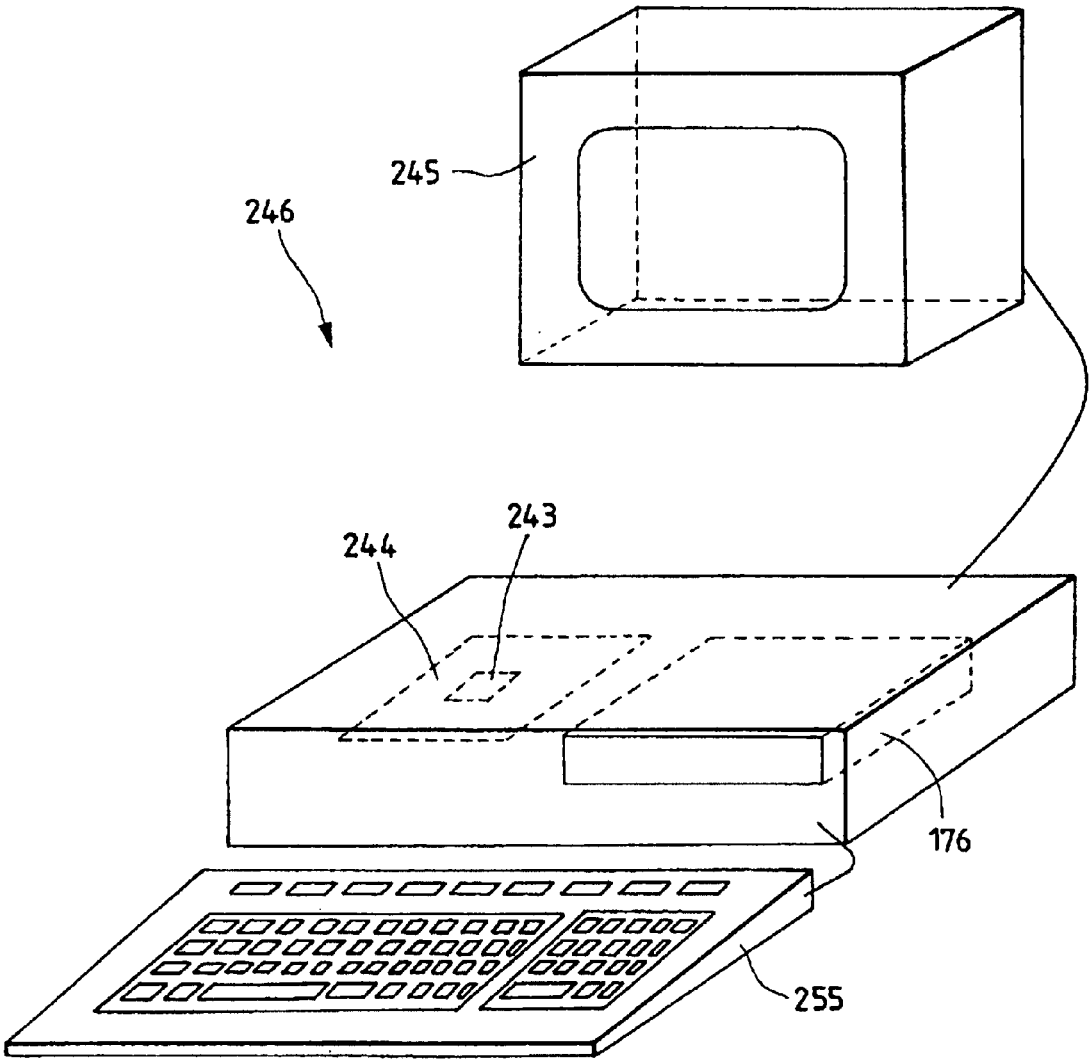
FIG. 68 is a diagonal view of another information processing apparatus for which the optical disk apparatus 176 is provided.

Also, as shown in FIG. 68, in cases where a key board 245 is utilized as the inputting apparatus 242, the information processing apparatus 241 can be utilized as a computer system 246.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

[1. A compound objective lens, comprising:

lens means, having a first convex surface and a second convex surface opposite to each other, for receiving a beam of incident light of one particular wavelength passing through an optical axis at the first convex surface, refracting the beam of incident light and emitting a beam of refracted light from the second convex surface; and plural focal point generating means for receiving the beam of incident light not yet refracted by the lens means, generating from the beam of incident light a plurality of beams of divided light including a first beam of divided light and a second beam of divided light, converging the beams of divided light at a plurality of focal points which are placed on the optical axis on a side facing the second convex surface of the lens means on condition that the first beam of divided light transmits through a first substrate and is converged on an information recording plane placed at a first distance T1 from a surface of the first substrate at a diffraction limit and that the second beam of divided light transmits through a second substrate and is converged on an information recording plane placed at a second distance T2 (T1≠T2) from a surface of the second substrate at a diffraction limit.]

[2. A compound objective lens according to claim 1 in which the plural focal point generating means is a hologram generating from the incident light as the beams of divided light a plurality of beams of diffracted light having different diffraction orders.]

[3. A compound objective lens according to claim 2 in which the first beam of divided light is a beam of transmitted light which agrees with a beam of zero-order diffracted light generated by the hologram, and the second beam of divided light is a beam of first-order diffracted light generated by the hologram.]

[4. A compound objective lens according to claim 2 in which the hologram is a phase modulation relief type of diffraction device, a grating pattern of the hologram has a step-wise cross section and is formed in a concentric circle shape, the grating pattern of the hologram is concentrically partitioned into a plurality of blocks, a phase modulation degree of the incident light passing through the grating pattern of the hologram varies in a step-wise shape of four stairs for each of the blocks, and a ratio of an etching width of a top stair to a length of the corresponding block and another ratio of an etching width of a bottom stair to the length of the corresponding block are respectively lowered toward an outer direction of the grating pattern of the hologram.]

[5. A compound objective lens according to claim 2 in which the hologram is a phase modulation relief type of diffraction device, a grating pattern of the hologram is formed in a concentric circle shape and is concentrically partitioned into a plurality of blocks, a phase modulation degree of the incident light passing through an inner portion of the grating pattern of the hologram varies in a step-wise shape of four inside stairs for each of the blocks, the four inside stairs are composed of a top stair, a second stair, a third stair and a bottom stair in that order, a ratio of an etching width of the top stair to a length of the corresponding block and another ratio of an etching width of the bottom stair to the length of the corresponding block are respectively lowered toward an outer direction of the grating pattern in the inner portion of the hologram, another phase modulation degree of the incident light passing through an outer portion of the grating pattern of the hologram varies in a step-wise shape of two outside stairs for each of the blocks, and a difference in width between the outside stairs is increased toward the outer direction of the grating pattern in the outer portion of the hologram.]

[6. A compound objective lens according to claim 2 in which the hologram is a phase modulation relief type of diffraction device, a grating pattern of the hologram has a step-wise cross section and is formed in a concentric circle shape, the grating pattern of the hologram is concentrically partitioned into a plurality of blocks, a phase modulation degree of the incident light passing through the grating pattern of the hologram varies in a step-wise shape of four stairs for each of the blocks, and a ratio of an etching width of a top stair to a length of the corresponding block and another ratio of an etching width of a bottom stair to the length of the corresponding block are respectively lowered toward an inner direction of the grating pattern of the hologram.]

[7. A compound objective lens according to claim 2 in which the hologram is a phase modulation relief type of diffraction device, a grating pattern of the hologram is formed in a concentric circle shape and is concentrically partitioned into a plurality of blocks, a phase modulation degree of the incident light passing through an outer portion of the grating pattern of the hologram varies in a step-wise shape of four inside stairs for each of the blocks, the four inside stairs are composed of a top stair, a second stair, a third stair and a bottom stair in that order, a ratio of an etching width of the top stair to a length of the corresponding block and another ratio of an etching width of the bottom stair to the length of the corresponding block are respectively lowered toward an inner direction of the grating pattern in the outer portion of the hologram, another phase modulation degree of the incident light passing through an inner portion of the grating pattern of the hologram varies in a step-wise shape of two inside stairs for each of the blocks, and a difference in width between the inside stairs is increased toward the inner direction of the grating pattern in the inner portion of the hologram.]

[8. A compound objective lens according to claim 2 in which the hologram is a phase modulation type of diffraction device and is made of a liquid crystal cell.]

[9. A compound objective lens according to claim 2 in which the hologram is a phase modulation type of diffraction device and is placed on a substrate of a birefringence material.]

[10. A compound objective lens according to claim 2 in which a positional relationship between the lens means and the hologram is fixed.]

[11. A compound objective lens according to claim 10 in which the hologram is formed on a lens surface of the lens means.]

[12. A compound objective lens according to claim 11 in which the hologram is placed on a lens surface of the lens means of which a curvature is higher than those of other lens surfaces of the lens means.]

[13. A compound objective lens according to claim 11 in which the hologram is placed on a lens surface of the lens means of which a curvature is lower than those of other lens surfaces of the lens means.]

[14. A compound objective lens according to claim 1 in which a numerical aperture of the lens means for the incident light converged at one focal point of the focal points differs from that for the incident light converged at another focal point of the focal points.]

[15. A compound objective lens according to claim 2 in which a grating pattern is formed in a first portion of a light-passing area of the hologram corresponding to an aperture of the lens means, and any grating pattern is not formed in a second portion of the light-passing area of the hologram.]

[16. A compound objective lens according to claim 15 in which a phase of the incident light passing through the second portion of the light-passing area of the hologram almost agrees with an average value of phases of the incident light passing through the first portion of the light-passing area of the hologram.]

[17. A compound objective lens according to claim 15 in which the grating pattern is formed in a step-wise shape having a plurality of stairs, a surface height of the second portion of the light-passing area of the hologram in an optical direction is the same as a height of a stair selected from the stairs except a top stair and a bottom stair.]

[18. A compound objective lens according to claim 1 in which a numerical aperture of the lens means is equal to or higher than 0.6.]

*19. An objective lens operable to lead a light beam to at least two kinds of information media having a substrate of different thicknesses T1 and T2, comprising:*

*a refractive lens which has a first convex surface, and a diffractive element which has a second convex surface located opposite to the first convex surface of the refractive lens;*

*wherein the objective lens has a numerical aperture of NA1 corresponding to a substrate thickness T1,*

*the diffractive element receives an approximately parallel beam not yet refracted by the refractive lens and diffracts the beam to divide the beam into divided beams in order to converge one of the divided beams corresponding to a substrate thickness of T2 with a numerical aperture of NA2 (NA1>NA2, T1<T2); and*

*wherein focal points are placed on an optical axis on a side facing the first convex surface of the refractive lens.*

*20. An objective lens according to claim 19, wherein the diffractive element is associated with the first convex surface and the second convex surface.*

*21. An objective lens according to claim 19, wherein the diffractive element is an optical relief.*

*22. An optical head apparatus operable to perform at least one of recording and reproduction of pieces of information on and from an optical disk placed to face the optical head apparatus, the optical disk composing the information media, comprising:*

*(i) an optical source operable to radiate a light beam; and*

*(ii) the objective lens according to claim 19.*

*23. An optical disk apparatus comprising:*

*an optical head apparatus according to claim 22;*

*a rotating device operable to rotate the at least two kinds of information media; and*

*a moving device operable to move the optical head apparatus.*

*24. An objective lens operable to lead a light beam to at least two kinds of information media having a substrate of different thicknesses T1 and T2,*

*wherein the objective lens has a first region and a second region,*

*the first region is located at a position farther from an optical axis than a position of the second region;*

*the second region is provided with a diffractive element;*

*the second region has a numerical aperture NA2 to produce a focal point through the substrate of thickness T2;*

*the first and the second regions of the objective lens have a numerical aperture NA1 to produce a focal point through the substrate of thickness T1; and*

*wherein NA1>NA2 and T1<T2.*

*25. A focus control method to perform focus control on at least two kinds of information media having a substrate of different thicknesses T1 and T2 using an optical lens according to claim 24, the focus control method comprising:*

*a step to detect a signal from the information media;*

*a step to decide the thickness of the substrate based on the signal; and*

*a step to perform the focus control corresponding to the decided thickness.*

*26. An optical disk apparatus to perform focus control on at least two kinds of information media having a substrate of different thicknesses T1 and T2 using an optical lens according to claim 24, comprising:*

*an information detector to detect a signal from the information medium; and*

*a controller to decide the thickness of the substrate based on the signal and to perform the focus control corresponding to the thickness T1 or T2 based on the decided thickness.*

*27. An objective lens according to claim 24, wherein the NA1 is larger than 0.6.*

*28. An objective lens according to claim 24, wherein the T1 is smaller than 0.8.*

*29. An objective lens according to claim 24, wherein the first region or the second region has at least one region having no optical relief.*

*30. An optical head apparatus operable to perform at least one of recording and reproduction of pieces of information on and from an optical disk placed to face the optical head apparatus, the optical disk composing the information media, comprising:*

*(i) an optical source operable to radiate a light beam; and*

*(ii) the objective lens according to claim 24.*

*31. An optical head apparatus according to claim 30, further comprising an optical detector to receive light from the information media having the substrate of different thicknesses T1 and T2.*

*32. An optical disk apparatus comprising:*

*an optical head apparatus according to claim 31;*

*a rotating device operable to rotate the at least two kinds of information media; and*

*a moving device operable to move the optical head apparatus.*

*33. An optical disk apparatus comprising:*

*an optical head apparatus according to claim 30;*

*a rotating device operable to rotate the at least two kinds of information media; and*

*a moving device operable to move the optical head apparatus.*

*34. An image reproducing apparatus comprising:*

*an optical disk apparatus according to claim 33; and*

*a displaying unit.*

*35. A voice reproducing apparatus comprising:*

*an optical disk apparatus according to claim 33; and*

*a voice reproducing unit.*

*36. An information processing apparatus comprising:*

*an optical disk apparatus according to claim 33;*

*an input apparatus; and*

*a central processing unit.*

* * * * *